United States Patent [19]

Hull et al.

[11] Patent Number: 5,273,691

[45] Date of Patent: * Dec. 28, 1993

[54] STEREOLITHOGRAPHIC CURL REDUCTION

[75] Inventors: Charles W. Hull, Santa Clarita; Stuart T. Spence, So. Pasadena; Charles W. Lewis, Van Nuys; Wayne Vinson, Valenica; Raymond S. Freed, Northridge; Dennis R. Smalley, Baldwin Park, all of Calif.

[73] Assignee: 3D Systems, Inc., Valencia, Calif.

[*] Notice: The portion of the term of this patent subsequent to Apr. 14, 2009 has been disclaimed.

[21] Appl. No.: 868,462

[22] Filed: Apr. 14, 1992

Related U.S. Application Data

[63] Continuation of Ser. No. 339,246, Apr. 17, 1989, Pat. No. 5,104,592, which is a continuation-in-part of Ser. No. 182,823, Apr. 18, 1988, abandoned.

[51] Int. Cl.$^5$ .................. B29C 35/08; B29C 41/02
[52] U.S. Cl. ................. 264/22; 118/423; 118/429; 118/620; 118/712; 156/64; 156/273.5; 156/275.5; 156/378; 156/379.6; 250/432 R; 250/492.1; 264/40.1; 264/255; 264/308; 365/106; 365/107; 425/135; 425/174.4; 427/8; 427/430.1; 427/508; 427/553
[58] Field of Search .............. 264/22, 40.1, 308, 255; 425/135, 174.4; 156/64, 273.5, 275.5, 307.1, 378, 379.6; 427/8, 53.1, 54.1, 430.1, 508, 553; 118/423, 428, 429, 620, 712; 250/432; 365/106, 107, 119, 120, 126, 127

[56] References Cited

U.S. PATENT DOCUMENTS

| | | |
|---|---|---|
| 2,775,758 | 12/1956 | Munz . |
| 4,139,654 | 2/1979 | Reed . |
| 4,575,330 | 3/1986 | Hull ............................. 425/174.4 |
| 4,752,498 | 6/1988 | Fudim . |
| 4,801,477 | 1/1989 | Fudim . |
| 4,945,032 | 7/1990 | Murphy et al. . |
| 4,961,154 | 10/1990 | Pomerantz et al. . |
| 5,015,424 | 5/1991 | Smalley . |
| 5,031,120 | 7/1991 | Pomerantz et al. . |
| 5,059,359 | 10/1991 | Hull et al. . |
| 5,137,662 | 8/1992 | Hull et al. . |

FOREIGN PATENT DOCUMENTS

| | | |
|---|---|---|
| 250121 | 12/1987 | European Pat. Off. . |
| 61-116320 | 6/1986 | Japan . |
| 61-116321 | 6/1986 | Japan . |
| 63-145015 | 6/1988 | Japan . |

OTHER PUBLICATIONS

Herbert, A. J., "Solid Object Generation", Journal of Applied Photographic Engineering, vol. 8, No. 4 (Aug. 1982), pp. 185-188.

Kodama, H., Rev. Sci. Instrum. 52(11), Nov. 1981, "Automatic Method for Fabricating A Three Dimentional Plastic Model With Photo-Hardening Polymer", pp. 1770-1773.

Fudim, E. V., "A New Method of Three-Dimensional Engineering", Mechanical Engineering, pp. 54-59, Sep. 1985.

Fudim, E. V., "Sculpting Parts With Light", Machine Design, pp. 102-106, Mar. 1986.

Primary Examiner—Leo B. Tentoni
Attorney, Agent, or Firm—Lyon & Lyon

[57] ABSTRACT

An improved stereolithography system for generating a three-dimensional object by creating a cross-sectional pattern of the object to formed at a selected surface of a fluid medium capable of altering its physical state in response to appropriate synergistic stimulation by impinging radiation, particle bombardment or chemical reaction, information defining the object being structurally specified to reduce curl, stress and distortion in the ultimately formed object, the successive adjacent laminae, representing corresponding successive adjacent cross-sections of the object, being automatically formed and integrated together to provide a step-wise laminar buildup of the desired object, whereby a three-dimensional object is formed and drawn from a substantially planar surface of the fluid medium during the forming process. A stereolithographic distortion known as curl is defined, and several techniques to eliminate or reduce curl are described, including dashed line, bent line, secondary structure, rivets, and multi-pass techniques. In addition, a quantitative measurement of curl known as the curl factor, and a test part known as a quarter cylinder are described, which together can be used to measure the effectiveness of the above techniques in reducing curl.

21 Claims, 35 Drawing Sheets

FIG. 3 DASHED LINE RAIL

SHORT SEGMENT RAIL

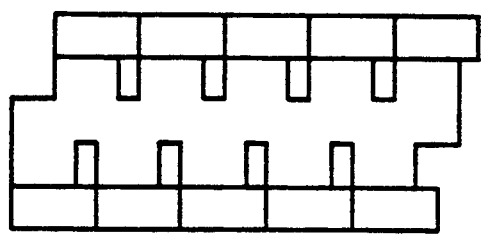
FIG_5A.
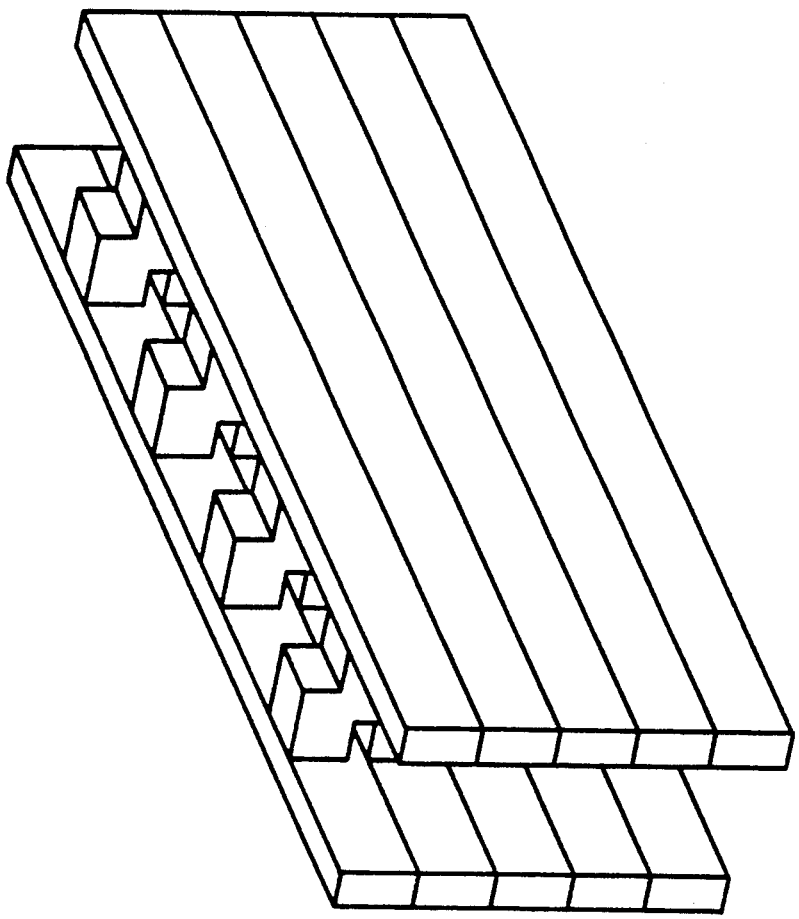
FIG_5B.
RAIL WITH NO ADHESION EXCEPT FOR THE ATTACHING STRUCTURE

RAIL HELD TOGETHER WITH RIVETS

FIG. 1 QUARTER CYLINDER

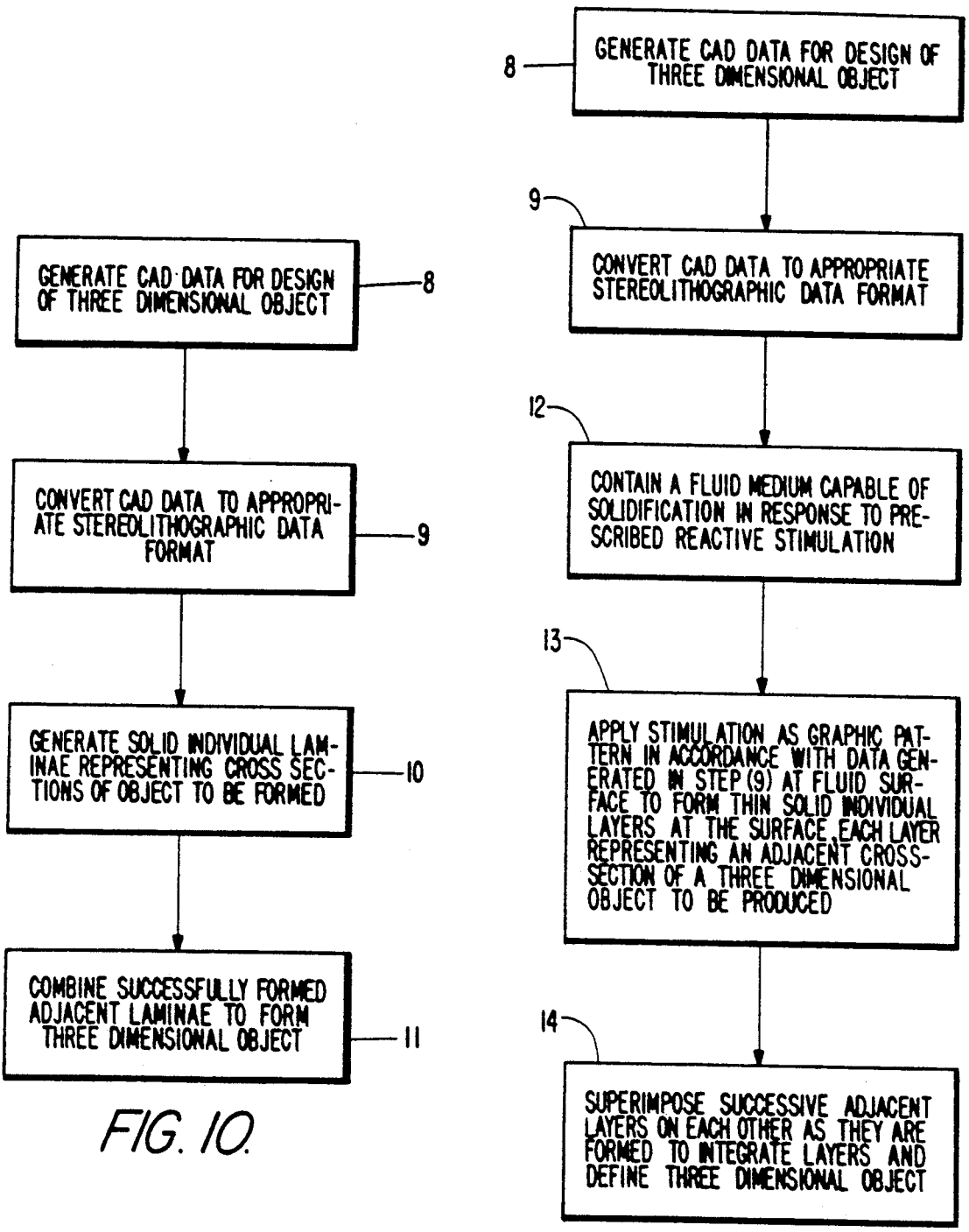

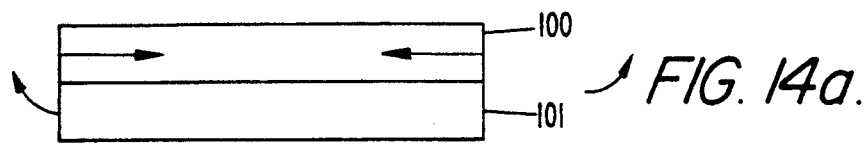
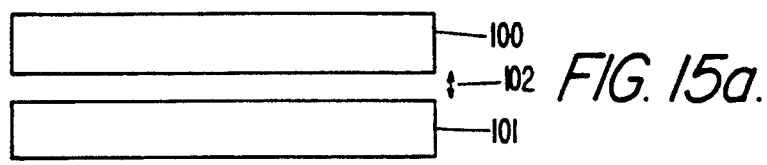
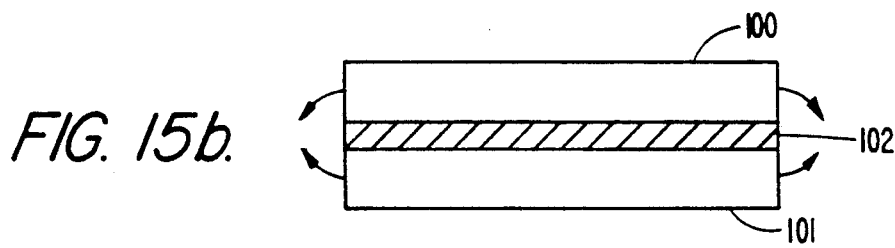
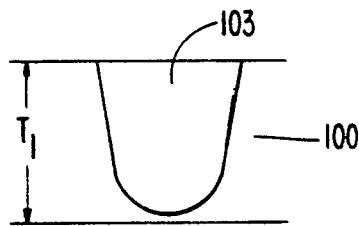
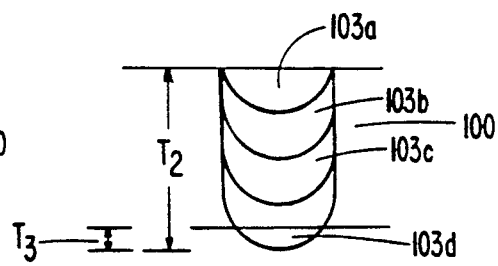
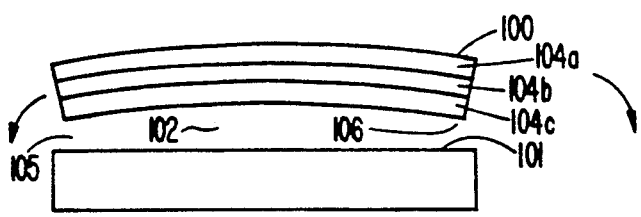
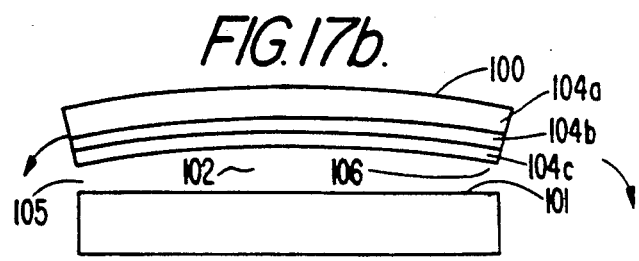

```
SAMPLE.L

!MERGE: -FILES BS4.SLI
!MERGE: -STARTLAYER 920    -ENDLAYER 1020
-NUMLAYERS 6
!MERGE: -MIN X    250  -MAX X   8750
!MERGE: -MIN Y    250  -MAX Y   8750
!3DSYS SLA-1 SLICE FILE
!SLICE=  -VER 3.11 -RES 1000.000000 -HX 400 -HY 460
-HFX 0 -HFY 0 -HA 0 -MSA 0 -MIA 0 -ZS 20 -Y -B
* 1000.000,20.000,0.508
920,#TOP
920,L1
920,LB1,"RC 1;RD 0;RS 500;SP 20;SS 8"
920,LH1,"RC 1;RD 0;RS 500;SP 20;SS 8"
920,#BTM
940,#TOP
940,L1
940,LB1,"RC 2;RD 0;RS 500;SP 20,40;SS 8"
940,LH1,"RC 2;RD 0;RS 500;SP 20,40;SS 8"
940,#BTM
960,#TOP
960,L1
960,LB1,"RC 2;RD 0;RS 500;SP 20,40,60;SS 8"
960,LH1,"RC 2;RD 0;RS 500;SP 20,40,60;SS 8"
960,#BTM
980,#TOP
980,L1
980,LB1,"RC 2;RD 0;RS 10000;SP 20,40;SS 8"
980,LH1,"RC 2;RD 0;RS 10000;SP 20,40;SS 8"
980,#BTM
1000,#TOP
1000,L1
1000,LB1
1000,LH1
1000,#BTM
1020,#TOP
1020,L1
1020,LB1,"RC 3;RD 0;RS 10000;SP 20,40,60"
1020,LH1,"RC 3;RD 0;RS 10000;SP 20,40,60"
1020,#BTM
```

*FIG. 18.*

SAMPLE.R

!MERGE: -FILES BS4.SLI
!MERGE: -STARTLAYER 920    -ENDLAYER 1020
-NUMLAYERS 6
!MERGE: -MIN X    250   -MAX X   8750
!MERGE: -MIN Y    250   -MAX Y   8750
!3DSYS SLA-1 SLICE FILE
!SLICE= -VER 3.11 -RES 1000.000000 -HX 400 -HY
400 -HFX 0 -HFY 0 -HA 0 -MSA 0 MIA 0 -ZS 20 -Y -B
* 1000.000,20.000,0.508
920,920,20,20
TOP
L1
LB1,"RC 1;RD 0;RS 500;SP 20;SS 8"
LH1,"RC 1;RD 0;RS 500;SP 20;SS 8"
BTM
940,940,20,20
TOP
L1
LB1,"RC 2;RD 0;RS 500;SP 20,40;SS 8"
LH1,"RC 2;RD 0;RS 500;SP 20,40;SS 8"
BTM
960,960,20,20
TOP
L1
LB1,"RC 2;RD 0;RS 500;SP 20,40,60;SS 8"
LH1,"RC 2;RD 0;RS 500;SP 20,40,60;SS 8"
BTM
980,980,20,20
TOP
L1
LB1,"RC 2;RD 0;RS 10000;SP 20,40;SS 8"
LH1,"RC 2;RD 0;RS 10000;SP 20,40;SS 8"
BTM
1000,1000,20,20
TOP
L1
LB1
LH1
BTM
1020,1020,20,20
TOP
L1
LB1,"RC 3;RD 0;RS 500;SP 20,40,60;SS 8"
LH1,"RC 3;RD 0;RS 500;SP 20,40,60;SS 8"
BTM

```
SAMPLE.PRM (SUPER.PRM)

!
! SUPERVISOR PARAMETER FILE
! VERSION 2.60
!
!
!
!
! DEFAULT SUPER OPTIONS
!
! PLACE OPTIONS TOGETHER INSIDE OF
! QUOTES; USE "" IF NO OPTIONS
! /NEGZ REQUIRED FOR SOME PROTOTYPE UNITS
!
"/NEGZ"

!
! GENERAL PARAMETERS
!
800     ELEVATOR BOARD BASE ADDRESS
100     ELEVATOR PITCH PARM, 100 FOR
        ALPHAS, 50 FOR BETAS
3.556   XY-ONLY SCALE FACTOR; DOES NOT
        AFFECT Z-AXIS
15940   X-COORDINATE OFFSET
16813   Y-COORDINATE OFFSET
10000   MAX NUMBER OF VECTORS TO SEND TO
        STEREO

!
! - BLOCK DEFAULTS -
!
! EACH TIME THE SUPERVISOR STARTS A
! BLOCK, THE RESPECTIVE DEFAULT STRING
! BELOW IS SENT TO THE STEREO DRIVER.
! LB, NFDB,... ARE THE BLOCK TYPES
! (LAYER BORDER, NEAR-FLAT DOWN BORDER,
! ETC.) AND THEY ARE FOLLOWED BY THE
! MERGE INPUT FILE NUMBER (E.G. 1 MAY BE
! FOR POST VECTORS AND 2 FOR OBJECT
! VECTORS). ALTHOUGH ONLY DEFAULTS FOR 2
! FILES ARE SET FOR HERE, UP TO 10 FILES
! ARE SUPPORTED.
!
#TOP,"BX 4000;BY 31000"
! LASER BEAM BEGIN (HOME) POSITION
!
! FILE #1
```

```
!
LB1,"RD 1;RS 300;RC 1;SP 20;JD 0;SS 8"
NFDB1,"RD 1;RS 300;RC 1;SP 176;JD 0;SS 2"
NFUB1,"RC 1;SP 100;SS 2;JD 0"
LH1,"RC 1;SP 176;JD 0; SS 2"
NFDH1,"RC 1;SP 176;JD 0; SS 2"
FDF1,"RC 1;SP 25;JD 0;SS 16"
NFDF1,"RC 1;SP 25;JD 0;SS 16"
NFUF1,"RC 1;SP 25;JD 0;SS 16"
FUF1,"RC 1;SP 25;JD 0;SS 16"
!
! FILE #2
!
LB2,"RD 1;RS 300;RC 1;SP 352;JD 0;SS 2"
NFDB2,"RD 1;RS 300;RC 1;SP 352;JD 0;SS 2"
NFUB2,"RD 1;RS 300;RC 1;SP 100;JD 0;SS 2"
LH2,"RC 1;SP 352;JD 0;SS 2"
NFDH2,"RC 1;SP 352;JD 0; SS 2"
FDF2,"RC 1;SP 100;JD 0;SS 16"
NFDF2,"RC 1;SP 100;JD 0;SS 16"
NFUF2,"RC 1;SP 100;JD 0;SS 16"
FUF2,"RC 1;SP 100;JD 0;SS 16"
!
#BTM,"ZW 60;ZD 8;ZV 0.5;ZA 0.5"
```

*FIG. 20b.*

SIDE VIEW

TOP VIEW

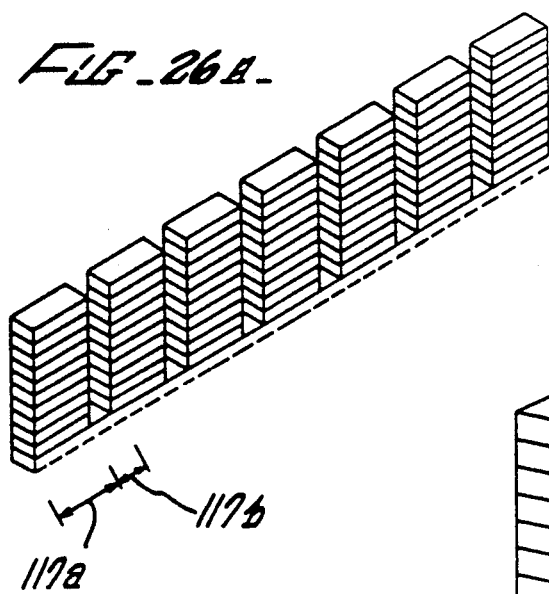
FIG_26A_
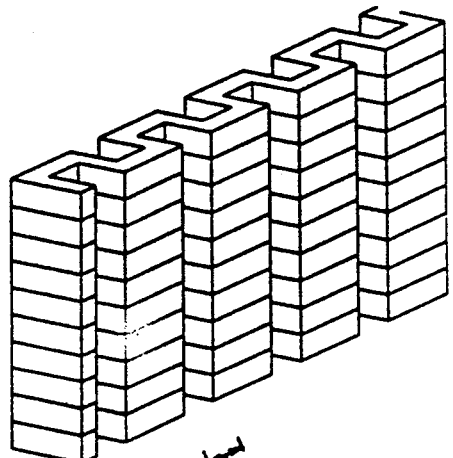
FIG_26B_
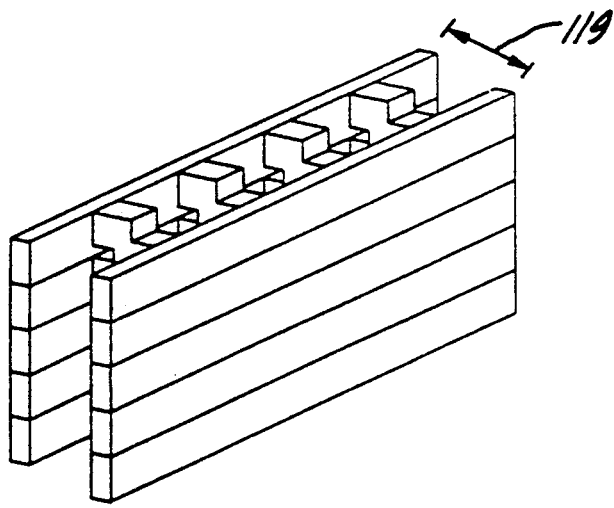
FIG_26C_
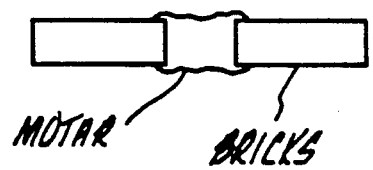
FIG 27A
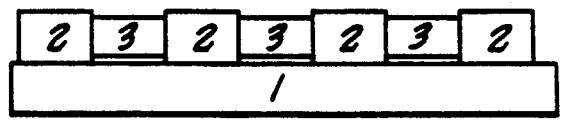
FIG_27B_

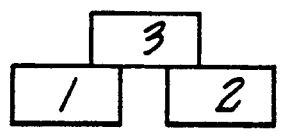
FIG_27C_
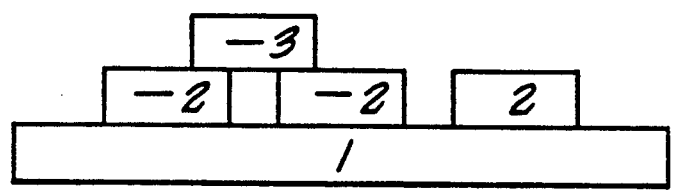
FIG_27D_
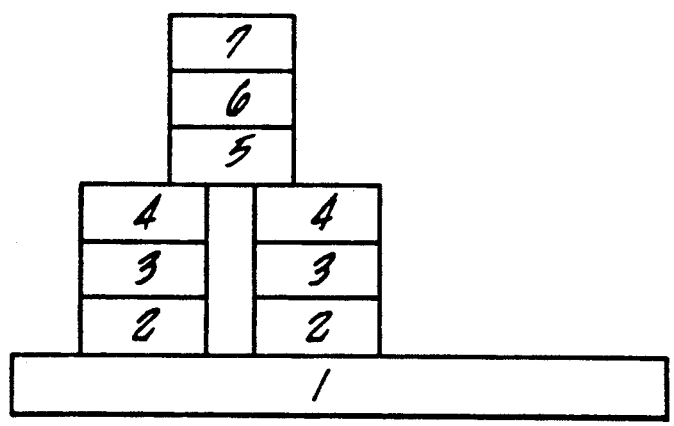
FIG_27E_

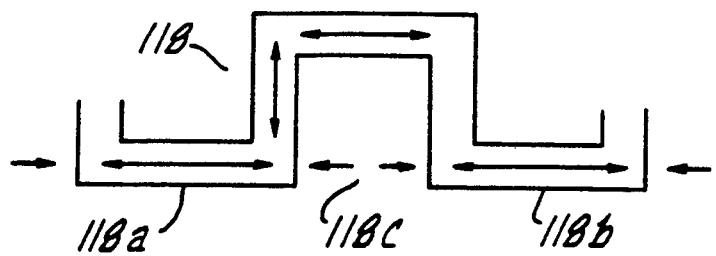
FIG_28a_
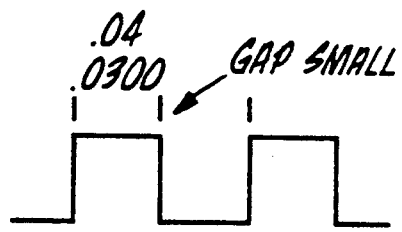
FIG_28b_
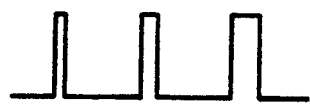
FIG_28c_
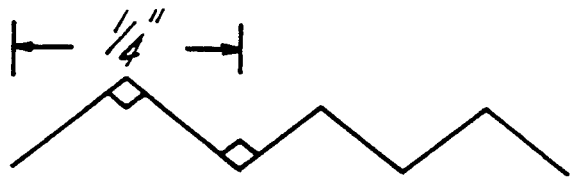
FIG_28D_  AS ANGLES GET SMALLER LENGTH CAN DECREASE
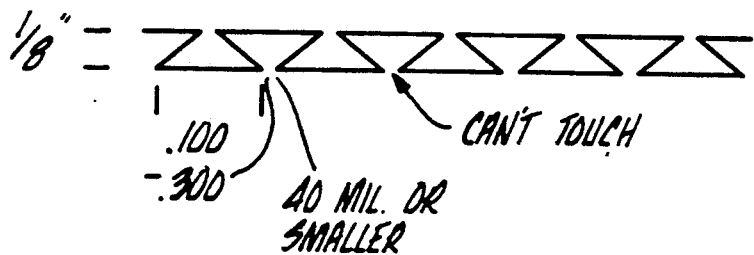
FIG_28E_
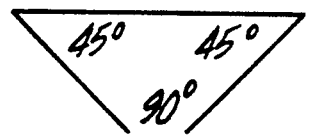
FIG_28F_

FIG. 30.

RIVIT.BOX

RIVIT.L

\* 1000,20,O

920,#TOP
920,Z1,"SS 8;SP 100;JD 0;RC 1"
NO RIVETS ON THIS LAYER
920,X1,"SS 8;SP 100;JD 0;RC 1"
920,#BTM
940,#TOP
940,#CAXV,250,250,3750,250,3750,8750,250,8750
BOX (HATCH WITHIN THIS B WILL BE RIVETED)
940,Z1,"SS 8;SP 100;JD 0;RC 1"
940,X1,"SS 8;SP 100;JD 0;RC 1;VC 2;VR 500;VP 20,100"
2 PASS RIVETS ON THIS LAYER
940,#BTM

FIG. 32a.

```
! SUPER.PRM  (NO SINGLE LETTER HEADER
! INFORMATION BUT THE OTHER MNEMONIC
HEADERS
! CAN EASILY BE EDITED TO SINGLE LETTER
HEADERS)
!
! SUPERVISOR PARAMETER FILE
! VERSION 2.60
!
! LAST ALTERED: 1/25/88
!       REASON: NEW SOFTWARE RELEASE
!
! DEFAULT SUPER OPTIONS
!
! PLACE OPTIONS TOGETHER INSIDE OF QUOTES:
USE ""
! IF NO OPTIONS
!
! "/NODRIFT/ZOFF/TEXT/SHOW"
!
! GENERAL PARAMETERS
!
800              ELEVATOR BOARD BASE ADDRESS
100              ELEVATOR PITCH PARM
2.000            XY-ONLY SCALE FACTOR; USE 3.556
                 FOR INCHES AND SLIZE RES=1000
24000            !X-COORDINATE OFFSETS
24000            !Y-COORDINATE OFFSETS
10000            MAX NUMBER OF BYTES PER
                 BLOCK IN LASER QUEUE
20000,20000      MINIMUM X AND Y OF VAT AREA
                 (FOR GRAPHICS VIEWPORT)
45000,45000      MAXIMUM X AND Y OF VAT AREA
#TOP," JP 15;JS 48;BX 5367;BY 64000"
                 !LASER BEAM BEGIN (HOME)
                 POSITION
! - BLOCK DEFAULTS -
! ALTHOUGH ONLY DEFAULTS FOR 1 FILE.
  FILES ARE SET FOR HERE, UP TO 10 FILES
  ARE SUPPORTED.
! FILE #1
LB1, "RD 1;RS 300;RC 2;    ! REDRAW
                             DELAY, SIZE,
                             COUNT
             SP 25,100;    ! STEP PERIOD
             JD 0;         ! JUMP DELAY
             SS 2"         ! STEP SIZE
NFDB1,"RD 1;RS 300;RC 1;SP 176;JD 0;SS 1"
NFDB1,"RC 1;SP 100;SS 2;JD 0"
```

```
LH1,"RC 2;SP 20,80;JD O;SS 8;
        VC 5;              ! RIVET COUNT
        VR 99;             ! RIVET REDUC-
                             TION AMOUNT
        VP 11,12,13,14,15" ! RIVET STEP
                             PERIODS
NFDH1,"RC 1;SP 176;JD 0; SS 2;VC 5;VR 99; VP
11,12,13,14,15"
FDF1,"RC 1;SP 25;JD 0;SS 16"
NFDF1,"RC 1;SP 25;JD 0;SS 16"
NFUF1,"RC 1;SP 25;JD 0;SS 16"
FUF1,"RC 1;SP 25;JD 0;SS 16"
!
!
#BTM,"ZW 50;      ! Z-AXIS WAIT TIME IN
                    SECONDS
       ZD 8;      ! Z-AXIS DIP IN MM
       ZV 0.2;    ! Z-AXIS VELOCITY PARAMETER
       ZA 0.2"    ! Z-AXIS ACCELERATION PARA-
                    METER
```

RIVIT.V

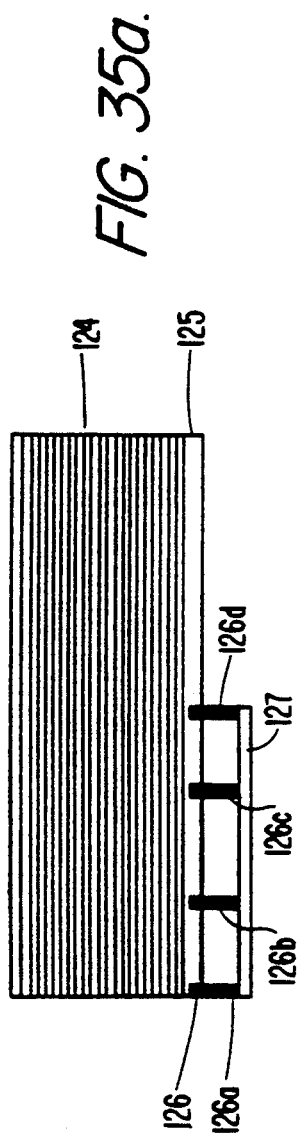
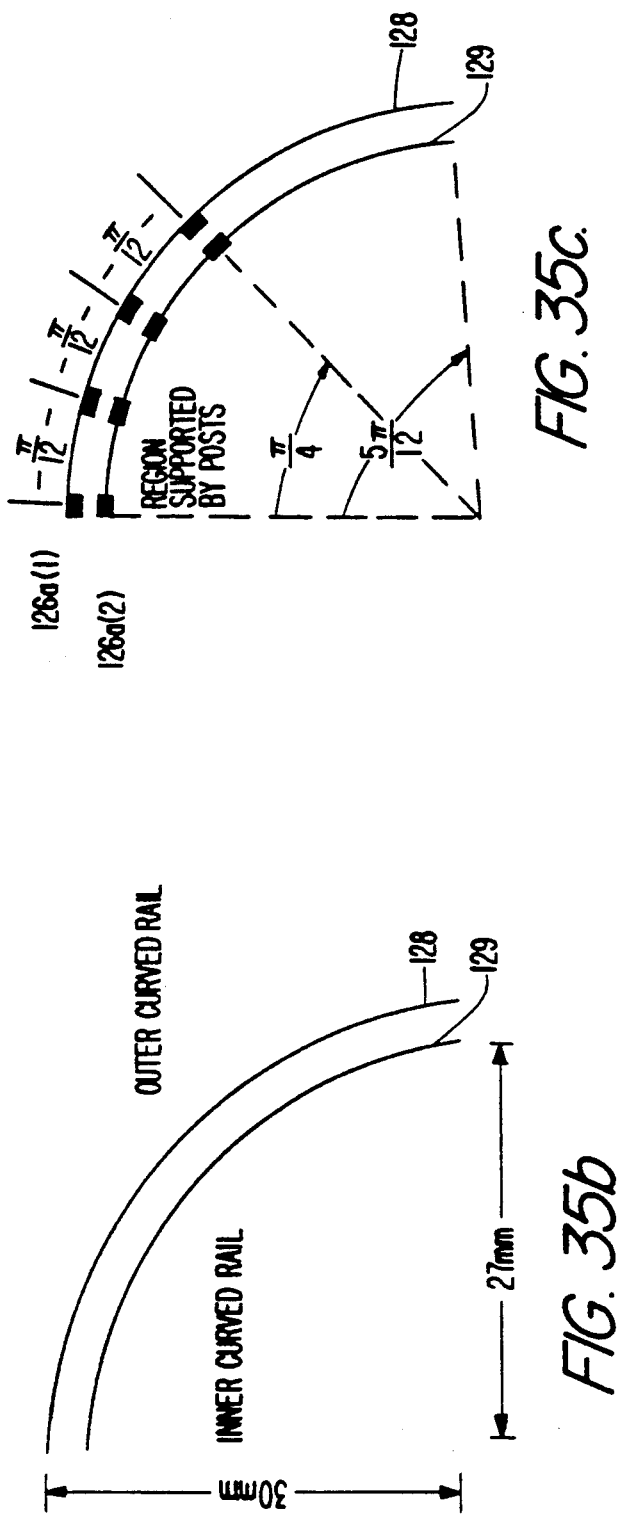
FIG. 35a.
FIG. 35b.
FIG. 35c.

CURL FACTOR = f/S = CF

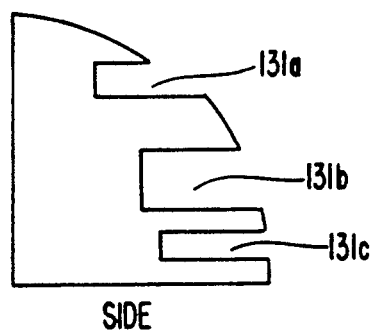
FIG. 36a.
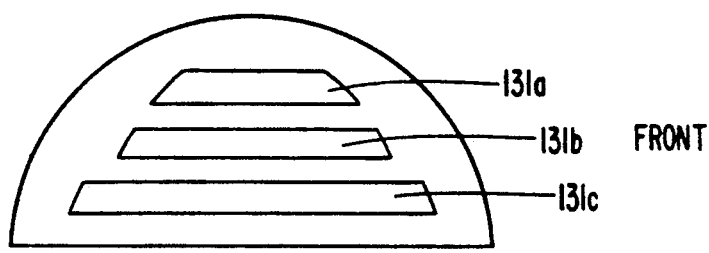
FIG. 36b.
FIG. 36c.
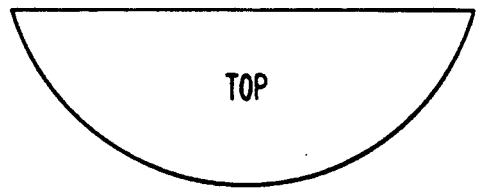
FIG. 36d.
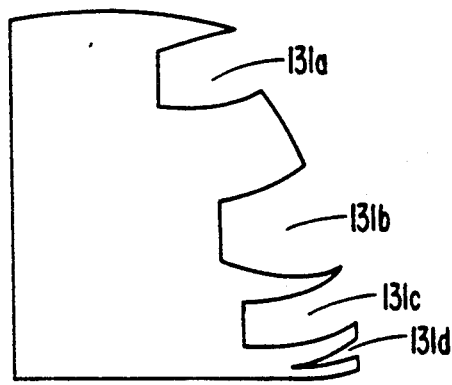

STEREOLITHOGRAPHIC CURL REDUCTION

This application is a continuation of U.S. patent application Ser. No. 339,246, filed Apr. 17, 1989, now U.S. Pat. No. 5,104,592; which in turn is a continuation-in-part application of U.S. patent application Ser. No. 182,823, filed Apr. 18, 1988, now abandoned, which is fully incorporated herein by reference as though set forth in full.

BACKGROUND OF THE INVENTION

1. Cross Reference to Related Applications

Related applications filed on that date are U.S. patent application Ser. Nos. 182,830, now U.S. Pat. No. 5,059,359; 183,015, now U.S. Pat. No. 5,015,524; 182,801, now U.S. Pat. No. 4,999,143; 183,016, now U.S. Pat. No. 4,996,010; 183,014, now abandoned; and 183,012, now abandoned; all of which are hereby fully incorporated by reference herein as though set forth in full. Continuations-in-part of U.S. patent application Ser. Nos. 182,830; 183,016; 183,014; and 183,012 were filed on Nov. 8, 1988, all of which are hereby fully incorporated by reference herein as though set forth in full. The Serial Nos. for the above-mentioned continuations-in-part are, respectively, 269,801, now abandoned; 268,816, now U.S. Pat. No. 5,058,988; 268,377, now U.S. Pat. No. 5,123,734; 268,907, now U.S. Pat. No. 5,059,021 (all for Ser. No. 182,830); 268,429, now U.S. Pat. No. 5,076,974 (for Ser. No. 183,016); 268,408, now abandoned (for Ser. No. 183,014); and 268,428, now abandoned (for Ser. No. 183,012). A continuation application of U.S. patent application Ser. No. 269,801 was filed on Mar. 31, 1989, which is hereby fully incorporated by reference herein as though set forth in full. The Serial No. for the above-mentioned continuation application is Ser. No. 331,644, now U.S. Pat. No. 5,184,307.

2. Cross Reference to Attached Appendices

The following appendices are affixed to this application, and are hereby fully incorporated by reference herein as though set forth in full:

Appendix A: 3D Systems, Inc., SLA-1 Beta Site Stereolithography System Users Manual and Service Manual, November, 1987

Appendix B: 3D Systems, Inc., Beta Release, SLA-1 Software Manual, First Draft, October, 1987

Appendix C: Software Listing, Version 2.62

Appendix D: 3D Systems, Inc., SLA-1 Training Manual, Revision 3.0, April 1988

Appensix E: Non-3D Systems Software Vendors as of Apr. 13, 1988

Appendix F: Software Listing, Version 3.03

Appendix G: "Slice" Flow Chart Implementing Style 1

Appendix H: "Slice" Flow Chart Implementing Style 2

Appendix I: Technical Papers, 3D Systems, Inc., CAD/CAM Stereolithography Interface Specification, Dec. 1, 1987

Appendix J: Program Listing—Quarter Cylinder

Appendix K: Software Listing, Version 3.20

3. Field of the Invention

This invention relates generally to improvements in methods and apparatus for forming three-dimensional objects from a fluid medium and, more particularly, to a new and improved stereolithography system involving the application of enhanced data manipulation and lithographic techniques to production of three-dimensional objects, whereby such objects can be formed more rapidly, reliably, accurately and economically, and with reduced stress and curl.

It is common practice in the production of plastic parts and the like to first design such a part and then painstakingly produce a prototype of the part, all involving considerable time, effort and expense. The design is then reviewed and, oftentimes, the laborious process is again and again repeated until the design has been optimized. After design optimatization, the next step is production. Most production plastic parts are injection molded. Since the design time and tooling costs are very high, plastic parts are usually only practical in high volume production. While other processes are available for the production of plastic parts, including direct machine work, vacuum-forming and direct forming, such methods are typically only cost effective for short run production, and the parts produced are usually inferior in quality to molded parts.

Very sophisticated techniques have been developed in the past for generating three-dimensional objects within a fluid medium which is selectively cured by beams of radiation brought to selective focus at prescribed intersection points within the three-dimensional volume of the fluid medium. Typical of such three-dimensional systems are those described in U.S. Pat. Nos. 4,041,476; 4,078,229; 4,238,840 and 4,288,861. All of these systems rely upon the buildup of synergistic energization at selected points deep within the fluid volume, to the exclusion of all other points in the fluid volume. Unfortunately, however, such three-dimensional forming systems face a number of problems with regard to resolution and exposure control. The loss of radiation intensity and image forming resolution of the focused spots as the intersections move deeper into the fluid medium create rather obvious complex control situations. Absorption, diffusion, dispersion and diffraction all contribute to the difficulties of working deep within the fluid medium on an economical and reliable basis.

In recent years, "stereolithography" systems, such as those described in U.S. Pat. No. 4,575,330 entitled "Apparatus For Production Of Three-Dimensional Objects By Stereolithography", which is hereby fully incorporated by reference herein as though set forth in full, have come into use. Basically, stereolithography is a method for automatically building complex plastic parts by successively printing cross-sections of photopolymer (such as liquid plastic) on top of each other until all of the thin layers are joined together to form a whole part. With this technology, the parts are literally grown in a vat of liquid plastic. This method of fabrication is extremely powerful for quickly reducing design ideas to physical form and for making prototypes.

Photocurable polymers change from liquid to solid in the presence of light and their photospeed with ultraviolet light (UV) is fast enough to make them practical model building materials. The material that is not polymerized when a part is made is still usable and remains in the vat as successive parts are made. An ultraviolet laser generates a small intense spot of UV. This spot is moved across the liquid surface with a galvanometer mirror X-Y scanner. The scanner is driven by computer generated vectors or the like. Precise complex patterns can be rapidly produced with this technique.

The laser scanner, the photopolymer vat and the elevator along with a controlling computer combine together to form a stereolithography apparatus, referred to as "SLA". An SLA is programmed to automatically make a plastic part by drawing a cross section at a time, and building the part up layer by layer.

Stereolithography represents an unprecedented way to quickly make complex or simple parts without tooling. Since this technology depends on using a computer to generate its cross sectional patterns, there is a natural data link to CAD/CAM. However, such systems have encountered difficulties relating to shrinkage, stress, curl and other distortions, as well as resolution, accuracy and difficulties in producing certain object shapes.

Objects made using stereolithography tend to distort when the materials used change density between the liquid state and the solid state. Density change causes material shrinkage or expansion, and this generates stress as a part is formed in a way to "curl" lower layers or adjacent structure, giving an overall distortion. Materials with less density change exhibit less curl, but many materials that are otherwise useful for stereolithography have high shrinkage. The "curl" effect limits the accuracy of the object formation by stereolithography. This invention provides ways to eliminate or reduce the "curl" effect.

Material shrinkage is a common problem with polymer materials, and with fabrication methods (such as plastic molding) that use these materials. However, stereolithography is a new technology, and the problems associated with distortion due to shrinkage have not been widely addressed. The other main approaches to reducing object distortion taken by the inventors have been to use photopolymer materials that have less shrinkage and produce less stress, or materials that are less rigid and are less capable of propagating strain.

These other methods are somewhat effective, but have disadvantages. The earliest way to achieve low shrinkage in a photopolymer was to use oligomeric materials with high initial equivalent weights. These materials shrink less because there is less new bond formation per unit volume in the photo-initiated polymer reaction. However, these high equivalent weight materials generally have higher molecular weights and much higher viscosity at a given temperature than the lower molecular weight materials. The high viscosity leads to slow leveling of the liquid surface. The high viscosity can be overcome by using increased process temperature, but higher temperatures limit the liquid lifetime.

The shrinkage in photopolymers is due to the shrinkage in the formation of the acrylic bonds. Photopolymers can be made by reacting other functional groups than acrylics, but they have substantially less reactivity than the acrylic bonded materials, resulting in generally inadequate speeds of solid material formation.

Materials that are somewhat flexible when formed usually produce objects with less distortion, since they cannot transmit strain long distances through the object. However, this property is a disadvantage if the goal is to make stiff objects. Some materials are soft when formed, and then harden when post cured with higher levels of radiation or other means. These are useful materials for stereolithography. The whole subject of materials that produce less distortion, because of the way they make the transition from liquid to solid, is currently being studied. However, materials do not currently exist which produce distortion free parts.

There continues to be a long existing need in the design and production arts for the capability of rapidly and reliably moving from the design stage to the prototype stage and to ultimate production, particularly moving directly from the computer designs for such plastic parts to virtually immediate prototypes and the facility for large scale production on an economical and automatic basis.

Accordingly, those concerned with the development and production of three-dimensional plastic objects and the like have long recognized the desirability for further improvement in more rapid, reliable, economical and automatic means which would facilitate quickly moving from a design stage to the prototype stage and to production, while avoiding the complicated focusing, alignment and exposure problems of the prior art three-dimensional production systems. The present invention clearly fulfills all of these needs.

SUMMARY OF THE INVENTION

The present invention provides a new and improved stereolithography system for generating a three-dimensional object by forming successive, adjacent, cross-sectional laminae of that object at the face of a fluid medium capable of altering its physical state in response to appropriate synergistic stimulation, information defining the object being specially processed to reduce curl, stress and distortion, and increase resolution, strength and accuracy of reproduction, the successive laminae being automatically integrated as they are formed to define the desired three-dimensional object.

Basically, and in general terms, this invention relates to a system for reducing or eliminating the effect of "curl" distortion in stereolithography. The term "curl" is used to describe an effect similar to that found when applying coatings to such things as paper. When a sheet is coated with a substance that shrinks, it curls up toward the coating. This is because the coating both shrinks and sticks to the sheet, and exerts a pulling force on the top but not on the bottom of the sheet. A sheet of paper has insufficient restraining force to resist the pulling, and most coatings will curl paper. The same thing happens when a photopolymer is cured on top of a thin sheet of already cured photo-polymer.

In a presently preferred embodiment, by way of example and not necessarily by way of limitation, the present invention harnesses the principles of computer generated graphics in combination with stereolithography, i.e., the application of lithographic techniques to the production of three-dimensional objects, to simultaneously execute computer aided design (CAD) and computer aided manufacturing (CAM) in producing three-dimensional objects directly from computer instructions. The invention can be applied for the purposes of sculpturing models and prototypes in a design phase of product development, or as a manufacturing system, or even as a pure art form.

The data base of a CAD system can take several forms. One form consists of representing the surface of an object as a mesh of triangles. These triangles completely form the inner and outer surfaces of the object. This CAD representation commonly also includes a unit length normal vector for each triangle. The normal points away from the solid which the triangle is bounding.

"Stereolithography" is a method and apparatus for making solid objects by successively "printing" thin layers of a curable material, e.g., a UV curable material, one on top of the other. A programmed movable spot beam of UV light shining on a surface or layer of UV curable liquid is used to form a solid cross-section of the object at the surface of the liquid. The object is then moved, in a programmed manner, away from the liquid surface by the thickness of one layer, and the next cross-section is then formed and adhered to the immediately preceding layer defining the object. This process is continued until the entire object is formed.

Essentially all types of object forms can be created with the technique of the present invention. Complex forms are more easily created by using the functions of a computer to help generate the programmed commands and to then send the program signals to the stereolithographic object forming subsystem.

Of course, it will be appreciated that other forms of appropriate synergistic stimulation for a curable fluid medium, such as particle bombardment (electron beams and the like), chemical reactions by spraying materials through a mask or by ink jets, or impinging radiation other than ultraviolet light, may be used in the practice of the invention without departing from the spirit and scope of the invention.

Stereolithography is a three-dimensional printing process which uses a moving laser beam to build parts by solidifying successive layers of liquid plastic. This method enables a designer to create a design on a CAD system and build an accurate plastic model in a few hours. In a presently preferred embodiment, by way of example and not necessarily by way of limitation, the stereolithographic process is composed of the following steps.

First, the solid model is designed in the normal way on the CAD system, without specific reference to the stereolithographic process. A copy of the model is made for stereolithographic processing. In accordance with the invention, as subsequently described in more detail, objects can be designed with structural configurations that reduce stress and curl in the ultimately formed object.

In accordance with the invention, when a stereolithography line which is part of a vertical or horizontal formation is drawn with breaks in the line instead of a solid line, a/k/a the "dashed line" technique, the pulling force normally transmitted along the vector is eliminated, and the curl effect is reduced. When a stereolithography line which is part of a vertical or horizontal formation is drawn with bends in the line instead of a straight line, a/k/a the "bent-line" technique, the pulling force normally transmitted along the vector is reduced, and the curl effect is reduced. When a stereolithography line which is part of a vertical or horizontal formation is drawn so that it does not adhere directly to the line below or beside it, but is attached, after it is formed with a secondary structure, a/k/a the "secondary structure" technique, the pulling force down the vector is eliminated, the bending moment on adjacent lines is reduced, and the curl effect is greatly reduced. When a stereolithography line which is part of a vertical or horizontal formation is drawn so that it does not adhere directly to the line below or beside it until the material is substantially reacted, a/k/a the "multi-pass" technique, the pulling force down the vector is reduced, the structure is more rigid so it can resist deformation, and the curl effect is greatly reduced.

By way of example, and not necessarily by way of limitation, the invention contemplates ways to draw rails with reduced curl; 1) a dashed line, to provide isolation of the pulling effect, 2) a line with short segments at angles to each other to isolate the pulling effect, 3) lines that do not adhere to the layer below, to eliminate the pulling effect, but which are held together with other structure, and 4) lines that are as fully reacted as possible before the exposure that extends the gel point (and adhesion) to the lower layer is applied.

Model preparation for stereolithography involves selecting the optimum orientation, adding supports, and selecting the operating parameters of the stereolithography system. The optimum orientation will (1) enable the object to drain, (2) have the least number of unsupported surfaces, (3) optimize important surfaces, and (4) enable the object to fit in the resin vat. Supports must be added to secure unattached sections and for other purposes; a CAD library of supports can be prepared for this purpose. The stereolithography operating parameters include selection of the model scale and layer (slice) thickness.

The surface of the solid model is then divided into triangles, typically "PHIGS". A triangle is the least complex polygon for vector calculations. The more triangles formed, the better the surface resolution and hence the more accurate the formed object with respect to the CAD design.

Data points representing the triangle coordinates are then transmitted to the stereolithographic system via appropriate network communications. The software of the stereolithographic system then slices the triangular sections horizontally (X-Y plane) at the selected layer thickness.

The stereolithographic unit (SLA) next calculates the section boundary, hatch, and horizontal surface (skin) vectors. Hatch vectors consist of cross-hatching between the boundary vectors. Several styles are available. Skin vectors, which are traced at high speed and with a large overlap, form the outside horizontal surfaces of the object. Interior horizontal areas, those within top and bottom skins, are not filled in other than by cross-hatch vectors.

The SLA then forms the object one horizontal layer at a time by moving the ultraviolet beam of a helium-cadmium laser across the surface of a photocurable resin and solidifying the liquid where it strikes. Absorption in the resin prevents the laser light from penetrating deeply and allows a thin layer to be formed. Each layer is comprised of vectors which are drawn in the following order: border, hatch, and surface.

The first layer that is drawn by the SLA adheres to a horizontal platform located just below the liquid surface. This platform is attached to an elevator which then translates vertically under computer control. After drawing a layer, the platform dips several millimeters into the liquid to coat the previously cured layer with fresh liquid, then rises up a smaller distance leaving a thin film of liquid from which the second layer will be formed. After a pause to allow the liquid surface to flatten out, the next layer is drawn. Since the resin has adhesive properties, the second layer becomes firmly attached to the first. This process is repeated until all the layers have been drawn and the entire three-dimensional object is formed. Normally, the bottom 0.25 inch or so of the object is a support structure on which the desired part is built. Resin that has not been exposed to light remains in the vat to be used for the next part. There is very little waste of material.

Post processing involves heating the formed object to remove excess resin, removing excess resin with a solvent, or allowing time for the excess resin to drain while the part remains at ambient temperature, ultraviolet or heat curing to complete polymerization, and removing supports. Additional processing, including sanding and assembly into working models, may also be performed.

The stereolithographic apparatus of the present invention has many advantages over currently used apparatus for producing plastic objects. The apparatus of the present invention avoids the need of producing design layouts and drawings, and of producing tooling drawings and tooling. The designer can work directly with the computer and a stereo-lithographic device, and when he is satisfied with the design as displayed on the output screen of the computer, he can fabricate a part for direct examination. If the design has to be modified, it can be easily done through the computer, and then another part can be made to verify that the change was correct. If the design calls for several parts with interacting design parameters, the method of the invention becomes even more useful because of all of the part designs can be quickly changed and made again so that the total assembly can be made and examined, repeatedly if necessary.

After the design is complete, part production can begin immediately, so that the weeks and months between design and production are avoided. Ultimate production rates and parts costs should be similar to current injection molding costs for short run production, with even lower labor costs than those associated with injection molding. Injection molding is economical only when large numbers of identical parts are required. Stereolithography is useful for short run production because the need for tooling is eliminated and production set-up time is minimal. Likewise, design changes and custom parts are easily provided using the technique. Because of the ease of making parts, stereolithography can allow plastic parts to be used in many places where metal or other material parts are now used. Moreover, it allows plastic models of objects to be quickly and economically provided, prior to the decision to make more expensive metal or other material parts.

Hence, the stereolithographic apparatus of the present invention satisfies a long existing need for a CAD and CAM system capable of rapidly, reliably, accurately and economically designing and fabricating three-dimensional plastic parts and the like.

The above and other objects and advantages of this invention will be apparent from the following more detailed description when taken in conjunction with the accompanying drawings of illustrative embodiments.

BRIEF DESCRIPTION OF THE DRAWINGS

FIG. 5a is an end elevational view of a rail with no adhesion except for the attaching secondary structure;

FIG. 5b is a perspective view of a rail with no adhesion except for the attaching secondary structure;

FIGS. 10 and 11 are flow charts illustrating the basic concepts employed in practicing the method of stereolithography of the present invention;

FIG. 14a illustrates the pulling effect of one line on another line below it;

FIG. 14b illustrates the lines of FIG. 14a, which are curled upwards because of the pulling effect;

FIG. 15a illustrates two already-cured lines with a gap of uncured resin between them;

FIG. 15b illustrates the countervailing forces exerted when the uncured resin in the gap of FIG. 15a is cured;

FIG. 16a illustrates the cure depth achieved when a particular exposure is delivered in a single pass;

FIG. 16b illustrates the cure depth achieved through the lensing effect, when the exposure of FIG. 16a is delivered through multiple passes;

FIG. 17a illustrates the problem of downward bending in the multipass technique;

FIG. 17b illustrates a possible solution to the problem of FIG. 17a, by increasing the exposure on the early passes of the multipass technique;

FIG. 18 is a sample report showing REDRAW commands in the .L file;

FIG. 19 is a sample report showing REDRAW commands in the .R file;

FIGS. 20a and 20b is a sample report showing REDRAW default parameters in the .PRM file;

FIG. 21b Illustrates the impact of finite jumping time on the drawing of the vectors of FIG. 21a;

FIG. 23b illustrates rivets, where the diameter of the rivets is larger than the rivets of FIG. 23a;

FIG. 26a shows a part made according to the dashed line technique;

FIG. 26b shows a part made according to the bent line technique;

FIG. 26c shows a part made according to the secondary structure technique;

FIG. 27a shows the use of bricks and mortar with the dashed line technique;

FIG. 27b shows the cure sequence for the bricks and mortar variant of the dashed line technique;

FIG. 27c shows the cure sequence for another variant of the dashed line technique;

FIG. 27d shows the cure sequence for a third variant of the dashed line technique;

FIG. 27e show the cure for a fourth variant of the dashed line technique;

FIG. 28a shows the relieving of stress from the bent line technique;

FIG. 28b shows the bent line technique with a gap size of 40-300 mil;

FIG. 28c shows the bent line technique with a smaller gap size than in FIG. 28b;

FIG. 28d shows a variant of the bent line technique having a triangular shape;

FIG. 28e shows another variant of the bent line technique;

FIG. 28f shows the angles associated with the variant of FIG. 28e;

FIG. 30 is a sample report showing the specification of critical areas in a critical .BOX file;

FIG. 31 is a sample report showing the specification of RIVET commands in the .L file;

FIGS. 32a and 32b are a sample report showing the specification of default RIVET parameters in the .PRM file;

FIGS. 33a and 33b are a sample report showing a .V file;

FIG. 35a is a side view of a quarter cylinder showing its upper, support, post, and base layers;

FIG. 35b is a top view of a quarter cylinder showing the inner and outer concentric circularly curved rails;

FIG. 35c is a top view of a quarter cylinder showing the angle subtended by the curved rails;

FIG. 36a is a side view of a part having slotted sections;

FIG. 36b is a frontal view of the part of FIG. 36a;

FIG. 36c is a top view of the part of FIG. 36a; and

FIG. 36d is a side view of the part of FIG. 36a showing the effects of sneer.

DESCRIPTION OF THE PREFERRED EMBODIMENT

The present invention is an improved stereolithographic method and apparatus of the type for building up successive layers of photopolymer, where each layer is formed by drawing a series of vectors with a light pencil on the liquid surface that defines each cross-section of the object, wherein the improvement comprises reducing or eliminating curl. A number of techniques have been examined by building rails that are a series of layers of straight lines, and examining the resulting distortion. The force, or stress, in this case is generated at the interface where the photopolymer cures (and shrinks) and adheres to the layer below, as shown in the following diagram.

Figure 1:
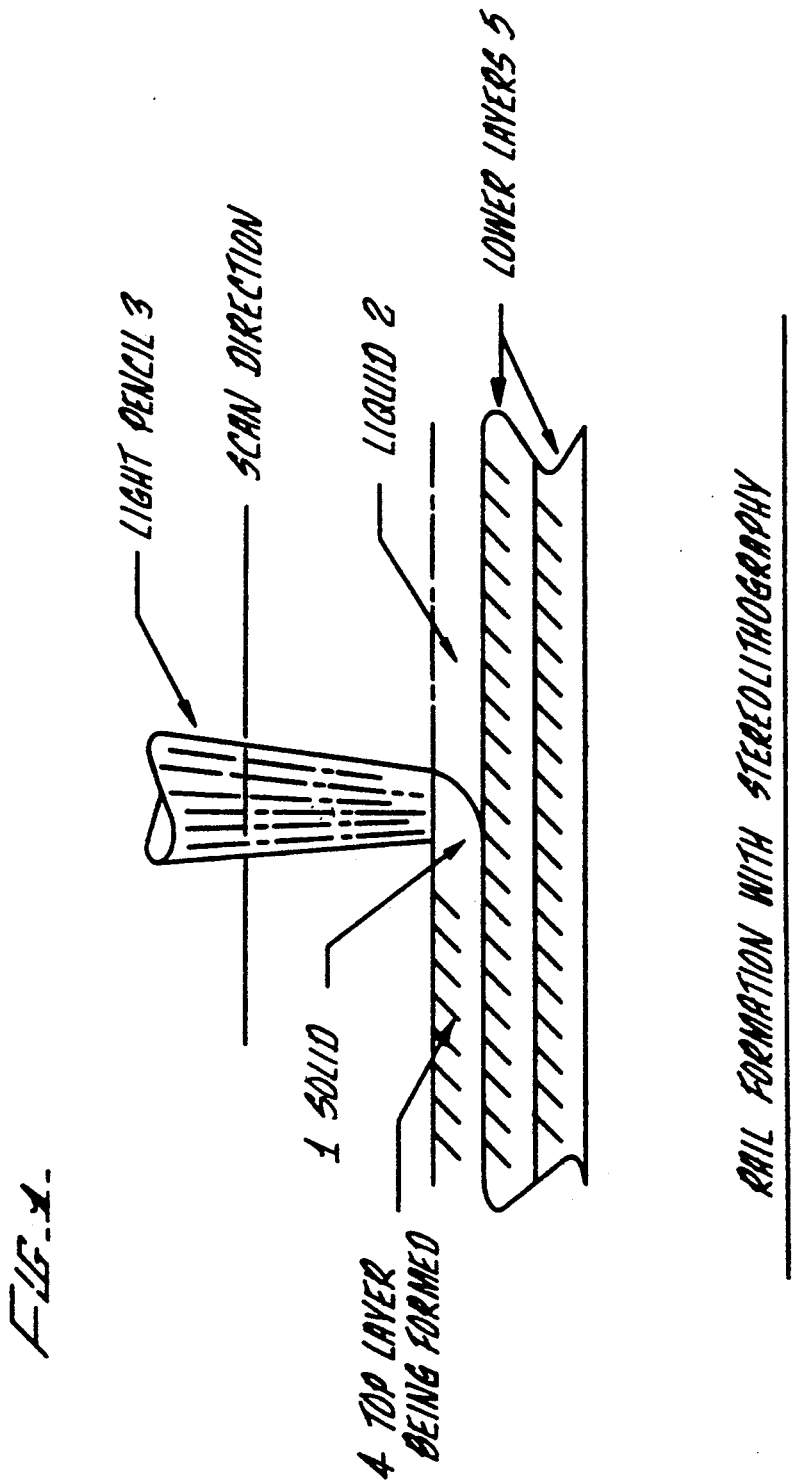
FIG. 1 illustrates rail formation with stereolithography.
Figure 2:
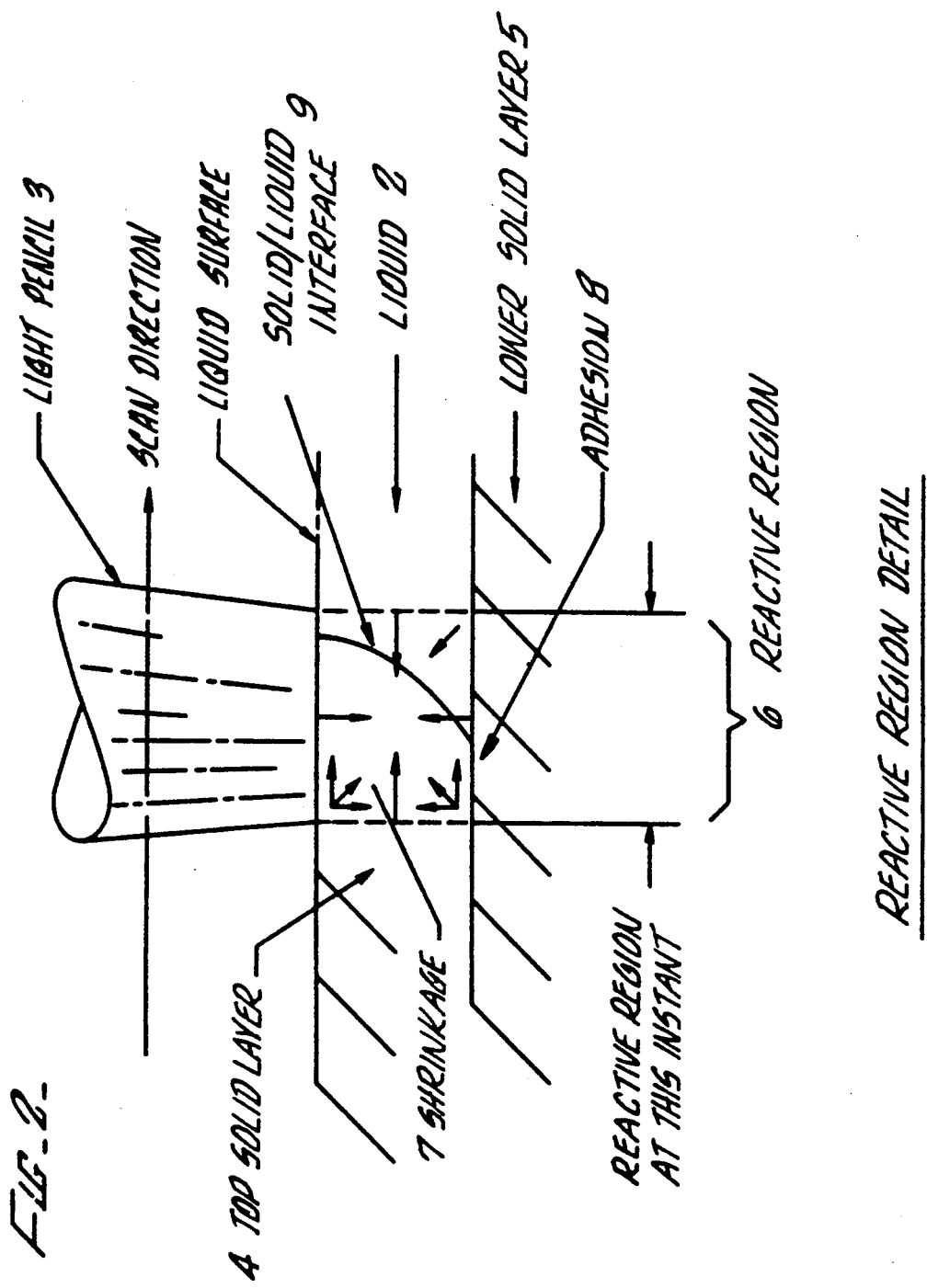
FIG. 2 illustrates reactive region detail.

Referring now to the drawings and particularly to FIGS. 1 and 2 thereof, light pencil 3 moves across liquid 2 in the direction shown, converting it to solid 1. This forms a solid top layer 4, that adheres to lower layer 5. The term light pencil refers to synergistic stimulation such as UV light which impinges on the surface of the liquid photopolymer.

In the expanded diagram (FIG. 2), the light from the pencil is shown penetrating into the photopolymer, forming reactive region 6. Solid/liquid interface 9, or gel point, is indicated. However, the polymeric state of the material in the active region is more complex. All of the material in the region is reacting. The material at the upper left of the region is most reacted, because the light is most intense and the pencil has been in this area the most time. The material at the lower right, just above the lower layer, is the least reacted, because the light is the least intense and the pencil has been in this area the least time.

As the material reacts, it changes density. This discussion assumes that the density change causes shrinkage, but expansion is also possible. Reactive region 6 acts as a complex shrinking cylinder, and shrinkage 7 is toward the interior of this cylinder. In the lower left area of the reactive region 6, the new solid material of top layer 4 attaches to the lower layer 5 with adhesion 8.

When a layer forms without attaching to a layer below, there is no "curl" distortion because as the reactive region shrinks, it is only attached to (and constrained by) its own layer. In achieving this single layer "adhesion", the layer is placed in compression, but there is no bending moment generated. This is because all of the horizontal forces from the shrinking reaction have no firm base to grip other than the just formed layer, and the new solid reacting material is allowed to displace slightly to the left as it is formed. This assumes that the cure depth being achieved is appropriately suited to the material being used so that downward curl is not produced by material at the lower portion of the layer reacting substantially later than the material at the top of the layer thereby producing a downward torque on the upper material from the curing of the lower material.

However, when a layer is formed and simultaneously attached to a lower layer, the portion of the attached material in the reactive region is still shrinking. This shrinking is now coupled to the rest of the rail in two ways:

a. The material directly over the adhesion point is shrinking. Since this shrinking material now can use the top of the lower layer as a firm base, it puts compressional stress into this base. As the new layer is formed, all of the top of the previous (lower) layer is compressed, and this causes a bending moment in the lower layer.

b. The reactive region shrinks, and is attached to the now forming top layer. This region is pulled to the left, as when an unattached layer is formed. However, the reactive region is now also attached to the lower layer, so that it resists the movement to the left, and so the shrinking also pulls the top layer to the right. This causes a bending moment in the rail.

It should be noted that there are two types of shrinkage with photopolymer reactions. The first mechanism is that the polymer shrinks due to polymer bond formation. The result is that the solid polymer state is more dense than the liquid pre-polymer state, and hence a given amount of polymer takes up less volume than the pre-polymer that it was formed from. This shrinkage mechanism is essentially instantaneous compared to the time taken to generate laser patterns (i.e., less than a microsecond).

The second mechanism is a thermal effect. Photopolymers are exothermic, so they give off heat when they react. This heat raises the temperature of the polymer, and it expands upon formation. The subsequent cooling and shrinkage has the same effect as the shrinkage due to the change of state, except it is slower, and is long compared to the time taken to generate laser patterns (seconds). For the current photopolymers worked with, the change of state mechanism is the larger of the two types of shrinkage.

A typical example of a stereolithographic photopolymer is DeSoto SLR800 stereolithography resin, made by DeSoto, Inc., 1700 South Mt. Prospect Road, Des Plaines, Ill. 60018.

Methods to Control Curl

In accordance with the invention, when a stereolithography line which is part of a vertical or horizontal formation is drawn with breaks in the line instead of a solid line, a/k/a the "dashed line" technique, the pulling force normally transmitted along the vector is eliminated, and the curl effect is reduced. When a stereolithography line which is part of a vertical or horizontal formation is drawn with bends in the line instead of a straight line, a/k/a the "bent line" technique, the pulling force normally transmitted along the vector is reduced, and the curl effect is reduced. When a stereolithography line which is part of a vertical or horizontal formation is drawn so that it does not adhere directly to the line below or beside it, but is attached, after it is formed, with a secondary structure, a/k/a the "secondary structure" technique, the pulling force down the vector is eliminated, the bending moment on the adjacent lines is reduced, and the curl effect is greatly reduced. When a stereolithography line which is part of a vertical or horizontal formation is drawn so that it does not adhere directly to the line below or beside it until the material is substantially reacted, a/k/a the "multi-pass" technique, the pulling force down the vector is reduced, and the structure is more rigid and less material is being cured in the adhesion process so it can more effectively resist distortion.

The methods to control curl depend on building parts in ways so that the effects (a) and (b) above are eliminated or reduced. There are several simple examples of ways to draw rails with reduced curl; 1) a dashed line, to provide isolation of the pulling effect, 2) a line with short segments at angles to each other, to isolate the pulling effect, 3) lines that do not adhere to the layer below, to eliminate the pulling effect, but which are held together with other structure, and 4) lines that are as fully reacted as possible before the exposure that extends the gel point (and adhesion) to the lower layer is applied. These techniques are referred to respectively as the dashed line, bent line, secondary structure, and multi-pass techniques. These basic rails are further described hereinafter.

Figure 3:
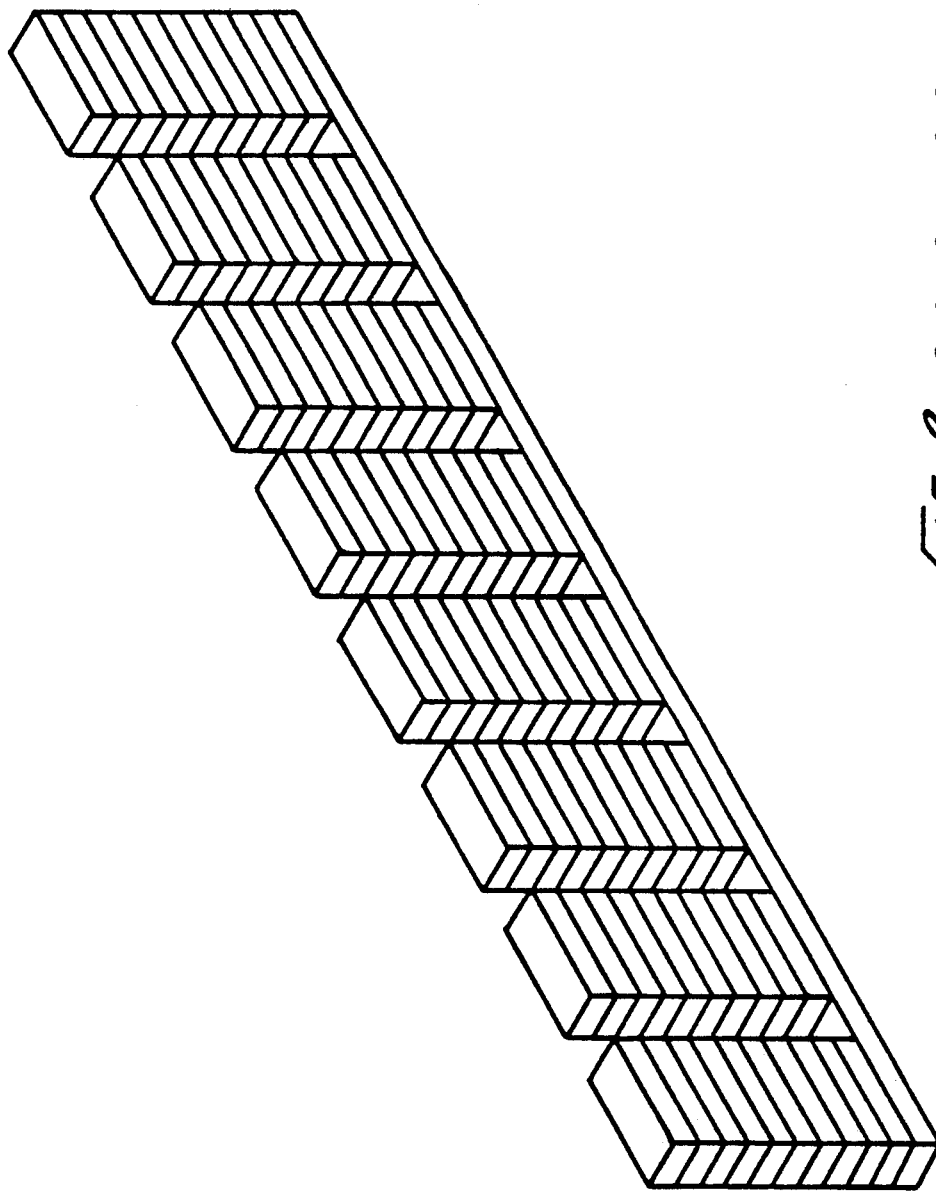
FIG. 3 is a perspective view of a dashed line rail.
Figure 4:
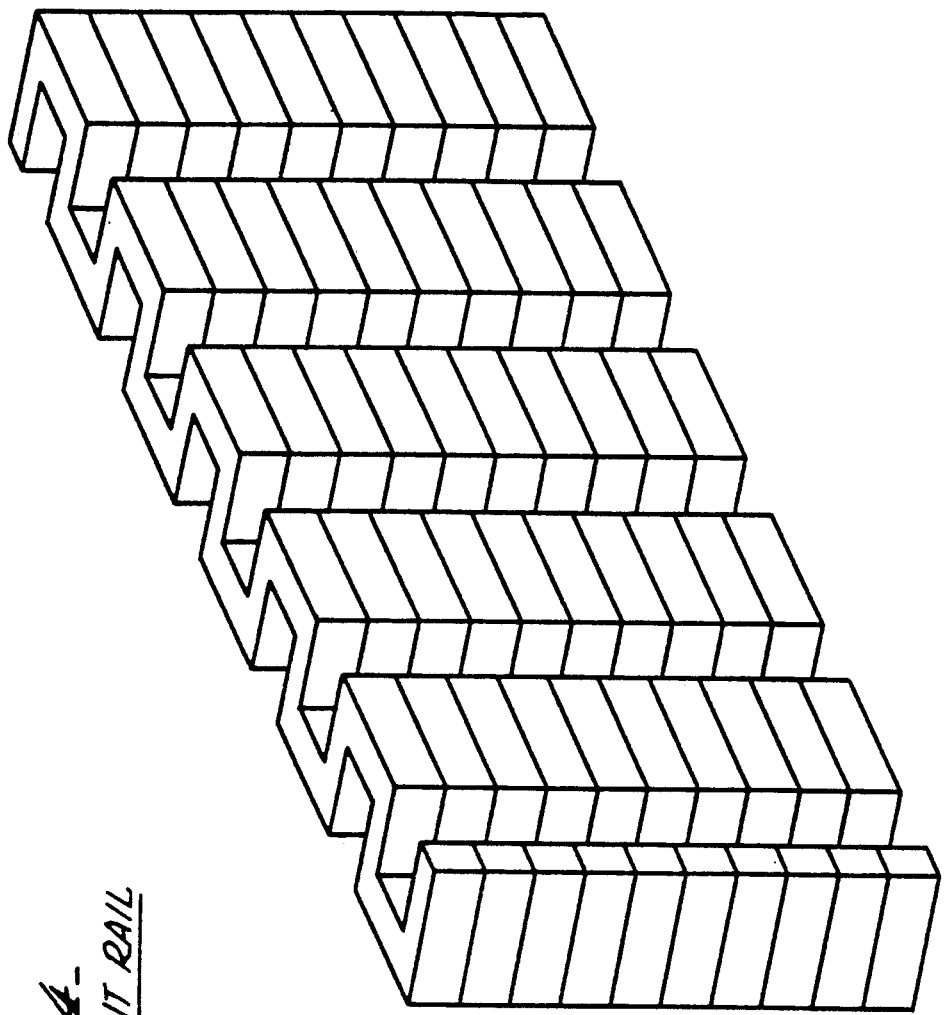
FIG. 4 is a perspective view of a short segment or bent line rail.
Figure 6:
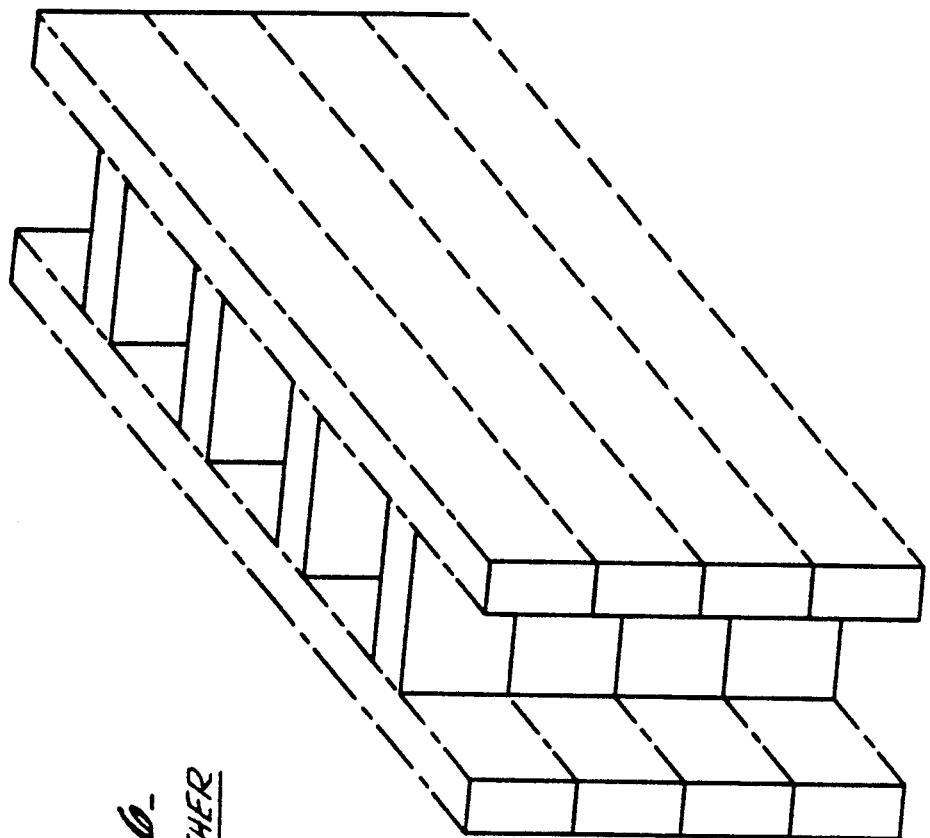
FIG. 6 is a rail held together with rivets.

A rail made with a dashed line is illustrated in FIG. 3. FIG. 4 shows a rail made with short segments at angles to each other. FIGS. 5a and 5b illustrates a rail made with lines that do not adhere to the layer below but which are held together with other structure.

To understand how to react lines as fully as possible prior to their adhering to the line below, requires an understanding of the solid formation process. The amount of reaction time taken to form a layer in stereolithography depends on the layer thickness, the adsorption rate of the incident reactant energy, and the reactant rate of the material.

The thickness response curve to form a solid film on a liquid surface with incident reactant energy is a logarithmic function. The solid material at the liquid/solid interface is just at the gel point, and the solid material at the surface is the most reacted. After a film is formed, subsequent exposures increase the reaction at the surface, but extend the thickness of the film less and less.

An effective way to control curl is to choose a layer thickness that is large enough so that the bulk of the new top layer is highly cured (reacted). It is even more effective to cure this layer with multiple exposures so that only the last few exposures achieve the adhesion. In this case, most of the material in the reactive region has already changed density before adhesion occurs. Also, the new top layer and the lower layers are more fully cured and more able to resist deformation.

In a presently preferred embodiment of the invention, a rail is built with two parallel walls close to each other, with exposure small enough so the layers do not adhere, and the walls are connected with short perpendicular vectors that are exposed to a depth great enough so that the layers adhere at these points and hold the structure together.

In this method, the vectors for the two walls are both grown for each layer, and the adhesion is achieved by using additional exposure for the connecting vectors.

Figure 7:
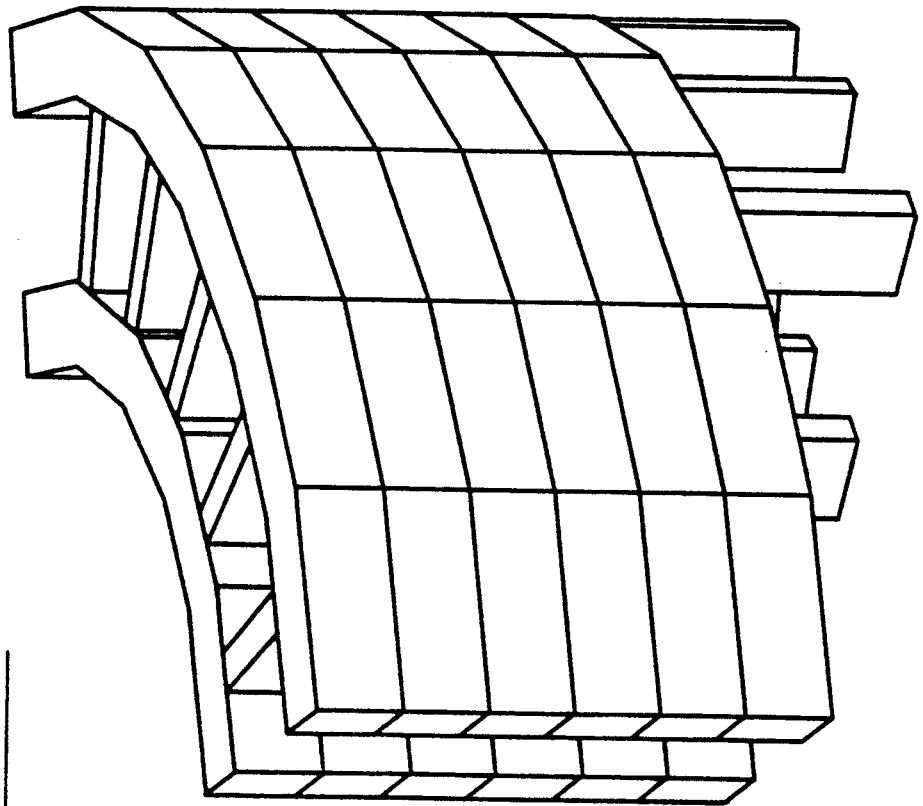
FIG. 7 is a quarter cylinder.

This concept has been generalized as a part building method. In this method, a part is designed with an inner wall and an outer wall, and with connecting crosshatch. The part built with the Basic program "Quarter Cylinder" attached hereto as Appendix J, described above is such a part. FIG. 7 of the drawings shows this part. This building style is referred to as "riveting", where the higher exposed connecting vectors are called rivets.

In using this building style, when the inner and outer walls are exposed enough to cause adhesion, the amount of curl of the part depends on the amount of exposure beyond that required to make the polymer depth equal to the layer depth. That is, the more the walls are exposed beyond the point where the layer touches the layer below, the more the part curls. This is, in fact, the basis of a standard "curl test" for different resins described in more detail further on in this application. According to this test, a series of these quarter cylinders are built at different exposures, and the curl versus exposure is plotted. Using this test, it has been discovered that different resin formulas curl differently, and this allows the selection of the best resins.

Also note that the methods described herein to reduce curl are also applicable to the technique of building parts by fusing metal or plastic powder with a heat generating laser. In fact, the powder fusing technique may be even more susceptible to curl than by building with photopolymers, and the curl reduction techniques may be needed even more with this method.

Figure 8:
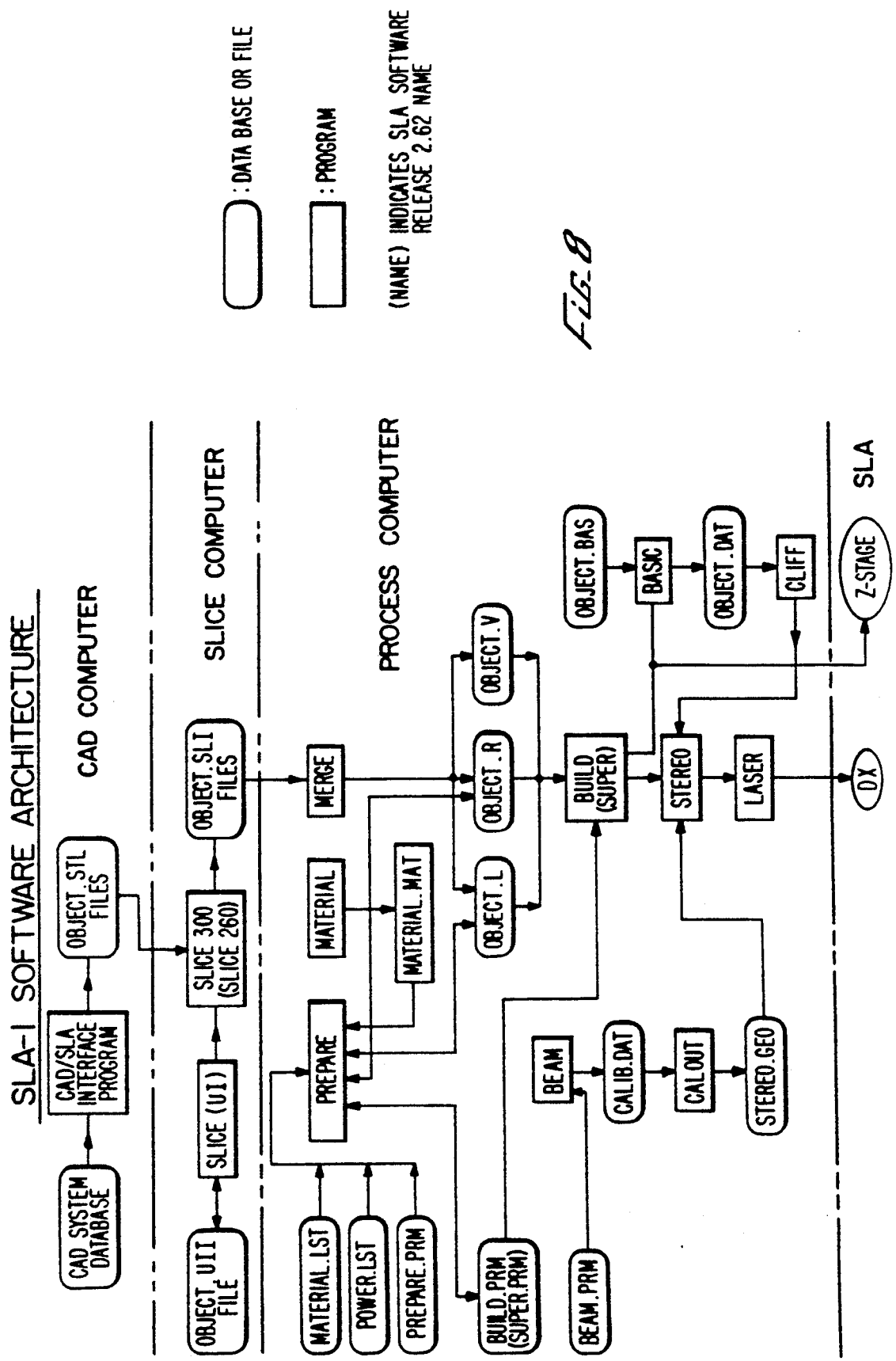
FIG. 8 is a flow chart illustrating the software architecture of a suitable stereolithography system in which the present invention may be used.

Note also that with the general building algorithms as set forth in the previously described related co-pending applications, specifically Ser. No. 182,830 its CIP Ser. No. 269,801 and its continuation, Ser. No. 331,644 a part can be designed by CAD sliced using X-axis hatch and 60 degree and 120 degree hatch, and with an appropriate MIA specified to produce near radial cross-hatch. If this part is then exposed with large exposure for the cross-hatch and lower exposure for the boundaries, then the part building method described in the paragraphs above has been implemented via CAD design. FIG. 8 of the drawings illustrates an overall stereolithography system suitable for this purpose which is described in more detail in the above-referenced co-pending applications.

Variations of the basic invention are possible, such as the broken lines or bent lines can be "filled" with lower exposure dashed lines to even out the surface structure. Dashed or broken lines can be used as the support lines that do not adhere directly to the line below or next to them. The unsupported lines are connected to the support lines with small additional structure lines. The secondary structure to attach unsupported lines can be "rivets" of higher exposure on top of these lines to connect them to the lines below.

Thinner layers can be formed by adjusting the absorption of the material so that a given exposure produces a thinner film, so now the material near the top surface is more fully reacted, thereby more able to withstand stress.

The various methods described to control curl are additive. That is, if two or more of them are combined, the curl is reduced even further. Also, there are many other possible variations of the described techniques.

An example of one embodiment of a commercial system, provided by 30 Systems, Inc. of Valencia, Calif., embodying the present invention, is illustrated and described by the enclosed appendices, wherein Appendix A are manuals describing an early Model SLA-1 Beta Site Stereolithography System, including installation and operation, Appendix B is the first draft of an SLA-1 Software Manual, Appendix C is a listing of Version 2.62 of the software, Appendix D is an SLA-1 training manual, Appendix E is a list of non-3D Systems software vendors for the Model SLA-1 Stereolithography System, Appendix F is a listing of Version 3.03 of the Software, Appendix G is a "Slice" Flow Chart Implementing Style 1, Appendix H is a "Slice" Flow Chart Implementing Style 2, Appendix I is a Stereolithography CAD/CAM Interface Specification for an interface between CAD/CAM equipment and the Model SLA-1 Stereolithography System, Appendix J is a program listing for producing a quarter cylinder which is used to measure the effectiveness of different anti-curl techniques, and Appendix K is a listing of Version 3.20 of the software.

Figure 9:
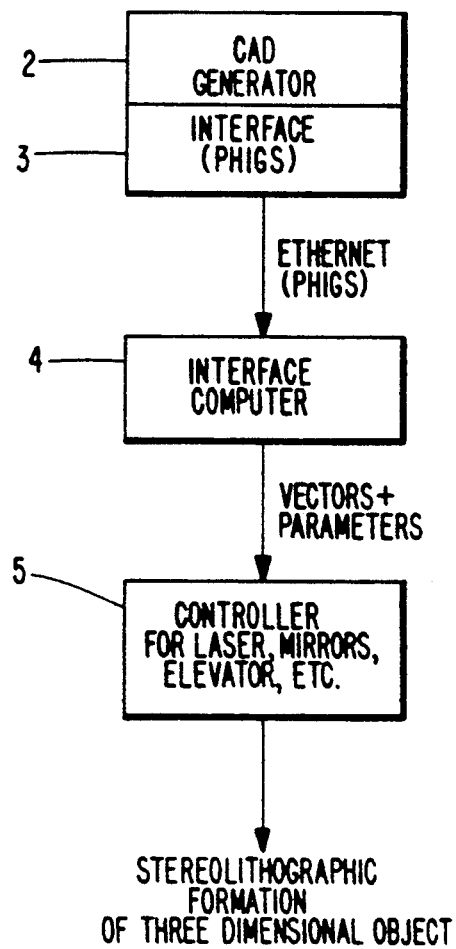
FIG. 9 is an overall block diagram of a stereolithography system for the practice of the present invention.

Referring now to the drawings, and particularly to FIG. 9 of the drawings, there is shown a block diagram of an overall stereolithography system suitable for practicing the present invention. A CAD generator 2 and appropriate interface 3 provide a data description of the object to be formed, typically in PHIGS format, via network communication such as ETHERNET or the like to an interface computer 4 where the object data is manipulated to optimize the data and provide output vectors which reduce stress, curl and distortion, and increase resolution, strength, accuracy, speed and economy of reproduction, even for rather difficult and complex object shapes. The interface computer 4 generates layer vector data by successively slicing, varying layer thickness, rounding polygon vertices, filling, generating boundaries, flat skins, near-flat skins, up-facing and down-facing skins, scaling, cross-hatching, offsetting vectors and ordering of vectors.

The vector data and parameters from the computer 4 are directed to a controller subsystem 5 for operating the system stereolithography laser, mirrors, elevator and the like.

FIGS. 10 and 11 are flow charts illustrating the basic system of the present invention for generating three-dimensional objects by means of stereolithography.

Many liquid state chemicals are known which can be induced to change to solid state polymer plastic by irradiation with ultraviolet light (UV) or other forms of synergistic stimulation such as electron beams, visible or invisible light, reactive chemicals applied by ink jet or via a suitable mask. UV curable chemicals are currently used as ink for high speed printing, in processes of coating of paper and other materials, as adhesives, and in other specialty areas.

Lithography is the art of reproducing graphic objects, using various techniques. Modern examples include photographic reproduction, xerography, and microlithography, as is used in the production of microelectronic circuit boards. Computer generated graphics displayed on a plotter or a cathode ray tube are also forms of lithography, where the image is a picture of a computer coded object.

Computer aided design (CAD) and computer aided manufacturing (CAM) are techniques that apply the capabilities of computers to the processes of designing and manufacturing. A typical example of CAD is in the area of electronic printed circuit design, where a computer and plotter draw the design of a printed circuit board, given the design parameters as computer data input. A typical example of CAM is a numerically controlled milling machine, where a computer and a milling machine produce metal parts, given the proper programming instructions. Both CAD and CAM are important and are rapidly growing technologies.

A prime object of the present invention is to harness the principles of computer generated graphics, combined with the use of UV curable plastic and the like, to simultaneously execute CAD and CAM, and to produce three-dimensional objects directly from computer instructions. This invention, referred to as stereolithography, can be used to sculpture models and prototypes in a design phase of product development, or as a manufacturing device, or even as an art form. The present invention enhances the developments in stereolithography set forth in U.S. Pat. No. 4,575,330, issued Mar. 11, 1986, to Charles W. Hull, one of the inventors herein.

Referring now more specifically to FIG. 10 of the drawings, the stereolithographic method is broadly outlined. Step 8 calls for generation of CAD or other data, typically in digital form, representing a three-dimensional object to be formed by the system. This CAD data usually defines surfaces in polygon format, triangles and normals perpendicular to the planes of those triangles, e.g., for slope indications, being presently preferred, and in a presently preferred embodiment of the invention conforms to the Programmer's Hierarchial Interactive Graphics System (PHIGS) now adapted as an ANSI standard. This standard is described, by way of example, in the publication "Understanding PHIGS", published by Template, Megatek Corp., San Diego, Calif., which is hereby fully incorporated by reference herein as though set forth in full.

In Step 9, the PHIGS data or its equivalent is converted, in accordance with the invention, by a unique conversion system to a modified data base for driving the stereolithography output system in forming three-dimensional objects. In this regard, information defining the object is specially processed to reduce stress, curl and distortion, and increase resolution, strength and accuracy of reproduction.

Step 10 in FIG. 10 calls for the generation of individual solid laminae representing cross-sections of a three-dimensional object to be formed. Step 11 combines the successively formed adjacent lamine to form the desired three-dimensional object which has been programmed into the system for selective curing.

Hence, the stereolithographic system of the present invention generates three-dimensional objects by creating a cross-sectional pattern of the object to be formed at a selected surface of a fluid medium, e.g., a UV curable liquid or the like, capable of altering its physical state in response to appropriate synergistic stimulation such as impinging radiation, electron beam or other particle bombardment, or applied chemicals (as by ink jet or spraying over a mask adjacent the fluid surface), successive adjacent laminae, representing corresponding successive adjacent cross-sections of the object, being automatically formed and integrated together to provide a step-wise laminar or thin layer buildup of the object, whereby a three-dimensional object is formed and drawn from a substantially planar or sheet-like surface of the fluid medium during the forming process.

The aforedescribed technique illustrated in FIG. 10 is more specifically outlined in the flow chart of FIG. 11, where again Step 8 calls for generation of CAD or other data, typically in digital form, representing a three-dimensional object to be formed by the system. Again, in Step 9, the PHIGS data is converted by a unique conversion system to a modified data base for driving the stereolithography output system in forming three-dimensional objects. Step 12 calls for containing a fluid medium capable of solidification in response to prescribed reactive stimulation. Step 13 calls for application of that stimulation as a graphic pattern, in response to data output from the computer 4 in FIG. 9, at a designated fluid surface to form thin, solid, individual layers at that surface, each successive layer representing an adjacent cross-section of a three-dimensional object to be produced. In the practical application of the invention, each lamina will be a thin lamina, but thick enough to be adequately cohesive in forming the cross-section and adhering to the adjacent laminae defining other cross-sections of the object being formed.

Figure 13:
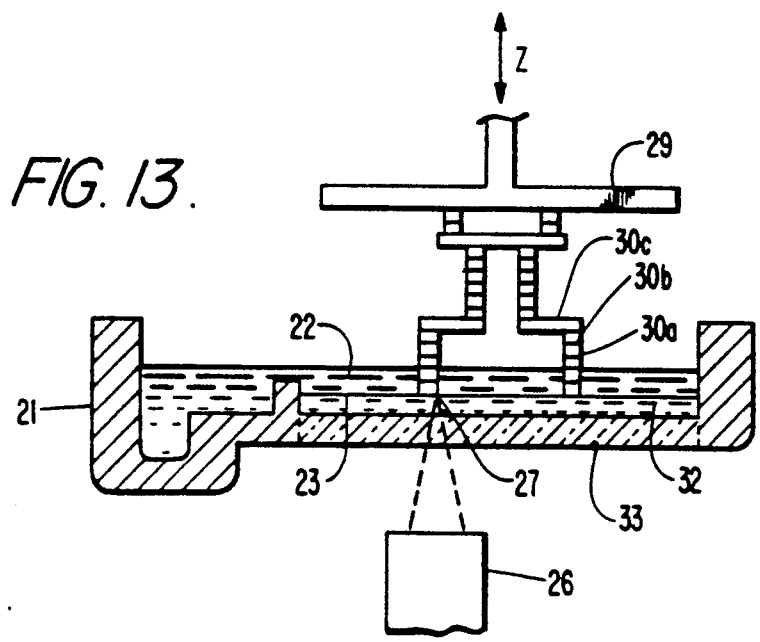
FIG. 13 is an elevational sectional view of a second embodiment of a stereolithography system for the practice of the invention.

Step 14 in FIG. 13 calls for superimposing successive adjacent layers or laminae on each other as they are formed, to integrate the various layers and define the desired three-dimensional object. In the normal practice of the invention, as the fluid medium cures and solid material forms to define one lamina, that lamina is moved away from the working surface of the fluid medium and the next lamina is formed in the new liquid which replaces the previously formed lamina, so that each successive lamina is superimposed and integral with (by virtue of the natural adhesive properties of the cured fluid medium) all of the other cross-sectional laminae. Of course, as previously indicated, the present invention also deals with the problems posed in transitioning between vertical and horizontal.

The process of producing such cross-sectional laminae is repeated over and over again until the entire three-dimensional object has been formed. The object is then removed and the system is ready to produce another object which may be identical to the previous object or may be an entirely new object formed by changing the program controlling the stereolithographic system.

Figure 12:
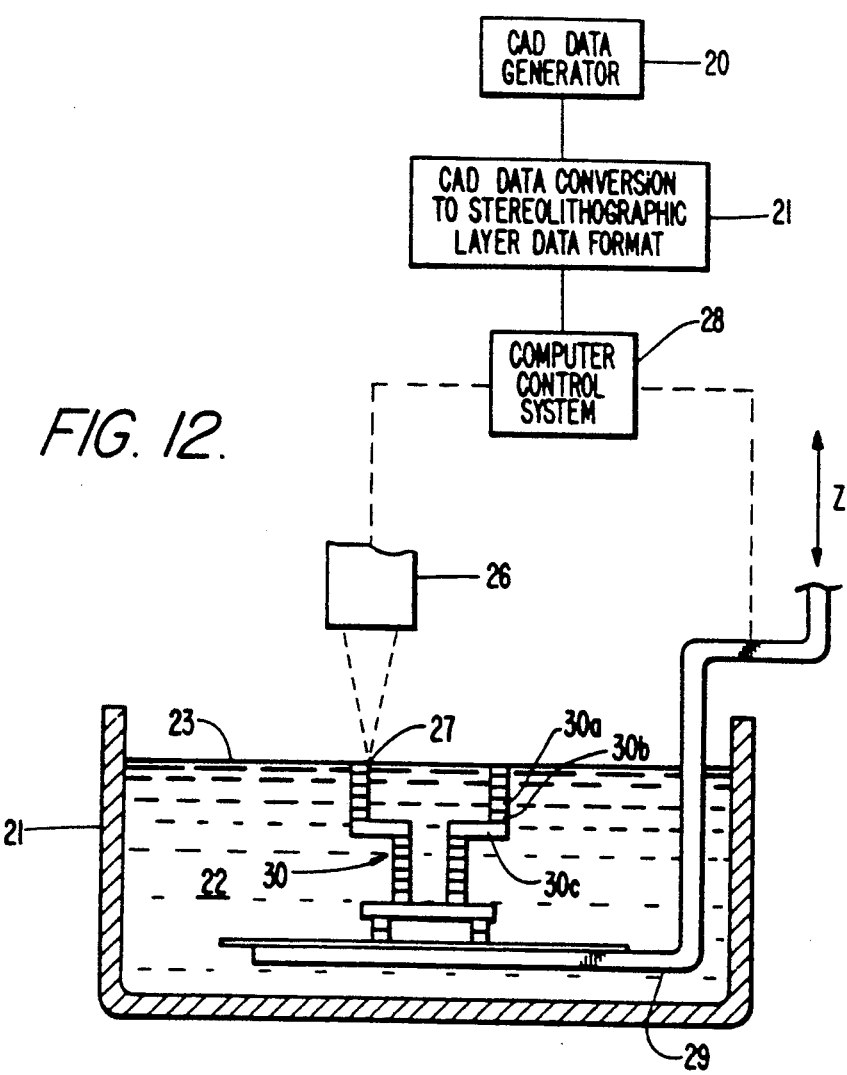
FIG. 12 is a combined block diagram, schematic and elevational sectional view of a system suitable for practicing the invention.

FIGS. 12-13 of the drawings illustrate various apparatus suitable for implementing the stereolithographic methods illustrated and described by the systems and flow charts of FIGS. 9-11.

As previously indicated, "Stereolithography" is a method and apparatus for making solid objects by successively "printing" thin layers of a curable material, e.g., a UV curable material, one on top of the other. A programmable movable spot beam of UV light shining on a surface or layer of UV curable liquid is used to form a solid cross-section of the object at the surface of the liquid. The object is then moved, in a programmed manner, away from the liquid surface by the thickness of one layer and the next cross-section is then formed and adhered to the immediately preceding layer defining the object. This process is continued until the entire object is formed.

Essentially all types of object forms can be created with the technique of the present invention. Complex forms are more easily created by using the functions of a computer to help generate the programmed commands and to then send the program signals to the stereolithographic object forming subsystem.

The data base of a CAD system can take several forms. One form, as previously indicated, consists of representing the surface of an object as a mesh of triangles (PHIGS). These triangles completely form the inner and outer surfaces of the object. This CAD representation also includes a unit length normal vector for each triangle. The normal points away from the solid which the triangle is bounding. This invention provides a means of processing such CAD data into the layer-by-layer vector data that is necessary for forming objects through stereolithography.

For stereolithography to successfully work, there must be good adhesion from one layer to the next. Hence, plastic from one layer must overlay plastic that was formed when the previous layer was built. In building models that are made of vertical segments, plastic that is formed on one layer will fall exactly on previously formed plastic from the preceding layer, and thereby provide good adhesion. As one starts to make a transition from vertical to horizontal features, using finite jumps in layer thickness, a point may eventually be reached where the plastic formed on one layer does not make contact with the plastic formed on the previous layer, and this causes severe adhesion problems. Horizontal surfaces themselves do not present adhesion problems because by being horizontal, the whole section is built on one layer with side-to-side adhesion maintaining structural integrity. This invention provides a general means of insuring adhesion between layers when making transitions from vertical to horizontal or horizontal to vertical sections, as well as providing a way to completely bound a surface, and ways to reduce or eliminate stress and strain in formed parts.

A presently preferred embodiment of a new and improved stereolithographic system is shown in elevational cross-section in FIG. 12. A container 21 is filled with a UV curable liquid 22 or the like, to provide a designated working surface 23. A programmable source of ultraviolet light 26 or the like produces a spot of ultraviolet light 27 in the plane of surface 23. The spot 27 is movable across the surface 23 by the motion of mirrors or other optical or mechanical elements (not shown in FIG. 12) used with the light source 26. The position of the spot 27 on surface 23 is controlled by a computer control system 28. As previously indicated, the system 28 may be under control of CAD data produced by a generator 20 in a CAD design system or the like and directed in PHIGS format or its equivalent to a computerized conversion system 25 where information defining the object is specially processed to reduce stress, curl and distortion, and increase resolution, strength and accuracy of reproduction.

A movable elevator platform 29 inside container 21 can be moved up and down selectively, the position of the platform being controlled by the system 28. As the device operates, it produces a three-dimensional object 30 by step-wise buildup of integrated laminae such as 30a, 30b, 30c.

The surface of the UV curable liquid 22 is maintained at a constant level in the container 21, and the spot of UV light 27, or other suitable form of reactive stimulation, of sufficient intensity to cure the liquid and convert it to a solid material, is moved across the working surface 23 in a programmed manner. As the liquid 22 cures and solid material forms, the elevator platform 29 that was initially just below surface 23 is moved down from the surface in a programmed manner by any suitable actuator. In this way, the solid material that was initially formed is taken below surface 23 and new liquid 22 flows across the surface 23. A portion of this new liquid is, in turn, converted to solid material by the programmed UV light spot 27, and the new material adhesively connects to the material below it. This process is continued until the entire three-dimensional object 30 is formed. The object 30 is then removed from the container 21, and the apparatus is ready to produce another object. Another object can then be produced, or some new object can be made by changing the program in the computer 28.

The curable liquid 22, e.g., UV curable liquid, must have several important properties: (A) It must cure fast enough with the available UV light source to allow practical object formation times. (B) It must be adhesive, so that successive layers will adhere to each other. (C) Its viscosity must be low enough so that fresh liquid material will quickly flow across the surface when the elevator moves the object. (D) It should absorb UV light so that the film formed will be reasonably thin. (E) It must be reasonably insoluble in that same solvent in the solid state, so that the object can be washed free of the UV cure liquid and partially cured liquid after the object has been formed. (F) It should be as non-toxic and non-irritating as possible.

The cured material must also have desirable properties once it is in the solid state. These properties depend on the application involved, as in the conventional use of other plastic materials. Such parameters as color, texture, strength, electrical properties, flammability, and flexibility are among the properties to be considered. In addition, the cost of the material will be important in many cases.

The UV curable material used in the presently preferred embodiment of a working stereolithography system (e.g., FIG. 12) is DeSoto SLR 800 stereolithography resin, made by DeSoto, Inc. of Des Plains, Ill.

The light source 26 produces the spot 27 of UV light small enough to allow the desired object detail to be formed, and intense enough to cure the UV curable liquid being used quickly enough to be practical. The source 26 is arranged so it can be programmed to be turned off and on, and to move, such that the focused spot 27 moves across the surface 23 of the liquid 22. Thus, as the spot 27 moves, it cures the liquid 22 into a solid, and "draws" a solid pattern on the surface in much the same way a chart recorder or plotter uses a pen to draw a pattern on paper.

The light source 26 for the presently preferred embodiment of a stereolithography system is typically a helium-cadmium ultraviolet laser such as the Model 4240-N HeCd Multimode Laser, made by Liconix of Sunnyvale, Calif.

In the system of FIG. 12, means may be provided to keep the surface 23 at a constant level and to replenish this material after an object has been removed, so that the focus spot 27 will remain sharply in focus on a fixed focus plane, thus insuring maximum resolution in forming a layer along the working surface. In this regard, it is desired to shape the focal point to provide a region of high intensity right at the working surface 23, rapidly diverging to low intensity and thereby limiting the depth of the curing process to provide the thinnest appropriate cross-sectional laminae for the object being formed.

The elevator platform 29 is used to support and hold the object 30 being formed, and to move it up and down as required. Typically, after a layer is formed, the object 30 is moved beyond the level of the next layer to allow the liquid 22 to flow into the momentary void at surface 23 left where the solid was formed, and then it is moved back to the correct level for the next layer. The requirements for the elevator platform 29 are that it can be moved in a programmed fashion at appropriate speeds, with adequate precision, and that it is powerful enough to handle the weight of the object 30 being formed. In addition, a manual fine adjustment of the elevator platform position is useful during the set-up phase and when the object is being removed.

The elevator platform 29 can be mechanical, pneumatic, hydraulic, or electrical and may also use optical or electronic feedback to precisely control its position. The elevator platform 29 is typically fabricated of either glass or aluminum, but any material to which the cured plastic material will adhere is suitable.

A computer controlled pump (not shown) may be used to maintain a constant level of the liquid 22 at the working surface 23. Appropriate level detection system and feedback networks, well known in the art, can be used to drive a fluid pump or a liquid displacement device, such as a solid rod (not shown) which is moved out of the fluid medium as the elevator platform is moved further into the fluid medium, to offset changes in fluid volume and maintain constant fluid level at the surface 23. Alternatively, the source 26 can be moved relative to the sensed level 23 and automatically maintain sharp focus at the working surface 23. All of these alternatives can be readily achieved by appropriate data operating in conjunction with the computer control system 28.

After the three-dimensional object 30 has been formed, the elevator platform 29 is raised and the object is removed from the platform for post processing.

As will be apparent from FIG. 13 of the drawings, there is shown an alternate configuration of a stereolithography system wherein the UV curable liquid 22 or the like floats on a heavier UV transparent liquid 32 which is non-miscible and non-wetting with the curable liquid 22. By way of example, ethylene glycol or heavy water are suitable for the intermediate liquid layer 32. In the system of FIG. 12, the three-dimensional object 30 is pulled up from the liquid 22, rather than down and further into the liquid medium, as shown in the system of FIG. 11.

The UV light source 26 in FIG. 13 focuses the spot 27 at the interface between the liquid 22 and the non-miscible intermediate liquid layer 32, the UV radiation passing through a suitable UV transparent window 33, of quartz or the like, supported at the bottom of the container 21. The curable liquid 22 is provided in a very thin layer over the non-miscible layer 32 and thereby has the advantage of limiting layer thickness directly rather than relying solely upon adsorption and the like to limit the depth of curing since ideally an ultrathin lamina is to be provided. Hence, the region of formation will be more sharply defined and some surfaces will be formed smoother with the system of FIG. 5 than with that of FIG. 12. In addition, a smaller volume of curable liquid 22 is required, and the substitution of one curable material for another is easier.

The new and improved stereolithographic method and apparatus has many advantages over currently used methods for producing plastic objects. The method avoids the need of producing tooling drawings and tooling. The designer can work directly with the computer and a stereolithographic device, and when he is satisfied with the design as displayed on the output screen of the computer, he can fabricate a part for direct examination, information defining the object being specially processed to reduce curl and distortion, and increase resolution, strength and accuracy of reproduction. If the design has to be modified, it can be easily done through the computer, and then another part can be made to verify that the change was correct. If the design calls for several parts with interacting design parameters, the method becomes even more useful because all of the part designs can be quickly changed and made again so that the total assembly can be made and examined, repeatedly if necessary.

After the design is complete, part production can begin immediately, so that the weeks and months between design and production are avoided. Ultimate production rate and parts costs should be similar to current injection molding costs for short run production, with even lower labor costs than those associated with injection molding. Injection molding is economical only when large numbers of identical parts are required. Stereolithography is particularly useful for short run production because the need for tooling is eliminated and production set-up time is minimal. Likewise, design changes and custom parts are easily provided using the technique. Because of the ease of making parts, stereolithography can allow plastic parts to be used in many places where metal or other material parts are now used. Moreover, it allows plastic models of objects to be quickly and economically provided, prior to the decision to make more expensive metal or other material parts.

It will be apparent from the foregoing that, while a variety of stereolithographic systems have been disclosed for the practice of the present invention, they all have in common the concept of drawing upon a substantially two-dimensional surface and extracting a three-dimensional object from that surface.

The present invention satisfies a long existing need in the art for a CAD and CAM system capable of rapidly, reliably, accurately and economically designing and fabricating three-dimensional plastic parts and the like, and reducing stress and curl.

An embodiment of the multi-pass curl reduction technique described earlier will now be described. In this embodiment, a layer of liquid resin is incrementally cured to a particular depth through multiple passes of a UV laser beam over the resin such that the layer does not adhere to an adjacent already-cured layer below on the first pass. Instead, adhesion is achieved at a later pass, and in fact, additional passes after adhesion has been achieved are possible to achieve even more adhesion. For example, for a layer thickness of 20 mils, adhesion will be achieved when enough passes have been made to incrementally cure the layer down to slightly more than 20 mils. However, even after adhesion has been achieved, additional passes can be made to cause the layer to penetrate another 6 mils into the already-cured layer below to achieve even greater adhesion between the layers. As a result, a cure depth of 26 mils is achieved even though the layer thickness may only be 20 mils.

Multi-pass reduces curl in two ways. First, multi-pass cures a layer incrementally, and enables the top portions of a layer to cure without transmitting stress to previously cured layers. With reference to FIG. 14a, when layer 100 is cured in a single pass, the resin making up the layer will simultaneously shrink and adhere to layer 101, causing stress to be transmitted to this layer. The result is that, unless layer 101 is somehow anchored to resist the transmittal of stress, both layers will curl upwards as illustrated in FIG. 14b. If layer 100 were cured on multiple passes, on the other hand, it could be cured without transmitting a significant amount of stress to layer 101. With reference to FIG. 15a, through multi-pass, layer 100 could be cured almost to the point of adhering to layer 101, but separated from it by distance 102, which could be on the order of a few mils. Then, in a subsequent pass, the layers would be adhered to one another, but since the amount of resin which is cured on the final pass is small, there will be less shrinkage on the final pass compared with a single pass, and therefore less stress transmitted to the lower layer.

The second way multi-pass reduces curl is that when the adhesion pass is made, the resin being cured on the adhesion pass will be sandwiched in between a rigid already-cured layer below, and the rigid already-cured portion of the present layer above. With reference to FIG. 15b, the curing of this resin will simultaneously introduce stresses to both the upper and lower cured layers, which will tend to cancel each other out. For example, lower layer 101 will tend to bend upwards, while upper layer 100 will tend to bend downwards as indicated. The result is that these effects will tend to offset each other as the force tending to curl layer 101 upwards will be counter-balanced by the rigidity of the already-cured portion of layer 100, whereas the force tending to curl layer 100 downwards will be counter-balanced by the rigidity of lower layer 101.

A possible embodiment of multi-pass is to provide only two passes for a given layer, with adhesion (and possible over-curing to penetrate into the next layer for better adhesion) occurring on the second pass. In this embodiment, it is preferable to cure a layer on a first pass so it is as close as possible, i.e. within 1 mil, to the bottom layer, which layer is then adhered to the bottom layer on the second pass.

A preferred embodiment of multi-pass is to provide more than two passes, i.e. four or five passes, for a given layer, such that after the first pass, an incremental amount of the uncured gap between the layers is incrementally cured on subsequent passes until a gap of only about one mil or less remains. Then, in a subsequent pass, or passes, the remaining one mil gap is cured, and adherence is achieved.

In deciding whether to implement multi-pass with only two passes, or with more than two passes, it is important to consider the precision with which the cure depth for a given layer can be estimated and/or controlled. If the cure depth can only be estimated with a precision of two to three mils, for example, then in the two-pass embodiment, there is a danger that adherence will be achieved on the first pass, which would defeat the purposes of using multi-pass in the first instance, and would result in curl. Of course, there is a danger that in the preferred multi-pass embodiment described above, that adherence could be achieved before the desired pass (which desired pass may not be the final pass) because of the imprecision in estimating cure depth, but this is much less of a problem than in the two pass case, since in the pass during which adherence takes place, only a very small amount of resin will typically be cured, and only a very small amount of stress will therefore be transmitted to the lower layer. In the two pass case, on the other hand, in general, a large amount of liquid resin will be cured on the first pass, so that adherence during this pass can result in a large amount of curl since the stress transmitted to the lower layer depends on the amount of resin cured when adherence takes place. The reason why a lot of resin will be cured on the first pass in the two pass case is that, as discussed earlier, it is important in this embodiment to try to cure down to within a few mils of the layer below on the first pass, so that in the second pass, when adherence is achieved, only a small amount of resin will be cured. Therefore, on the first pass, a large volume of resin will typically be cured with the aim of curing to within a few mils of the lower layer. For a 20 mil layer thickness, this requires that the first pass penetrate approximately 18-19 mils towards the layer below, which represents a much larger volume of liquid resin.

In the preferred multiple pass embodiment, on the other hand, it is not necessary for the first pass to bring the layers to within a few mils of each other. Instead, a wider gap can be left after the first pass, and it will be left up to subsequent passes to bring the layers to within a few mils of each other, and ultimately adhere. Therefore, if adherence takes place at all before the desired pass, it will surely not take place on the first pass, when a large amount of liquid resin will be cured, but will only take place on a later pass when only a relatively small volume of liquid resin will be cured. Also, according to Beer's law (discussed below), much less penetration of the cure depth will typically be achieved on a subsequent pass compared to a first pass, even if the exposure of the UV laser is kept the same on each pass.

Imprecision in estimating cure depth is due to many sources. In general, the cure depth depends logarithmically on the exposure from the UV laser, which means that doubling or tripling the exposure will not double or triple the cure depth, but will increase it much less than this.

This relationship (between exposure and cure depth) can be described in the form of an equation known as Beer's Law, which is as follows: $I_z = I_o e^{-\alpha z}$ where $I_z$ is the intensity of the UV light at a distance Z into the liquid, $I_o$ is the intensity of the UV light at the liquid surface, $\alpha$ is a proportionality constant related to the absorption properties of the liquid, and Z is the distance into the liquid at which the intensity $I_z$ is determined. The absorption of polymerizinq radiation is approximately the same for both cured material and liquid. The point of maximum cure depth will be the point at which only enough energy of polymerizing radiation has been absorbed to cause sufficient cross-linking to occur for the material to reach its gel point. The intensity at a point in the resin multiplied by the time of exposure and multiplied by the number of passes yields the energy absorbed per unit area at that particular point. Therefore, in principle, the increase in cure depth for a given pass can be determined based on the accumulated intensity of the previous passes and the incremental intensity which will be applied on the given pass.

Due to several practical "real-world" considerations, however, the increase in cure depth may not follow Beer's Law exactly. First, due to an effect known as the "lensing effect," the estimated cure depth based on intensity expectations of Beer's Law in a multi-pass implementation may under-estimate the actual cure depth achieved by approximately two to three mils. The result is that adhesion may be achieved sooner than expected.

The lensing effect may occur because cured resin from previous pass may act as a lens, since the cured resin has a different index of refraction compared with the liquid resin. In a multi-pass implementation, during the intermediate passes, the laser beam will pass through the resin which has already been cured on previous passes, and the cured resin, as mentioned above, may act as a lens, and may focus the UV laser light, causing it to achieve a greater cure depth penetration than predicted using Beer's Law.

The lensing effect can be illustrated with respect to FIG. 16, in which, compared to previous Figures, like elements are identified with like reference numerals. FIG. 16a shows cured resin 103 produced by a single pass of the UV laser at a particular exposure. The cure depth achieved is identified as $T_1$.

FIG. 16b shows the cured resin produced by multiple passes of the UV laser beam, where the increase in the cure depth at each pass is identified with reference numerals 103a, 103b, 103c, and 103d, respectively. If it is assumed that the sum of the total energy applied at each pass equals the total energy applied in the single pass of FIG. 16a, based on Beer's Law, it would be expected that $T_2$ would equal $T_1$. However as illustrated, because of the lensing effect, $T_2$ may be greater than $T_1$ by an increment indicated as $T_3$, which will be on the order of 2-3 mils.

Another reason for imprecision is due to points at which vectors may overlap, or are very close together, so that when the vectors are drawn to yield a particular cure depth, the majority of the cured material is at the desired depth but at points of overlap or close proximity, the depth might be several mils deeper than expected.

A third reason for imprecision is variations in the intensity of the light produced by the laser, which, in turn, are caused by power fluctuations in the output of the laser.

For example, a laser presently used in the SLA-250, a commercial stereolithography apparatus manufactured by 3D Systems, Inc., has a continuous power output of approximately 20 mW. Because of power fluctuations, the laser output may be punctuated by 16-24 mW power bursts. In the SLA-250, the laser beam is directed to step across the surface of the liquid resin in incremental steps, and to then remain stationary for a given time period after each step. The exposure for the laser on an infinitesimal part of the liquid surface will be directly proportional to the laser output power multiplied by the step period divided by the step size. In other words, for a given laser output power, the exposure to the resin can be increased either by increasing the step period or decreasing the step size. Therefore, the fluctuations in laser output power will show up directly as fluctuations in exposure, with the result that the cure depth may vary by a few mils from what is expected because of these fluctuations.

In sum, the combined impact of the lensing effect, the overlapping vectors, and power fluctuations of the laser output result in imprecision in estimating cure depth, so that, as a practical matter, it is preferable to implement multi-pass with more than two passes.

Another possible embodiment of multi-pass is to keep the laser exposure on each pass uniform. In many instances, however, uniform exposure on each pass will not be possible because of the impact of Beer's Law, according to which uniform increments of exposure at each pass do not lead to uniform increments in cure depth. Instead, much more will be cured on the first pass than on subsequent passes. For example, it is entirely possible for a first pass to cure 90% of the layer thickness, for a second pass to cure 90% of the uncured gap which remains left over after the first pass, and for a third pass to cure 90% of the remaining uncured gap left over after the second pass, etc. The result is that with uniform exposure, a layer may adhere only after two passes, with each additional pass resulting in smaller increases in adherence between the layers. So, with uniform exposure, adhesion might be made after only the second pass but a large number of additional passes may be required to reach the desired layer to layer overlap. As a result, in general, an embodiment where non-uniform exposures are possible on the various passes will be preferable.

Several examples will now be provided showing the advantage of providing the option of non-uniform exposures on the various passes. These examples all assume that the desired layer thickness is 20 mils, that each layer is over cured so that it penetrates 6 mils an adjacent, lower layer, that a cure depth of 26 mils will be achieved through an accumulated exposure level of 1, and that the doubling of the exposure will result in a 4 mil incremental increase in the cure depth. Based on these assumptions, the following relationship between cure depth and exposure level results:

| Cure depth | Accumulated Exposure |
| --- | --- |
| 26 mils | 1 |
| 22 mils | ½ |
| 19.7 mils | ¼ |
| 18 mils | ⅛ |
| 14 mils | ⅛ |
| 10 mils | 1/16 |

In all the examples, it will be assumed that the accumulated exposure from all the passes will be 1, so that the cure depth, after all the passes have taken place, will be 26 mils. The number of passes, and the incremental exposure at each pass are the variables changed in the examples. Therefore, in the examples, exposure refers to the incremented exposure applied on a particular pass, not the accumulated exposure applied up to and including this pass.

The first set of examples are for a two-pass embodiment of multi-pass.

EXAMPLE 1

Two passes, uniform exposure

| pass | exposure | cure depth |
| --- | --- | --- |
| 1 | ½ | 22 mils |
| 2 | ½ | 26 mils |

Since this example (which shows a uniform exposure at each pass of ½) will achieve a cure depth of 22 mils on the first pass, which is greater than the layer thickness of 20 mils, it is not a preferable implementation of multi-pass because the layer will adhere on the first pass.

EXAMPLE 2

Two passes, non-uniform exposure

| pass | exposure | cure depth |
| --- | --- | --- |
| 1 | ⅛ | 18 mils |
| 2 | ⅜ | 8 mils |

Two passes, non-uniform exposure

Since the cure depth on the first pass is only 18 mils, this example is an acceptable implementation.

EXAMPLE 3

Two passes, non-uniform exposure

| pass | exposure | cure depth |
| --- | --- | --- |
| 1 | ⅛ | 14 mils |
| 2 | ⅞ | 12 mils |

Since the cure depth on the first pass is only 14 mils, this example is also an acceptable implementation.

A comparison of Examples 2.) and 3.) indicates that Example 2.) may be preferable since the top layer is cured closer to the bottom layer after the first pass, so that on the second pass, when adherence occurs, less resin will have to be cured.

The next set of examples are for three passes.

EXAMPLE 4

Three passes, uniform exposure

| pass | exposure | cure depth |
| --- | --- | --- |
| 1 | ⅜ | 19.7 mils |
| 2 | ⅜ | 23.7 mils |
| 3 | ⅜ | 26 mils |

As indicated, this example may not an acceptable implementation because adhesion occurs on the second pass, and in addition, due to the degree of imprecision involved, because some adhesion may, in all likelihood, occur on the first pass since the 19.7 mil cure depth is so close to the layer thickness of 20 mils. Since there is a significant danger that adhesion may occur on the first pass, when the amount of liquid resin which is cured is great, this example is not a preferred embodiment of multi-pass.

EXAMPLE 5

Three passes, non-uniform exposure

| pass | exposure | cure depth |
| --- | --- | --- |
| 1 | ⅜ | 18 mils |
| 2 | ⅜ | 22 mils |
| 3 | ⅜ | 26 mils |

In this example, since the cure depth after the second pass is 22 mils, adherence will occur on the second pass, which may not be acceptable if adherence is desired on the third pass. On the other hand, because the first pass achieved a cure depth of 18 mils, the amount of plastic being cured during the second pass is not great, so the cure introduced by adherence on the second pass is not likely to be dramatic.

EXAMPLE 6

Three passes, non-uniform exposure

| pass | exposure | cure depth |
| --- | --- | --- |
| 1 | ⅜ | 18 mils |
| 2 | ⅜ | 20.3 mils |
| 3 | 5/8 | 26 mils |

Since the cure depth after the second pass is 20.3 mils, there with probably be some adhesion after the second pass, although the amount of resin being cured on the second pass will be small since the first pass is estimated to have achieved a cure depth of 18 mils. In addition, because of the imprecision in estimating cure depth, it is possible that adherence will not occur at all on the second pass.

EXAMPLE 7

Three passes, non-uniform exposure

| pass | exposure | cure depth |
| --- | --- | --- |
| 1 | ⅜ | 18 mils |
| 2 | 1/16 | 19.3 mils |

-continued

| pass | exposure | cure depth |
| --- | --- | --- |
| 3 | 11/16 | 26 mils |

Since the cure depth after the second pass is only 19.3 mils, this example is an acceptable implementation, although there may be some adhesion after the second pass because of the imprecision of estimating cure depth. However, even if there were some adhesion on the second pass, the amount of resin being cured on the second pass will not be great, the first pass having already achieved a cure depth of 18 mils.

EXAMPLE 8

Three passes non-uniform exposure

| pass | exposure | cure depth |
| --- | --- | --- |
| 1 | 1/16 | 10 mils |
| 2 | 1/16 | 14 mils |
| 3 | 14/16 | 26 mils |

This example is an acceptable (although not optimal) implementation since the cure depth after the second pass is only 14 mils. However, a 6 mil thick volume of resin will have to be cured on the third pass when adhesion occurs, which can introduce a significant amount of curl. Therefore, Example 7.) is a preferable implementation, since much less resin will have to be cured on the third pass.

In sum, the above examples demonstrate that non-uniform exposure levels on the various passes is preferable to an implementation which requires uniform exposure levels on the various passes, since, in many instances, uniform exposures will result in adhesion too early. Also, the above examples were provided for illustrative purposes only, and are not intended to be limiting.

A consideration in choosing exposure levels for the multiple passes is to avoid downward curl, a problem that can occur on a given pass if the cure depth achieved in previous passes is so small, that the curing of the liquid resin that takes place on later passes will cause the resin cured on the previous passes to bend downwards. In fact, if downward bending is large enough, then adhesion to the lower layer can occur sooner than expected, which as described above, can introduce even more strain into the part by introducing upward curl of the bottom layer.

The amount of downward bending will be dependent on the amount of resin which is cured during the later passes, since the more resin which is cured on the later passes, the more stress which is transmitted to the resin cured by the earlier passes. However, particularly where multi-pass is implemented with more than two passes, the amount of resin cured during the later passes may be relatively small, so that the downward bending problem may be alleviated by this type of implementation.

The problem of downward bending can be illustrated with reference to FIG. 17a, in which compared with the previous Figures, like references numerals are used to identity like components.

As indicated, in a particular multi-pass implementation, bottom layer 101 is already cured, and layer 100 is being cured by multiple passes during which incremental amounts of liquid resin, identified by reference numerals 104a, 104b, and 104c, respectively, is cured. As shown, when resin 104c is cured, it shrinks and simultaneously adheres to cured resin 104b, transmitting stress and causing downward bending. As indicated, if the downward bending at the ends of the already-cured portion of the layer, identified by reference numerals 105 and 106 respectively, is great enough, the ends may touch the upper surface of layer 101, resulting in early adherence.

To alleviate this problem, two solutions are possible. One solution is to increase the thickness of the resin cured in the early passes, 104a and 104b, respectively, with respect to that cured during the later passes, 104c, or alternatively, to decrease the thickness of the resin cured during the later passes, 104c, compared with that cured during the early passes, 104a and 104b. This is illustrated in FIG. 17b, where, as before, compared with previous Figures, like components are identified with like reference numerals.

Another problem that can occur with multi-pass is birdnesting, which is a distortion that can occur if there are significant delays between the multiple passes. The problem occurs when resin cured on a particular pass is allowed to float for a long period of time on the surface of the liquid resin before additional passes adhere this cured resin to the layer below. If the delay is long enough, the cured resin floating on the surface of the resin can migrate about before it is adhered to the layer below. Birdnesting can also occur due to curl of floating resin cured in early passes from resin cured in later passes. Birdnesting will be discussed in more detail below in the discussion of a commercial embodiment of multi-pass known as REDRAW, but it should be noted that a possible solution to the birdnesting problem is to reduce as much as possible the delays between successive passes.

A fully-operational commercial version of REDRAW (which allows the specification of non-uniform exposure values for the multiple passes) is provided in the form of a computer listing in Version 2.62 of the software, which is attached as Appendix C. In addition, aspects of REDRAW are described in the SLA-1 Beta Release Software Manual, attached as Appendix B.

The REDRAW capabilities and functions reside in the BUILD program (a/k/a SUPER in other versions of the software) which programs are described in detail in co-pending U.S. patent application Ser. No. 182,830, filed Apr. 18, 1988, its co-pending continuation-in-part, U.S. patent application Ser. No. 269,801, and in its co-pending continuation, Ser. No. 331,644. Briefly, BUILD controls the laser movement through the use of two other programs, STEREO and LASER, and it obtains the parameters it needs to implement the numerous REDRAW functions based on information supplied in either 1.) a .PRM default parameter file in which a user can specify default REDRAW parameters; 2.) a .L layer control file in which a user can specify REDRAW parameters on a layer by layer, and vector type by vector type, basis; or 3.) a .R range control file in which a user can specify REDRAW parameters for a range of layers, and for vector types within a range. To implement the REDRAW functions, various command lines specifying REDRAW parameters are placed in any of these files similar to the way that other cure parameters are defined (as explained in the above co-pending applications).

The first place BUILD looks for REDRAW control parameters is the .L or .R file, not both. As indicated above, the .L file enables a user to specify REDRAW parameters with a high degree of control. With the .L file, a user can specify REDRAW parameters for a particular vector type within a layer of an object. For example, for a .L file consisting of merged data for four objects, which data can represent up to 11 different vector types, the .L file enables up to 44 different REDRAW parameters to be specified for each layer. In sum, the .L file provides layer by layer control of multi-pass.

The .R file is designed for those applications where the layer by layer control allowed by the .L file is not needed. Instead of providing layer by layer control, the .R file provides control on a range by range basis, where a range represents any number of adjacent layers.

The REDRAW parameters can be placed into the .R file using a user interface program known as PREPARE. To place the REDRAW parameters into the .L file, a standard word processor type line editor is used (this option is also available for the .R file, but it is not as convenient as using PREPARE).

If BUILD requires any REDRAW parameters which it is unable to obtain from either the .L or .R files, then it will seek them from the .PRM default parameter file. REDRAW parameters can be placed in these files by use of the PREPARE program.

The first REDRAW command is RC ##, where RC is a mnemonic for Redraw Count. This command specifies the number of passes that the laser beam will make over each vector of a particular vector type on a cross-section, i.e., the number of passes for a particular vector type on a layer. The number of passes specified can range from 1 to 10.

The second REDRAW command is RD #####, where RD is a mnemonic for Redraw Delay. This command specifies the length of time the laser will wait at the beginning of each pass. As mentioned earlier, the laser beam moves across the surface of the resin in steps followed by delays at each step. The delay at each step is known as the Step Period, which is identified with the mnemonic SP, and the command for specifying a particular value of SP is the command SP ####, where the value chosen is in units of 10 microseconds. The value of RD can be specified as any number in the range of 0 to 65,535, which number represents the delay in units which are multiples of the SP value. Thus, an RD of 10 represents a delay of ten times the value specified for SP. In general, the RD command is not used, and the standard value is 0. The RD command is similar to the JD command (which is a mnemonic that stands for Jump Delay).

Note that the JD and RD commands are both necessitated by the inability of the software running on the PROCESS computer (which software controls the rotation of the dynamic mirrors, and hence the movement of the laser beam across the liquid resin) to take account of the time it takes for the laser beam to jump from a first vector to another vector, after it has drawn the first vector. After the laser beam has been directed to sweep out a particular vector, the software will direct the beam to start drawing out another vector, perhaps beginning at a different location than the end of the previous vector, and will then simultaneously begin counting down the time for the laser to step through the vector as if the beam were instantaneously situated at the beginning of the next vector. In many instances, the PROCESS computer will begin the counting while the laser beam is still jumping to the beginning of the vector. When the laser finally gets to the right location, the PROCESS computer will immediately position the laser beam at the location it has counted down to, with the result that the first part of the vector may be skipped over and left uncured.

Figure 21A:
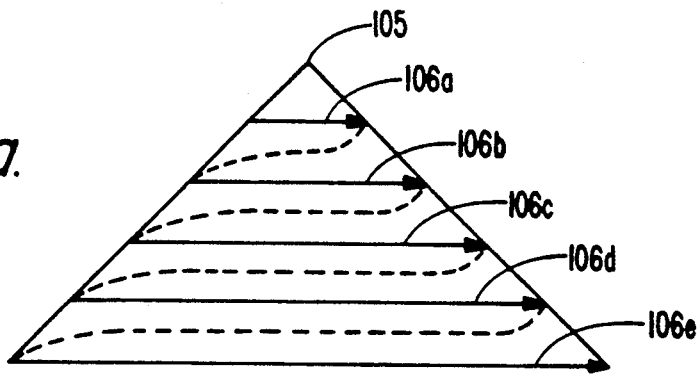
FIG. 21a illustrates vectors spanning a cross section of an object.
Figure 21B:
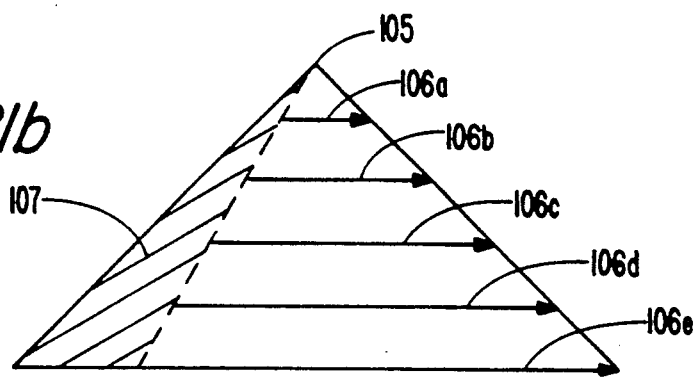

The effect can be illustrated with the help of FIGS. 21a and 21b. FIG. 21b illustrates cross-section 105 of an object, and associated vectors 106a, 106b, 106c, 106d, and 106e spanning the surface of the cross-section, which vectors represent the movement of the laser beam as it cures the liquid plastic that forms the cross-section. The dotted lines between the head and tails of successive vectors is the movement of the laser as it jumps from one vector to another, and it is the jumping time for these jumps that cause the problem mentioned above.

The effect of the jumping time is illustrated in FIG. 21b, in which like elements are identified with like reference numerals compared with FIG. 21a. The jumping time results in an area, identified with reference numeral 107 in FIG. 21b, which is left uncured.

The use of JD and RD is designed to get around this problem. The delay specified by these commands is the time the PROCESS computer is directed to wait, after it has cured a particular vector, before it begins stepping through the next vector. In the context of REDRAW, RD is the time the PROCESS computer is directed to wait after it has completed a pass over a particular area, before it begins a next pass over that area. By causing the PROCESS computer to wait, the stepping through can be delayed until the laser beam is positioned properly.

Figure 21C:
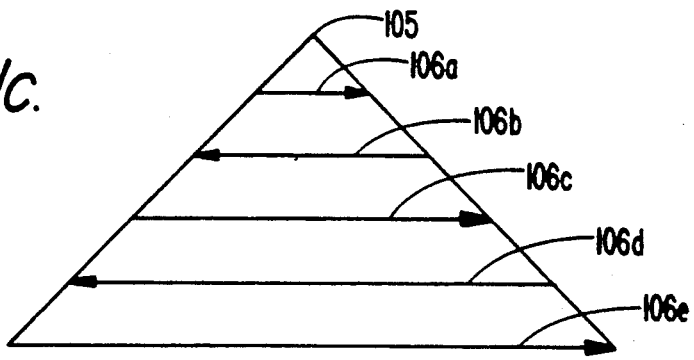
FIG. 21c illustrates the use of the zig-zag technique to alleviate the problem of FIG. 21b.

As mentioned earlier, JD and RD are rarely used, and one reason for this is illustrated in FIG. 21c. FIG. 21c illustrates a technique known as the "zig-zag" technique which is now implemented in the software to reduce the travel distance and hence jumping time between successive vectors. As illustrated, successive vectors 106a, 106b, 106c, 106d, and 106e, instead of all pointing in the same direction as indicated in FIGS. 21a and 21b, are caused to alternate directions, as illustrated in FIG. 21c. The direction of these vectors indicates the movement of the laser beam on the surface of the resin as it traces out these vectors. The result is that jumping time is dramatically reduced, making it frequently unnecessary to use the JD command.

The third REDRAW command is RS #####, where RS is the mnemonic for Redraw Size. It was recognized early on that a problem with some forms of multi-pass was birdnesting, and to alleviate this problem, the RS command was added to enable blocks of vectors in a given cross-section to be broken up into smaller sub-blocks so that multi-pass could be performed on each sub-block before proceeding on to the next sub-block. By choosing an appropriate size for the sub-block, cured resin from the early passes can more rapidly be adhered to the layer below than if the entire vector was drawn before continuing on to additional passes. The RS command specifies the total vector length to be contained in a sub-block into which the vector block of the cross-section is divided. The total vector length specified in a sub-block may be such that it contains many vectors or just a small portion of a single vector.

As discussed earlier, the laser beam moves in steps, and the step size is identified by the mnemonic SS. The command for specifying the step size is SS ##, where the number specified can range from 0 to 65,535 bits, where a bit represents approximately 0.3 mil (the actual tranlation is 3,560 bits per inch). AS a result, a particular pass can proceed over a distance which can range from a minimum of approximately 0.3 mils to a maximum of approximately 20 inches or greater.

The units of RS are multiples of SS. For example, an SS of 2, and an RS of 1,000, indicates that each pass will draw 2,000 bits of vector information before jumping back to make additional passes. Alternatively, with an SS of 8, and an RS of 1,000, then 8,000 bits of vector information will be drawn before beginning another pass.

The last REDRAW command is a command for providing a different laser exposure value for each pass. This is accomplished by specifying a different SP value for each pass, since as indicated earlier, the exposure is directly proportional to SP. The format of the command is SP ####, ####, #### . . . depending on the number of passes. The value of SP is in units of 10 and in addition, each SP can range in value from approximately 5-15 to approximately 4,000-6,500.

As mentioned earlier, for a given layer of an object, different REDRAW parameters can be specified for each vector type in that layer using the .L file. In addition, all the REDRAW commands will be completed for a particular vector type, before REDRAW commands for the next vector type are expected.

A typical command line in the .L file might appear as follows: 920, LB1, "RC 3; RD 0; RS 1,000; SP 250, 150, 1,000; SS 2." This command indicates that at the layer of a first object located 920 vertical bits from the bottom, that for the layer boundary vectors for that object, identified by the mnemonic LB1, 3 passes will be performed for each boundary vector (indicated by the REDRAW command RC 3), each pass will draw 2,000 bits of a boundary vector (indicated by the commands SS 2 and RS 1,000) before proceeding on to the next pass, and the SP values for the first, second, and third passes, respectively, will be 250, 150, and 1,000.

A typical command in a .R file might appear as follows: LB1, "RC 3; RD 0; RS 1,000; SP 250, 150, 1,000; SS 2" which command is identical to that specified above for the .L file, except that no layer specification is provided, since this command will apply to all layers within a specified range. A command in the .PRM default parameter would look similar to this.

A sample report showing the format of the .L file is shown in FIG. 18. As illustrated, only vectors for a first object are represented, and REDRAW commands can be specified for each vector type within a layer of that object. The vector types and their associated mnemonics are as follows:

LB: layer boundary
LH: layer crosshatch
NFDB: near-flat down-facing skin boundary
NFDH: near-flat down-facing skin cross hatch
NFUB: near-flat up-facing skin boundary
FBDB: flat down-facing skin boundary
FDF: flat down-facing skin fill
NFDF: near flat down-facing skin fill
NFUF: near flat up-facing skin fill
FUB: flat up-facing skin boundary
FUF: flat up-facing skin fill The various vector types are described in more detail in Ser. No. 182,830, its co-pending CIP, Ser. No. 269,801, and its copending continuation, Lyon & Lyon Dkt. No. 186/195. Briefly, boundary vectors are used to trace the perimeter of each layer, cross hatch vectors are used to trace the internal portion of each layer surrounded by the layer boundary, and skill fill vectors are used to trace any outward surfaces of the object. They are traced in the following order: boundary, crosshatch, and skin.

FIG. 19 is a sample report showing the format of the .R file. As indicated, the format is similar to that for the .L file, except that the specifiction of REDRAW parameters is only possible for a particular vector type within a range of layers.

In FIG. 19, the REDRAW commands for a particular range are framed by the mnemonics #TOP and #BTM, and in addition, the range of layers to which the REDRAW commands apply are provided in the line above the #TOP mnemonic. The format for the range is as follows: R1, R2, V, Z, where R1 indicates the beginning of the range, R2 indicates the end of the range, V indicates the number of vertical bits per layer, and Z indicates the desired cure depth that will be assumed by PREPARE when using the PREPARE program.

For the first block of REDRAW commands in FIG. 19, the range specified is 920, 920, which indicates that the range specified for the first block of REDRAW commands is the one layer located at 920 SLICE units from the bottom (assuming CAD/CAM units of inches, and a desired resolution of 1,000, the SLICE units will be mils. The difference between the CAD/CAM and SLICE reference scales is described in more detail in Ser. No. 182,830, its CIP Ser. No. 269,801, and its continuation, Lyon & Lyon Dkt. No. 186/195). This is because the beginning and ending points of the range are identical: 920 mils. The ending point of the range could just as well have been specified as any other value in the CAD/CAM reference scale, in which case, the block of commands would apply to all layers in the specified range. Note also that the layer thickness specified for the cross-section for the first block of REDRAW commands is 20 mils. These numbers are in units of mils since the line before R1 indicates that 20 bits corresponds to 0.508 mm.

FIGS. 20a and 20b illustrate default parameters listed in a .PRM file, which parameters will be used if they are not specified in either the .L or .R files. As indicated, default parameters can be specified for each object (assuming more than one object is being built at the same time), and for each object, can be further specified for each vector type within any layer of that object. For example, the default parameters specified for the layer boundary vectors of the first object are as follows: LB1, "RD 1; RS 300; RC 1; SP 20; JD 0; SS 8." This command line is interpreted as follows: the default value for Redraw Delay is 1 (representing 200 μs given the default SP value of 20), for Redraw Size is 300 (representing 2,400 bits or approximately 720 mils, given the default SS of 8), for Redraw Count is 1 (indicating single pass, i.e., layer boundary vectors are not to be multi-passed), for Step Period is 20 (representing 200 μs), for Jump Delay is 0 (indicating this command is not being used), and for Step Size is 8 (representing 8 bits or approximately 2.4 mils). Since the default value for RC is 1, this indicates that unless multi-pass is specified in either the .L or .R files for the layer boundary vectors, it will not be provided for these vectors.

As is evident from the above description, the commercial embodiment of REDRAW utilizes a technique known as the "short vector" technique, whereby any vector length can be divided up into a sequence of mini-vector lengths, where the entire vector length is multi-passed by successively multi-passing each of the mini-vector lengths. The objective of the short vector technique is to eliminate the problem of birdnesting, a problem which could occur if multi-passing were attempted on the full length of vectors in a block as a whole, before beginning passes to initiate adhesion. In this instance, the plastic cured during the early passes may be floating quite awhile on the surface of the liquid resin before they would be adhered to the lower layer through curing from subsequent, additional passes. As a result, this cured plastic can move before it is finally adhered to the layer below, a problem which can manifest itself as a distortion in the final part, which distortion resembles a birdnest, and hence is called birdnesting.

It has been found that if the short mini-vector lengths are made too small, that another problem crops up, which is the downward bending or bowed down effect, discussed earlier with reference to FIGS. 17a and 17b, according to which the cured plastic from the early passes is caused to bow downwards from the shrinkage of the plastic below it cured during the later passes. As a result of this effect, adherence takes place too early, and upward curl then results. The problem manifests itself in the form of a scalloped appearance of the surface of the part.

Several approaches are possible to alleviate the birdnesting and bowed down effects mentioned above. First, boundary vectors are the only vectors where birdnesting may result from their being drawn through multiple passes since they are the vectors which form the surface of the part. Hatch vectors, on the other hand, are not generally visible from outside the surfaces of a part and if they birdnest slightly, it is not noticeable. Skin and near-flat skin vectors also are typically drawn after the border and hatch vectors are drawn, and may adhere to the cured plastic from these vectors when they are drawn. In addition, the spacing between these vectors is typically very small (approximately 1-4 mils, compared to a spacing of approximately 30-100 mils for hatch vectors), so that adherence will also take place with cured plastic from adjacent skin and near flat skin vectors.

Thus, one solution to the birdnesting problem is to only multi-pass the hatch vectors, and not the border vectors. Since boundary and hatch vectors form the bulk of the superstructure of most parts and most curl comes from hatch vectors, multi-passing the hatch vectors goes a long way to reducing curl. Flat skin and near-flat skin vectors are not generally multi-passed, but it is possible. All the hatch vectors could be multi-passed, or alternatively, only a percentage of the hatch vectors could be multi-passed. Even if the hatch vectors did have a bowed down appearance from the multi-passing, this would not affect the outer appearance of the part. This solution is feasible in the commercial embodiment of REDRAW described above, since the use of the .L, .R, or .PRM files all allow multi-pass to be implemented only for selected vector types. Thus, REDRAW could only be provided for the hatch vectors if desired.

Another solution is to multi-pass all vector types, but to use other techniques such as Web Supports or Smalley's to eliminate birdnesting. Web Supports are described in more detail in U.S. patent application Ser. No. 182,801, filed Apr. 18, 1988, which, as indicated at the outset, is hereby incorporated by reference as though set forth in full herein. Smalley's are described in more detail in U.S. patent application 183,015, filed Apr. 18, 1988, which, as indicated at the outset, is hereby fully incorporated by reference as though set forth in full herein.

A third solution is to use a two pass implementation of multi-pass so that the cured plastic from the first pass will be adhered on the second pass, and will therefore only be floating for a short while. The disadvantage is that as mentioned earlier, more than two passes is beneficial for dealing with the imprecision in estimating cure depth. This disadvantage could be alleviated by only two pass multi-passing the border vectors (where bird-nesting is a problem), but multi-passing with more than two passes for the remainder of the vectors.

A fourth possible solution is to isolate the use of multi-pass to those areas of the part having critical volume features, that is areas that are most susceptible to distortion, such as cantilevered sections of a part.

An important aspect of the commercial embodiment of REDRAW in version 2.62 of the software is the ability to specify different SP values (and hence different exposures) for different passes. As discussed earlier, it is frequently necessary to specify different exposure values for the different passes in order to prevent adhesion from occurring earlier than desired. Preferably, the SP values should be chosen so that on the first pass, a large percentage of the gap between layers is cured, leaving an uncured area which is cured on successive passes, and which area has a thickness in the range of only 1-5 mils depending on the layer thickness and tolerances possible. The preferred size of the gap will depend on the layer thickness as follows:

| Layer thickness | Uncured gap |
| --- | --- |
| 20 mils | 1-5 mils |
| 10 mils | 1-3 mils |
| 5 mils | 1-2 mils |

As can be seen, the size of the uncured gap remaining after the first pass can increase with the layer thickness. This is because the greater the layer thickness, the more plastic that will be cured on the first pass, which plastic will be less susceptible to downward bending from the shrinking of the plastic in the uncured gap as it is cured.

After the first pass, the SP for the remaining passes should preferably be chosen to effectuate a 1-2 mil increase in cure depth per pass. As a result, during the pass when adherence takes place, only a very small amount of plastic will be cured, with the result that the stress introduced by the shrinkage of the plastic during this pass will be minimal, stress which would otherwise be transmitted to the cured portion of the layer above, and to the cured layer below.

Figure 22A:
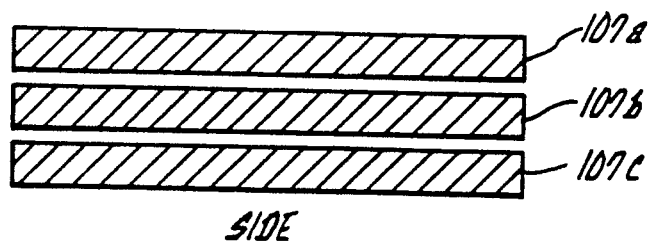
FIG. 22a shows a side view of stacked lines from different layers.

Several examples of the dashed line, bent line, and secondary structure techniques will now be described. FIGS. 22a-22f illustrate an example which combines the technique of using secondary structures and rivets to connect rails. In all these Figures, like components are identified with like reference numerals. FIG. 22a shows a side view of layers 107a, 107b, and 107c, which are shown stacked on top of each other. As shown, the layers have been cured in isolation from each other in order to reduce curl by eliminating the ability of the layers to transmit stress to one another while they are being cured. As indicated, though, a problem with curing the layers in isolation from one another is that the final part will be very weak, as there is nothing holding the layers together. As a result, a secondary structure must be added to connect to the layers.

Figure 22B:
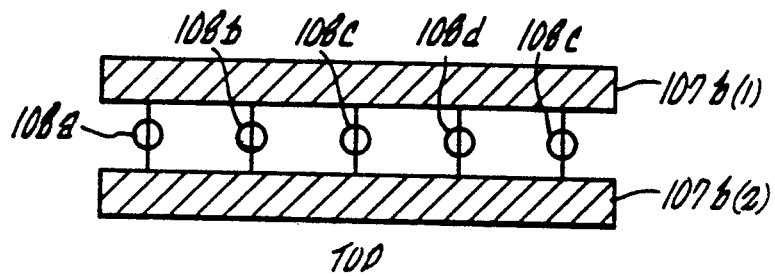
FIG. 22b illustrates the use of a riveted secondary structure to attach adjacent lines of a particular layer.

Each layer in FIG. 22a is actually comprised of two lines in parallel, and a top view of a layer is illustrated in FIG. 22b, which shows layer 107b as consisting of lines 107b(1) and 107b(2) in parallel. As shown, the lines for a given layer have also been cured in isolation from each other to reduce curl, and they must also be connected by some form of secondary structure in order to provide structural integrity to the part.

Figure 22C:
FIG. 22c illustrates a side view of the riveted secondary structure of FIG. 22b.

FIG. 22b is a top view of layer 107b, which illustrates secondary structure 108a, 108b, 108c, 108d, and 108e, for connecting the lines of a particular layer, in this case, lines 107b(1) and 107b(2) of layer 107b. In addition, as will be seen, the secondary structure also connects the lines of adjacent layers together, in this case, lines 107b(1) and 107b(2) are respectively connected to lines 107c(1) and 107c(2) by the secondary structure. This is illustrated in FIG. 22c, which shows a side view of the lines of layer 107b stacked on top of the lines for layer 107c, and connected by secondary structure 108a, 108b, 108c, 108d, and 108e.

Figure 22D:
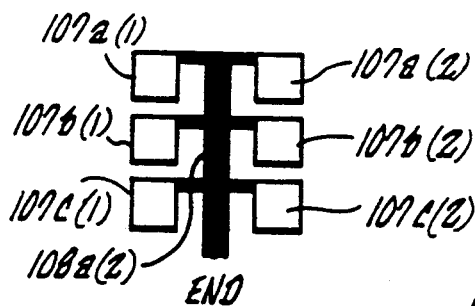
FIG. 22d illustrates the use of rivets to attach the secondary structures from adjacent stacked layers.
Figure 22E:
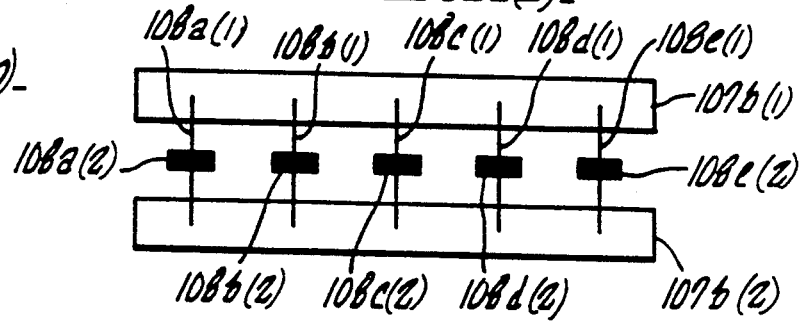
FIG. 22e illustrates a top view of the riveted secondary structure of FIG. 22b.

The secondary structure has two aspects to it, and comprises supporting lines of lower exposure and an area of higher exposure known as rivets for connecting support lines from adjacent layers together. This is illustrated in FIGS. 22d and 22e. As indicated in FIG. 22e, the secondary structure for layer 107b comprises, in part, connecting support lines 108a(1), 108b(1) 108c(1), 108d(1) and 108e(1) of lower exposure than required to cause layer to layer adhesion. In addition, the support lines are used to connect the lines making up a layer, in this case lines 107b(1) and 107b(2) of layer 107b. Also, the secondary structure is comprised, in part, of areas of higher exposure known as rivets. In FIG. 22e, these are identified as 108a(2), 108b(2), 108c(2), 108d(2), and 108e(2), respectively, which rivets are areas of heavier exposure than either the support lines or the lines making up a layer, the result of which is that the rivets have a cure depth which penetrates down to and adheres to the support lines of an adjacent layer. This is illustrated in FIG. 22d, which shows the rivets connecting the support lines for layers 107b and 107c.

Figure 23A:
FIG. 23a illustrates rivets, where the diameter of the rivets is much smaller than the width of the lines.
Figure 23B:
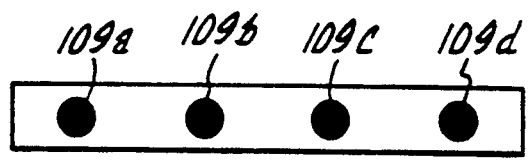
Figure 23C:
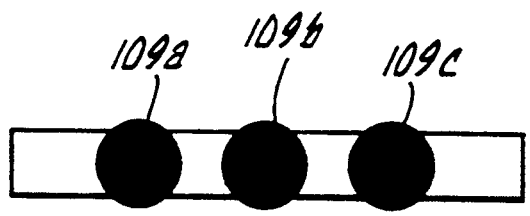
FIG. 23c illustrates rivets, where the diameter of the rivets is larger than the width of the lines.

An important aspect of rivets is illustrated in FIGS. 23a-23c, in which like components are indicated with like reference numerals. If lines on different layers are connected by rivets, then, in certain instances, it may be important to keep the diameter of the rivets smaller than the width of the lines. This, in turn, may be accomplished by keeping the exposure used to create the rivets low enough so that this condition does not occur. FIG. 23a illustrates a line with rivets 109a, 109b, and 109c, where the diameter of the rivets is line where the diameter of the rivets is larger than those in FIG. 23a. FIG. 23c illustrates a line where the diameter of the rivets is even larger than the width of the line.

Keeping the diameter of the rivets smaller than the width of the lines is only important when the lines form the outer surface of a layer of the part. In this instance, it is important to keep the rivet diameter smaller than the line width so that the outward surface of the part remains smooth. If the lines being riveted are support lines in the interior of the object, it may not be necessary to keep the diameter of the rivets smaller than the width of the lines. In fact, in this instance, as illustrated in FIGS. 22b and 22e, the diameter of the rivets can be greater than the width of the support lines.

This aspect of rivets is illustrated in more detail in FIGS. 24a-24d, in which like components are identified with like reference numerals.

Figure 24A:
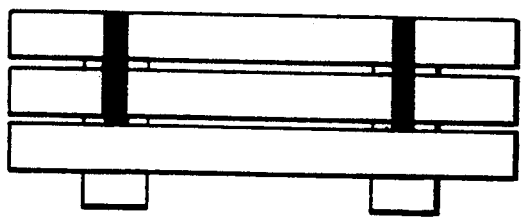
FIG. 24a is a side view of stacked lines connected by rivets.

FIG. 24a illustrates a part comprising layers 107a, 107b, and 107c respectively, which layers are connected to adjacent layers by means of rivets 109a(2) and 109b(2) (for connecting layer 107a to 107b), and by means of rivets 108a(2) and 108b(2) (for connecting layer 107b to 107c).

Figure 24B:
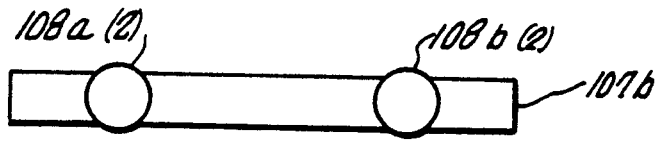
FIG. 24b is a top view of oversized rivets.

A top view of rivets 108a(2) and 108b(2) is illustrated in FIG. 24b. If line 107b makes up the outer surface of the finished part, then if the diameter of the rivets is greater than the width of the line, a rough outer surface will be introduced.

Figure 24C:
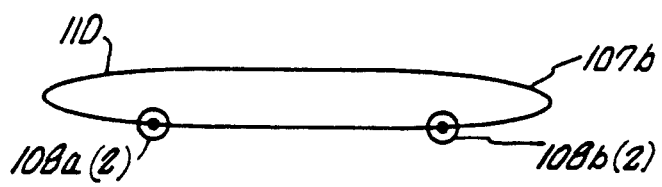
FIG. 24c is a top view of offset rivets.
Figure 24D:
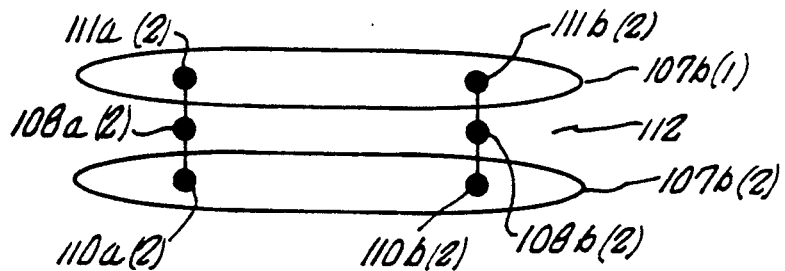
FIG. 24d is a top view of rivets used to connect stacked support lines.

Three techniques are possible for alleviating this problem. One technique mentioned earlier is simply to reduce the size of the diameter of the rivets. A second technique, illustrated in FIG. 24c, is to offset the rivets from the surface 110 of the line forming the outer surface of the finished part so that the rivets do not extend beyond the plane of the surface. A third technique, illustrated in FIG. 24d, and which is discussed in detail above, is to introduce support lines, and then rivet only the support lines together. In fact, the above techniques can be combined. FIG. 24d shows lines 107b(1) and 107b(2) connected by lower exposure support lines, which support lines are connected to support lines of adjacent layers by rivets 108a(2) and 108b(2). In addition, line 107b(1) is connected to a line of an adjacent layer by means of rivets 111a(2) and 111b(2), and line 107b(2) is connected to a line of an adjacent layer by means of rivets 110a(2) and 110b(2). If either of these lines forms the outer surface of the part, then as discussed above, the diameter of the rivets cannot be too large, or if it is, the rivets must be offset towards the interior of the part so they do not extend beyond the plane of the outer surface of the part.

Note that in FIG. 24d, parts have been successfully built where the distance 112 between lines on the same layer is in the range of 40 to 300 mils, and in addition, where lines on successive, adjacent layers are also separated by this distance. However, other examples are possible, either by separating the lines by more or less than this range, and the above range is provided for illustrative purposes only, and is not intended to be limiting.

Figure 25A:
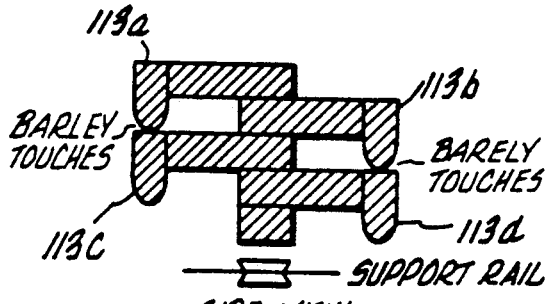
FIG. 25a illustrates a side view of secondary structure used to connect adjacent lines; showing rivets used to connect stacked secondary structure.
Figure 25B:
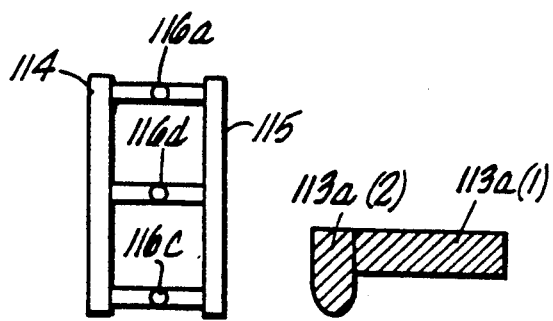
FIG. 25c is a side view of the secondary structure and rivets of FIG. 25b.
Figure 25C:
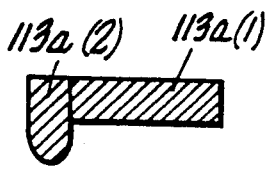

FIGS. 25a-25c illustrate another example of using a secondary structure to connect lines. In these Figures, like components are identified with like reference numerals. As shown in FIG. 25a, successive structures 113a, 113b, 113c, and 113d are drawn, wherein each structure, as illustrated in FIG. 25c, has a portion 113a(1) made with relatively low exposure, and another portion 113a(2) made with higher exposure. Moreover, as illustrated in FIG. 25a, the exposure chosen to make the higher exposure portion should be such that successively stacked high exposure portions, 113a(2) and 113c(2) in the Figure, barely touch. In fact, successful parts have been made using this technique where successive high exposure portions are within 40-300 mils of each other, but this range is provided for illustrative purposes only, and is not intended to be limiting.

Note that lower exposure portions from successive layers, 113a(1) and 113b(1) in the Figure, overlap, and it is necessary to rivet these overlapping portions together so that successive layers adhere to one another. This is illustrated in FIG. 25b, which shows rivets 116a, 116b, and 116c holding together overlapping lower exposure portions from successive layers, 113a(1) and 113b(1) in the Figure. Note that the outer surfaces 114 and 115 of the part are formed from the stacking of the higher exposed portions from successive layers, surface 114 being made up, in part, of stacked portions 113a and 113c, and surface 115 being made up, in part, of stacked portions 113b and 113d.

Note that all the curl reduction techniques described above reduce curl through one of three ways: 1.) reducing stress; 2.) resisting stress; and 3.) relieving stress. An example of 1.) is multi-pass where successive layers are cured through multiple passes so that when they do adhere, only a small amount of stress will be transmitted to adjacent layers. An example of 2.) is the multi-pass technique whereby as much of a layer as possible is cured on the first pass, so that this portion of the layer will be strong to both resist downward curling, and to resist the layer below from upward curling. An example of 3.) is dashed or bent lines, where stress is actually transmitted from one layer to another, but breaks or bends act to relieve the stress.

The appropriate curl reduction technique for a given application will involve a trade-off between structural strength and curl. In general, the higher the structural strength required for a particular application, the more curl.

FIGS. 26a-26c illustrate a part made with different curl reduction techniques. FIG. 26a shows the part made with dashed lines, FIG. 26b shows bent lines, and FIG. 26c shows a part made using the secondary structure technique described above with respect to FIGS. 25a-25c. With respect to FIG. 26a, parts have been successfully built where the length of the solid portions of a line, identified with reference numeral 117a in the Figure, range from 40 to 300 mils, and where the breaks between the successive solid portions, identified with reference numeral 117b in the Figure, were in the range of 5 to 50 mils. However, these ranges are illustrative only, and are not meant to be limiting.

With respect to FIG. 26b, parts have been successfully made with bent lines, where the solid portion of a line, identified with reference numeral 108a in the Figure, is in the range of 20-300 mils, and in addition, where the gaps in the line between the solid portions, identified with reference numeral 118b in the Figure, is also in this range. Again, this range is intended to be illustrative, and not limiting.

With respect to FIG. 26c, parts have been successfully built where the distance between parallel lines of a particular layer, identified with reference numeral 119 in the Figure, is in the range of 40-300 mils. The above range is provided for illustrative purposes only, and other examples are possible.

A problem with the dashed line technique is that because of the breaks in a line, a bad part surface finish may result, and in addition, the parts may be flimsy. Three variants of the techniques are available to alleviate these problems, which variants are illustrated in FIGS. 27a-27e, in which like components are identified with like reference numerals.

The first variant, the "brick and mortar" variant, is illustrated in FIG. 27a. According to this variant, the solid portions of a dashed line are analogized to bricks, and the breaks between successive bricks are filled in with liquid resin analogized to mortar, which is then cured with less exposure than the bricks. A problem with this variant is that if the mortar is subsequently exposed at the same level as the bricks to improve strength, curl will be reintroduced.

The second variant is illustrated in FIG. 27b, in which a dashed line is placed on a solid line. FIG. 27b shows the order in which the indicated portions are successively cured. As indicated, the solid layer is drawn, and then on top of it are drawn spaced bricks, and then the interstices between the bricks are filled with mortar, which interstices are then cured, preferably at a lower exposure than the bricks. An advantage of curing the bricks on top of the solid layer is so that the solid layer will be strong to resist upward curl.

The third variant is illustrated in FIG. 27c, which variant is to offset a dashed line placed over another dashed line so that the solid portions of one line span the breaks in the second line. FIG. 27c shows the order in which the indicated portions are cured. As indicated, bricks are drawn on one layer, and then on the next layer, bricks are also drawn, but offset from those on the first layer, so that the bricks on the second layer span the interstices between the bricks on the first layer. A problem with this technique is that it results in almost as much curl as if standard solid lines were drawn.

Other variations of the dashed line technique are illustrated in FIGS. 27d and 27e, where the numerals indicate the order of drawing the indicated solid portions. FIG. 27d shows placing a first dashed line on a solid line, and a second offset dashed line placed on the first dashed line. FIG. 27e shows placing several dashed lines on a solid line which are lined up, and then offsetting successive dashed lines.

Figure 28G:
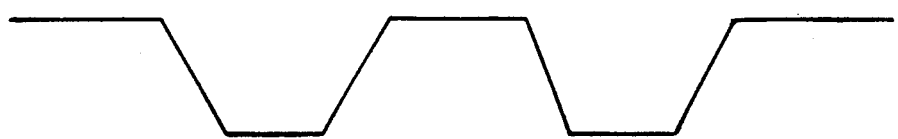
FIG. 28g shows a third variant of the bent line technique.

The bent line technique illustrated in general in FIG. 26b, and variants on this technique are illustrated in FIGS. 28a-28i. As indicated in FIG. 28a, the basic idea of the bent line technique is to relieve the stress transmitted to a given layer from adjacent layers. With respect to FIG. 28a, stress introduced to portions 118a and 118b of line 118, are taken up by lateral movement of these portions into gap 118c. This is because something must give to relieve the stress, and in the example of FIG. 28a, what gives is the portions 118a and 118b, which are allowed to move laterally into gap 118c.

Parts have been successfully built with the dimensions indicated in FIG. 28b, that is with the solid portions of a line in the range of 20-300 mils, and the gaps between the solid portions in the range of 5-50 mils. Other examples are possible, and the indicated ranges are intended to be illustrative only, and not limiting. The size of the gaps should preferably be as small as possible, but as a practical matter, the size of the gaps depends on the tolerances possible, because it is crucial that successive solid portions do not touch. In the example of FIG. 28a, it is crucial that gap 118c is not so small that solid portions 118a and 118b touch. If they touch, then curl will result. Therefore, the lower the possible tolerances, the greater should be the gaps between successive solid portions of a bent line. Successful parts have been built with the gaps in the range of 5-50 mils, but smaller gaps are possible. FIG. 28c shows an example of a bent line where the gaps are much smaller than the length of the solid portions.

A benefit of the bent line technique compared with the dashed line technique, is that bent lines can be much stronger than dashed lines, and in addition, their stress resistance can be much greater after a part is built using bent lines.

FIG. 28d shows a variant of a bent line where the bends in the line have a triangular shape. Parts have been successfully built with each triangular bend on the order of 100-250 mils (1/10-¼ inch) in length. In addition, the angle of the vertex of each triangular bend, although indicated at 90° in FIG. 28d, can vary from this. In fact, if made smaller than this, the resulting line will resemble that in FIG. 28c, and even more of the curl can be eliminated. If the angle is made greater than this, the bent line will resemble a straight line, and the curl effect may be more pronounced.

Another variant of a bent line is illustrated in FIGS. 28e and 28f. As indicated in FIG. 28e, parts have been successfully built using bent lines where the bends in the line have an inverted triangular shape as illustrated, and where each bend has the dimensions indicated in FIG. 28f, that is, a width of 125 mils (150 inch), with the gaps between successive solid portions 40 mils or smaller, and with the angles of each triangular bend at 45°, 45°, and 90°, respectively. As before, it is crucial that successive solid portions of a bent line do not touch. Otherwise, curl will be introduced. Therefore, in FIG. 28e, the gaps in the line should be kept as small as possible as long as successive solid portions do not touch. FIG. 28g shows another variant of a bent line technique where the bends have a trapezoidal shape. Other examples are possible, and the examples above are intended to be illustrative only, and are not intended to be limiting.

Figure 28H:
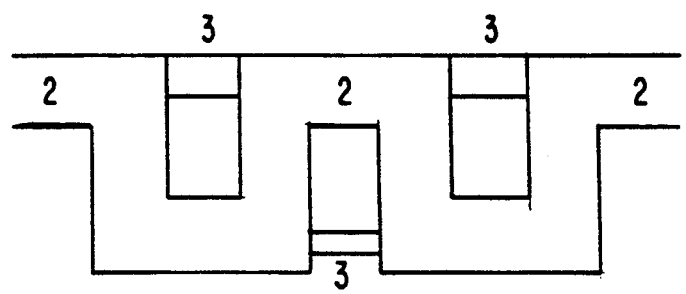
FIG. 28h shows a bricks and mortar variant of the bent line technique.

As with dashed lines, a part built with bent lines may have a poor surface finish. To get around this problem, a bricks and motar variant of bent lines is possible whereby the gaps in the bent lines are filled with liquid resin and thereafter partially exposed. As before with the dashed line, if this resin is cured to the same exposure as the rest of the line, the curl effect will be introduced. FIG. 28h illustrates the technique of filling in the gaps in the line with liquid resin and then partially exposing the resin in the gaps. The numbers indicate the order in which the portions shown are cured.

Figure 28I:
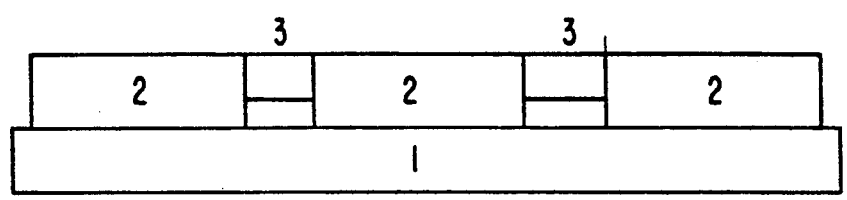
FIG. 28i shows the cure sequence for the variant of FIG. 28h.

Another variant is to place a bent line on a solid line as indicated in FIG. 28i, which has the advantage that the solid line drawn first resists upward curl. In addition, to improve the surface appearance, as in FIG. 28h, the gaps in the bent line are filled in with resin and partially exposed. The order in which the curing takes place is indicated by the numerals in the Figure.

Figure 28J:
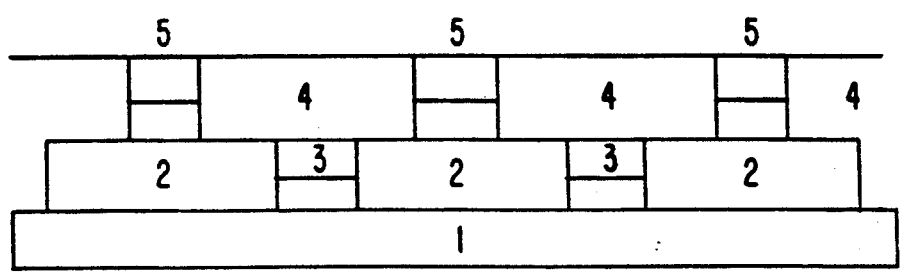
FIG. 28j shows the cure sequence for another bricks and mortar variant of the bent line technique.

FIG. 28j illustrates another variant where a first bent line is placed on a solid line, and a second bent line is placed on the first bent line but offset from the first bent line so that the solid portions of the second bent line span the gaps in the first bent line. The numerals indicate the order in which the portions indicated in the Figure are cured.

Implementations of the rivet technique for reducing curl will now be described. An early implementation of rivets was in the form of programs written in the Basic Programming Language which programs provided for layers of a part to be directly scanned by a laser beam without the intermediate step of reformatting the data describing the layers into vectors as described in Ser. No. 182,830, its CIP, Ser. No. 269,801, and its continuation, Lyon & Lyon Dkt. No. 186/195. This is true since the output from the Basic program is already in the form of vectors. These layers were scanned so that the cure depth for each layer was less than that required to cause adhesion between the layers. The program would then provide for additional scanning (exposure) of selected areas of each layer in order to cause adhesion, but only at these selected areas. It was found that if the dimensions of these areas at which adhesion was to occur was relatively small, that minimal distortion and curl would be generated by the adhesion of the layers. These higher exposure adhesion areas are what is referred to here as rivets, and although part distortion can increase as the number of adhesion points increase, it will be a small effect if the dimensions of each adhesion area is small.

In these early implementations, it is generally required that individual vector lengths would be small for those vectors that contribute to adhesion between layers and that there should be gaps between these vectors. In addition, it was generally acceptable to use a large number of adhesion vectors between layers to insure structural integrity of the part, as long as these vectors were interior to the outer boundaries of the part so that surface finish would not be affected, and as long as they were individually short in length.

Figure 29A:
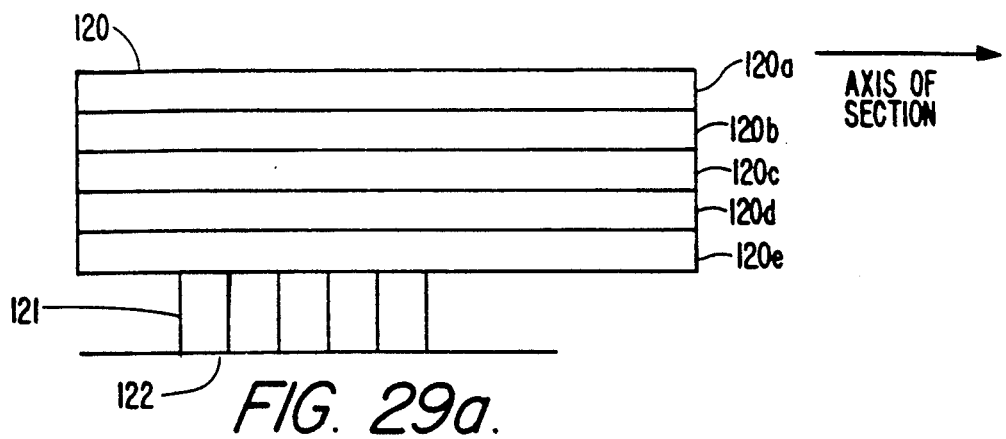
FIG. 29a illustrates an undistorted cantilevered section.

Also, these vectors should generally be placed so that their length is perpendicular to the direction of probable distortion. For example, on a cantilever, the direction of these vectors should preferably be perpendicular to the axis of the cantilever section. FIG. 29a illustrates an undistorted cantilevered section 120, made up of individual layers 120a, 120b, 120c, 120d, and 120e, which adhere to adjacent layers as shown to make up the overall section. The cantilevered section is what is commonly referred to as a rail. As shown, the section is supported by supports 120 which in turn make direct contact with platform 122. The axis of the section is also indicated in the Figure.

Figure 29B:
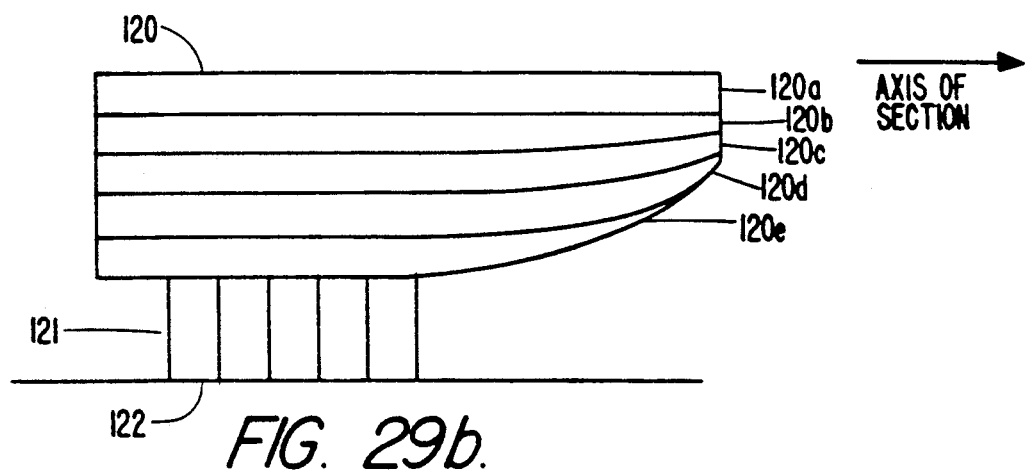
FIG. 29b illustrate a distorted cantilevered section.

FIG. 29b illustrates the same cantilevered section reflecting the distortion caused by curl. In the Figure, compared with FIG. 29a, like components are identified with like reference numerals. As shown, the direction of the curl is upwards.

Figure 29C:
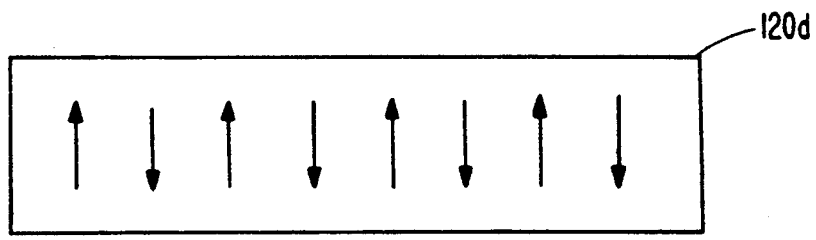
FIG. 29c illustrates a top view of vectors that contribute to adhesion in a cantilevered section built to reduce curl.

FIG. 29c is a top view of layer 120d of the section showing the direction of the vectors that contribute to adhesion between layer 120d and layer 120e. As shown, the direction of these vectors is all perpendicular to the direction of distortion, and therefore to the axis of the cantilevered section.

A problem with this early vector-based implementation is that it depended on the geometry of the part by virtue of its dependence on the direction of the axis of the part, and its dependence on detailed knowledge of the part required to insure structural integrity from layer to layer. More recent vector-based implementations have taken a different approach that still provides the considerable benefits described above with rivets, but at the same time insures good structural integrity without such a strong dependence on part geometry. These later implementations were consistent with the intermediate step of reformatting the layer data into vectors. More details about the different vector types are provided in Ser. No. 182,830, its CIP, Ser. No. 269,801, and its continuation, Ser. No. 331,644. An early vector-based implementation is described in Appendix B, pp. 35–36, 51.

In these early vector-based implementations of rivets, the mnemonics used to describe the different vector types differed from that used in Ser. No. 182,830, its CIP, Ser. No. 269,801, and its continuation, Ser. No. 331,644. A detailed description of the different vector types is available in these applications, and also in Appendix D. Briefly, boundary vectors are used to trace the perimeter of a layer, cross hatch vectors are used to trace the internal portions of a layer, and skin fill vectors are used to trace any outward surfaces of a part. They are traced in the following order: boundary, cross hatch, and skin fill. The following list shows the correspondence between these mnemonics:

1). For layer boundary vectors, "Z" was used to describe these vectors instead of "LB".

2). For layer crosshatch vectors, "X", "Y" and "I" were used to describe X, Y and 60/120 crosshatch vectors, respectively. In later implementations, these vectors were combined together and characterized by the single mnemonic "LH".

3). For up facing skin boundary vectors, "S" was used as the single mnemonic to describe both flat and near-flat boundary vectors. In later implementations, these vector types were separated out into different categories characterized by the "FUB" and "NFUB" mnemonics respectively.

4). For up facing skin hatch vectors, "A", "B", and "J" were used to describe X, Y and 60/120 skin cross hatch vectors, respectively. Up facing skin hatch vectors have no counterpart under the mnemonics used in current implementations.

5). For up facing skin fill vectors, "H" and "V" were used to describe X and Y skin fill vectors, respectively. Both flat and near flat fill vectors were included within these mnemonics. In later implementations, X and Y fill vectors were combined, but the flat and near flat vectors were separated out. The new mnemonics are respectively "FUF" and "NFUF".

6). For down facing skin boundary vectors, "C" was used to describe both flat and near-flat boundary vectors, but in later implementations, these vector types were separated out and described by the "FDB" and "NFDB" mnemonics, respectively.

7). For down facing skin hatch vectors, "F", "G", and "K" were used to characterize X, Y, and 60/120 cross hatch vectors, respectively. In more recent implementations, only down facing near flat skin hatch vectors are possible, which are described by the mnemonic "NFDH".

8). For down facing skin fill vectors, "D" and "E" were used to distinguish X and Y skin fill vectors respectively. Both flat and near flat fill vectors were included under these mnemonics. In later implementations, both X and Y fill vector types were combined into one mnemonic, however the flat and near flat vector types were separated out. The new mnemonics are "FDF" and "NFDF", respectively, for the flat and near flat vector types.

The first aspect of the vector-based implementation of rivets is specifying a critical area of a particular layer or layers in which rivets will be placed. These critical areas are specified by creating what is known as a critical box file. This file contains one or more box specifications enclosing volumes that will either have their crosshatch vectors riveted or not scanned at all. An XV placed at the beginning of a box specification indicates that crosshatch vectors inside the box will be riveted while an XI placed at the beginning of a box specification indicates that crosshatch vectors inside the box will not be scanned. The critical box file is an ASCII file generated by any convenient text editor and is given the same name as that of the output files (the .L and .V files) that will be created by the MERGE program, which merges .SLI files for different objects before beginning the process of tracing out vectors (described in more detail in Ser. No. 182,830, its CIP Ser. No. 269,801, and its continuation, Ser. No. 331,644, except it will have the extension .BOX instead of .L or .V. Briefly, the CAD file for an object is referred to as the .STL file for that object. A program known as SLICE slices or converts the .STL file into vector-based layer data which is placed into an .SLI file for the object. MERGE then merges the .SLI files for different objects to form a .V file containing the merged vector data, and also a .L file for control purposes. The BUILD program then takes the .V and .L files, and begins tracing out the vectors. When the MERGE program begins to merge its input .SLI files for different objects, it looks for a corresponding .BOX file. If this file is found, MERGE then appends critical area designations onto all layers that are indicated as requiring them.

Its contents consist of one or more single line critical box specifications. A single box consists of a vector type designation followed by the specification of a rectangular volume. A typical specification might look like,

"XV,.94,.04,.250,8.750,.250,.250,4.375,.250,4.375,8.7-50"

The XV indicates that this box surrounds a volume to be riveted.

The 0.94 indicates the location of the bottom of the box in the same units and reference scale as that used in the CAD design of the part. If the CAD units are inches, the 0.94 indicates that the bottom of the box is 0.94 inches from the bottom of the CAD space in which the part was designed. The 0.04 represents the height of the box in CAD units (inches in the above example) above the bottom. The next eight numbers are read as XY pairs that indicate the corners of the box in CAD units and are based on the location of the part in space as designated by the CAD system. It should be noted that in the present implementation being described, for a hatch vector to be riveted (or not scanned), it must lie completely within a single .BOX specification. FIG. 30 shows the format of a typical .BOX file (entitled for illustrative purposes only as RIVET. BOX), which file describes one box specifying a volume that will be riveted. The example shows the file as consisting of a single text line which is wrapped around for printing purposes only.

Note that a benefit of the MERGE program is that different riveting parameters can be specified for different subvolumes of an object by placing the different subvolumes into separate .STL files, slicing them separately into different .SLI files for each subvolume, and then merging them. This is because different riveting parameters can be specified for each .SLI files for each subvolume, and then merging them. This is because different riveting parameters can be specified for each .SLI file. More details on the .SLI and .STL file formats are provided in Appendix I, Ser. No. 182,830, its CIP, Ser. No. 269,801, and its continuation, Ser. No. 331,644.

The .BOX file controls what areas of a part are to receive special consideration with regard to riveting, but the actual riveting commands are specified in the .L file which allows rivets to be controlled on a layer by layer basis, and within a layer, on a vector type by vector type basis. Another approach to controlling riveting is to specify default rivet parameters for particular vector types in the .PRM file. Briefly, the .PRM file contains default parameters, and if BUILD cannot find a particular riveting parameter in the .L file, it will search the .PRM file for the parameter. The rivet commands are described below.

1.) VC is a mnemonic for Rivet Count, a command which has an argument of 1 to 7, and which indicates the number of passes to make when riveting a vector of a layer to an adjacent layer. The command format is "VC 2" and "VC 5", for specifying two or five passes, respectively.

2.) VR is a mnemonic for Rivet Reduction, which is a command that can be used to prevent hatch vectors from being riveted right up to the point where they contact boundary vectors since this may cause a deterioration of the surface finish of the part along with greater distortion. Compared to the early vector-based implementation of rivets, which was heavily dependent on the geometry of the part, the use of cross hatch vectors for riveting provides geometry independence since hatch vectors, being present at most if not all layers, will provide layer to layer ahesion. If it were ever necessary for a particular application to shape riveting to a particular part geometry, the use of multiple .BOX files to specify critical box configurations, and the specification of different riveting parameters for different subvolume .SLI files which are then merged as described earlier, will provide the ability to do so.

The VR command calls for all scans, except for the first one, to be of the reduced length In other words, the first scan is done at full vector length, and additional scans are reduced by the VR amount. The command takes an argument that specifies a particular distance at each end of a vector that will not be riveted, which argument can have a value in the range of 1 to 65,535. This argument indicates the number of SS multiples taken off of each end of the vector before doing the multiple scans specified by the VC command. Since the argument for SS is in terms of bits (1 bit is approximately 0.3 mil), the argument for VR can be translated into bits by multiplying it by the SS parameter.

3.) VP is a mnemonic for Rivet Period, and is a command which is similar to SP in that it specifies an exposure level for each scan specified by the VC command. As with REDRAW, where an exposure value could be specified for each pass, the VP has an argument for every scan called for by the VC command. Each argument can take on a value of approximately 10 to 6,500 in units of 10 $\mu$s. A typical VP command for VC=4 might look like:

"VC 4;VP 40, 50, 60, 70".

This command would be interpreted as follows: The first scan will be over the entire vector length and will have an SP of 40. It is likely that this SP value was chosen such that the cure depth obtained by this scan is slightly less than the layer thickness. The second scan will be over a vector whose end points have been displaced by an amount specified by a VR command and which is drawn according to an SP of 50. The third scan covers the same area as the second scan but its drawing speed is based on an SP of 60. The fourth scan is identical to the previous two except for a drawing speed based on an SP of 70. Note that these rivet commands are only used on the various types of crosshatch, which generally is only layer hatch since near-flat down facing hatch will have nothing to rivet to.

As discussed earlier with respect to the implementation of multi-pass known as REDRAW, the .L file is modified by a standard text editor, and is used by BUILD (or SUPER, depending on the software version) program for layer to layer control of the curing process. The .R file, which provides control for a range of layers, is not available to control riviting for the particular implementation of rivets described here. The .PRM file is used by BUILD to obtain default riveting parameters when a particular parameter is not specified in the .L file. In sum, the .L file is used to control riveting on a layer by layer basis, and within a layer, on a vector type by type basis. The .PRM file is used only in those instances where a riveting parameter is not specified in the .L file.

The format of a .L file for use in controlling riveting is provided in FIG. 31. As above, the file is named RIVIT.L for illustrative purposes only, and shows layer 920 with no rivet parameters specified. Layer 940, on the other hand, has a number of riveting commands which apply to it, which commands are framed by the #TOP and #BTM mnemonics. Note that unlike the RIVET.BOX file, where critical box parameters are specified in CAD units, critical area parameters in the .L file have been converted to SLICE units. CAD units are the units in which an object is designed on a CAD system, and are the units associated with the .STL file for an object. SLICE units are the units into which the object is sliced into layers by the SLICE program, and is associated with the .SLI file for that object For CAD units in inches, for example, and a desired SLICE resolution of 1,000, the SLICE units will be in mils. CAD units, SLICE units and resolution are described in more detail in Ser. No. 182,830, its CIP, Ser. No. 269,801, and its continuation, Ser. No. 331,644.

In FIG. 31, the first riveting command line specified for layer 940 is "#CA XV, 250, 250, 3750, 250, 3750, 8750, 250, 8750" where the mnemonic #CA stands for Critical Area. This command is similar to the .BOX file discussed earlier, and specifies a critical area, within which the cross hatch vectors are either riveted or not scanned at all. The XV mnemonic indicates that the cross hatch vectors will be riveted. The next eight numbers are four XY pairs (in SLICE units) that describe the corners of box which makes up the critical area.

The next command line for layer 940 is a command which applies only to "Z" vectors (which are layer boundary vectors, and as per the table provided earlier, are referred to in later implementations with the mnemonic "LB"). As indicated, the command line is "SS 8; SP 100; JD 0; RC 1", which since a VC command is not specified, indicates that the layer boundary vectors are not being riveted (since only hatch vectors can respond to CA specifications anyway). The next command line for layer 940 applies only to the "X" vectors (as per the above table, X cross hatch is now combined with Y and 60/120 cross hatch into the single mnemonic "LH") and is as follows: "SS 8; SP 100; JD 0; RC 1; VC 2; VR 500; VP 20, 100". The "VC 2" command specifies a Rivet Count of two passes, where an exposure of 20 is specified for the first pass, and an exposure of 100 is specified for the second pass. Given exposure units of 10 μs, this translates into an exposure of 400 μs, and 1,000 μs, respectively, per each step size of 8 bits. The command "VR 500" indicates that for the second pass, the X cross hatch vectors will only be riveted to within 500 SS multiples from where the cross hatch vectors join the layer boundary vectors. Given an SS of 8 bits (approximately 2.4 mils), this translates into an offset of approximately 1,200 mils (1.2 inches) from the ends. The values for SS and VR in the above example are for illustrative purposes only, and more realistic values might be SS=2 and VR=50 to VR=500.

FIG. 32 shows an example of a .PRM file, entitled SUPER.PRM, indicating it will be used by the SUPER program when building a part. The .PRM file is described in greater detail in Ser. No. 182,830, its CIP, Ser. No. 269,801, and its continuation, Lyon & Lyon Dkt. No. 186/195, and only the aspects of the example pertaining to default riveting parameters will be described here. First, the only default riveting parameters indicated are for the layer cross hatch vectors for the first object (described in the Figure by the mnemonic "LH1", which as per the table above, in earlier implementations, would have been described with the mnemonics "X", "Y" or "I", for X, Y, or 60/120 cross hatch, respectively) and for the near flat down facing skin vectors for the first object (described in the Figure with the mnemonic, "NFDH1," which, as per the table, would have been described in earlier implementations with the mnemonics "F", "G", and "K", for X, Y, or 60/120 cross hatch, respectively). The relevant portion of the file is reproduced below:

| | |
|---|---|
| LH1, "RC 2; SP 20, 80; JD 0; SS 8; | |
| VCR 5; | ! rivet count |
| VR 99; | ! rivet reduction |
| VP 11, 12, 13, 14, 15" | ! rivet step amount periods |
| NFDH1, "RC 1; SP 176; JD 0; SS 2; VC 5; VR 99; | |
| VP 11, 12, 13, 14, 15" | |

First, the portion of each line following the "!" is a comment for readability purposes only. For the layer cross hatch vectors, the default Rivet Count is 5 passes, with an exposure of 11, 12, 13, 14 and 15 specified for each respective pass (which given exposure units of 10 μs, translates into exposures of 110, 120, 130, 140, and 150 μS, respectively). The default Rivet Reduction amount is 99 SS multiples, which given the default SS of 8, translates into a value of 792 bits or approximately 237.6 mils. Again, it should be noted that an SS of 2 is more common than an SS of 8. For the near flat down facing skin vectors, the default riveting parameters are identical to those specified for the layer cross hatch vectors. It should be noted, however, that NFDH vectors would not in general be riveted since there is not anything below them to be riveted.

Figure 33A:
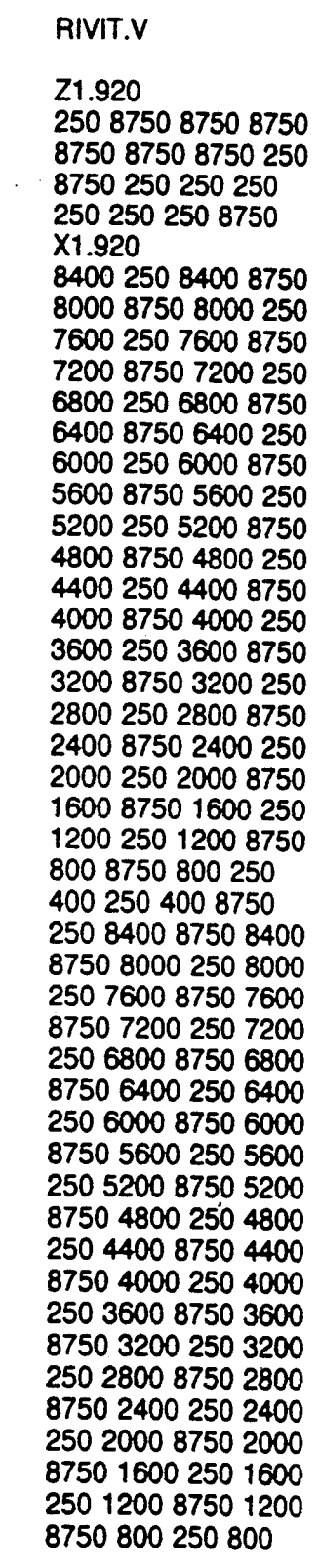
Figure 33B:
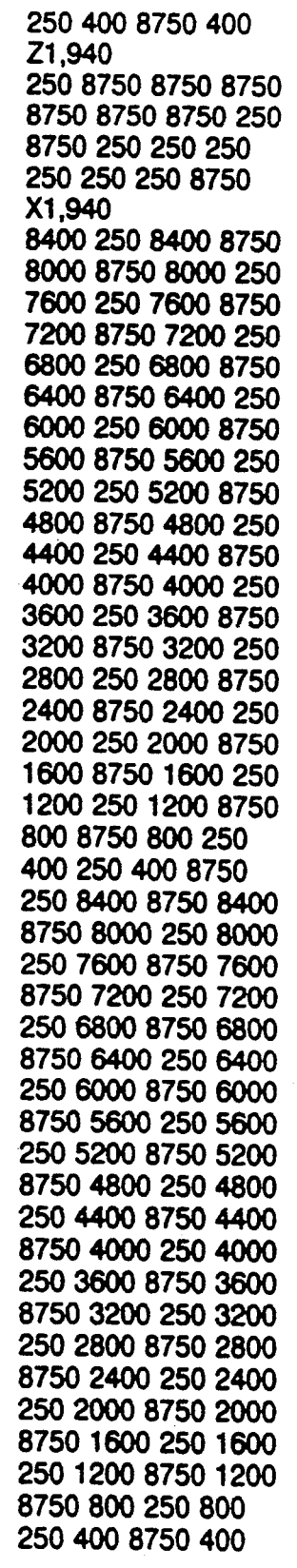

The .V file produced by MERGE is illustrated in FIGS. 33a and 33b. The file consists of the vectors to be traced for each layer divided into the various vector types. As indicated, for layer 920, the XY pairs for the layer boundary vectors (indicated by the mnemonic "Z1", with "1" denoting the first and only object) are listed followed by the XY pairs for the cross hatch vectors (indicated by the mnemonic "X1"). Then, the layer boundary and cross hatch vectors are listed for layer 940.

Aspects of meaning the effectiveness of the various techniques above will now be described. Appendix J is a program for producing a quarter-cylinder, which is a type of part specifically developed in order to measure the impact on curl of any of the aforementioned techniques.

Figure 34A:
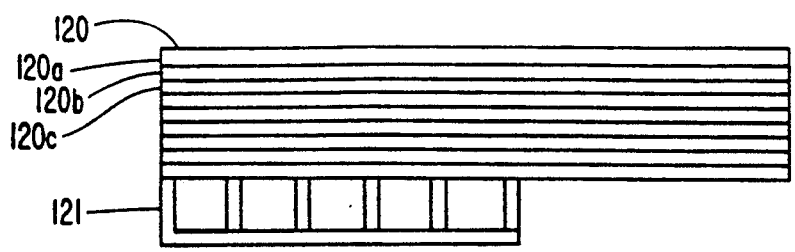
FIG. 34a is a side view of an undistorted quarter cylinder.
Figure 34B:
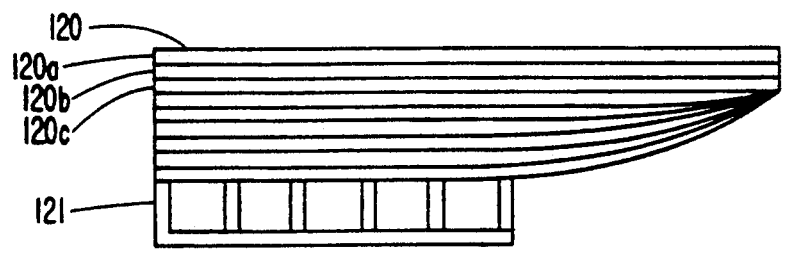
FIG. 34b is a side view of a distorted quarter cylinder.

The quarter-cylinder is actually a cantilevered beam made up of a number of layers which adhere to adjacent layers to form the overall beam. An aspect of the quarter-cylinder is the measurement of upward (or vertical) curl, which results from the adhesion of layers to adjacent layers. FIGS. 34a and 34b provide a side view of a quarter cylinder which shows the effects of upward curl. The quarter cylinder comprises cantilevered beam 120 made up of layers 120a, 120b, and 120c, which are supported by platform 121. FIG. 34a shows the quarter-cylinder before the effects of upward curl have been introduced, while FIG. 34b shows the same quarter-cylinder after the effects of upward curl have been introduced. FIG. 34b illustrates another aspect of upward curl, which is that as the number of cured layers increases, they become more effective in resisting the torque produced by the successively cured layers. As a result, in the example of FIG. 34b, by the time layer 120c is cured, the effects of upward curl have just about disappeared.

Figure 34C:
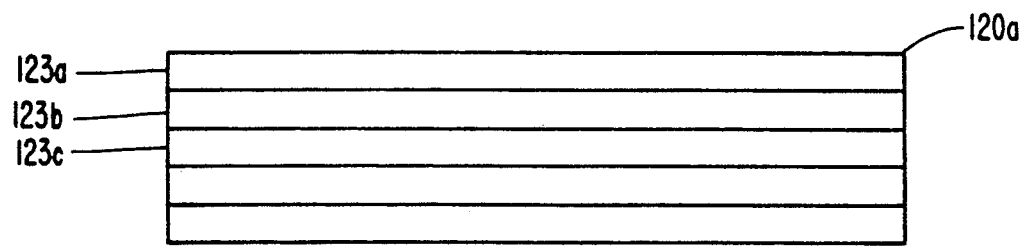
FIG. 34c is a top view of a layer of the quarter cylinder.
Figure 34D:
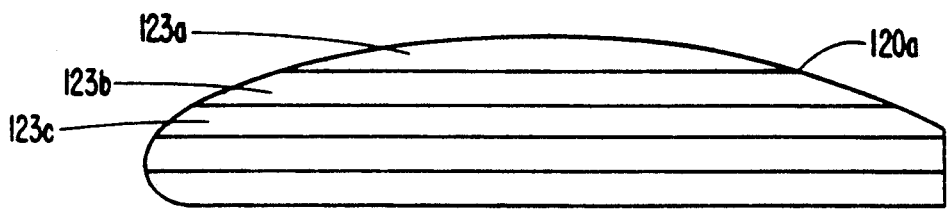
FIG. 34d is a top view of the layer of FIG. 34c showing the effects of horizontal curl.

It is important to note that a layer may actually be cured in steps where horizontal, adjacent lines are successively cured to form the overall layer. When a line is cured along-side an already cured line, the first line will shrink and cause the already-cured line to curl horizontally depending on the degree of adhesion between the line. This effect is illustrated in FIGS. 34c and 34d, wherein FIG. 34c illustrates a top view of layer 120a comprising lines 123a, 123b, and 123c, respectively, while FIG. 34d shows the effects of horizontal curl on the same layer. As indicated, as more lines are built, the effects of horizontal curl become less pronounced since the already cured lines become better able to resist the torque exerted by successive lines.

Another aspect of the quarter cylinder is its ability to measure another type of curl known somewhat graphically as "sneer". Sneer will explained after the entire structure of the quarter cylinder has been explained.

A specific example of a quarter cylinder is illustrated in FIG. 35a. As illustrated, the part comprises upper layers 124, support layer 125, post-layers 126, and base layer 127. Advantageously, upper layers 124 comprise 25 layers, post-layers 126 comprise 8 layers, base layer 127 comprises 1 layer, and support layer 125 comprises 1 layer. Other examples are possible, however, and this example is provided for illustrative purposes only, and is not intended to be limiting.

As illustrated in FIG. 35b, which illustrates a top view of the quarter cylinder, each layer advantageously comprises inner and outer concentric circularly curved rails, 128 and 129 respectively, where the inner rail has a radius of 27 mm and the outer rail has a radius of 30 mm. As illustrated in FIG. 35c, the curved rails subtend an angle of $5\pi/12$ radians, slightly less than 90°.

With reference to FIG. 35a, post layers 126 comprise post-pairs 126a, 126b, 126c, and 126d, and as illustrated in FIG. 35c, each post-pair advantageously comprises two posts. Post-pair 126a, for example, comprises posts 126a(1) and 126a(2), respectively. Also, as shown in FIG. 35(C), $\pi/4$ radians, a little over half, of the concentric arc is supported by posts, with each post pair advantageously uniformly spaced by $\pi/12$ radians along the supported portion of the arc.

Figure 35E:
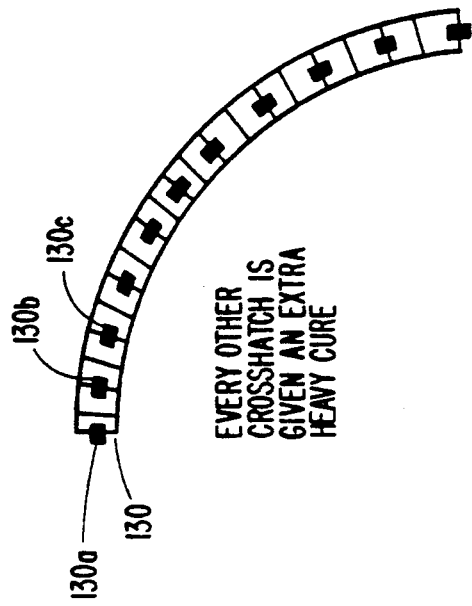
FIG. 35e is a top view of a quarter cylinder showing the use of rivets to connect the stacked cross hatch of FIG. 35d.
Figure 35D:
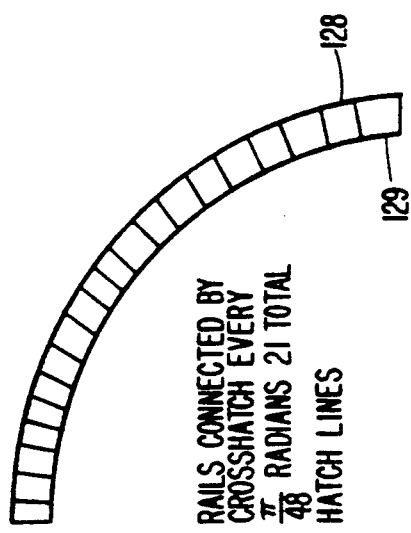
FIG. 35d is a top view of a quarter cylinder showing the inner and outer rails connected by cross-hatch.

With reference to FIG. 35d, the inner and outer rails of a layer are advantageously connected by 21 uniformally spaced support lines of lower exposure (which are analogous to cross hatch vectors described in Ser. No. 182,830, its CIP, Ser. No. 269,801, and its continuation, Lyon & Lyon Dkt. No. 186/195, and which therefore will be known here simply as cross hatch), where each line is advantageously uniformly spaced by $\pi/48$ radians. Advantageously, the cross hatch is exposed at a lower exposure so that the cross hatch for a given layer does not initially adhere to cross hatch for an adjacent layer. Finally, as illustrated in FIG. 35e, starting with the first cross hatch line, the center of every other cross hatch on a given layer is given extra exposure, i.e. riveted, so that it adheres to the cross hatch below at this location. In FIG. 35e, successive rivets for a particular layer are identified with reference numerals 130a, 130b, and 130c, respectively. As described earlier, the use of rivets is a technique for reducing upward curl.

Figure 35F:
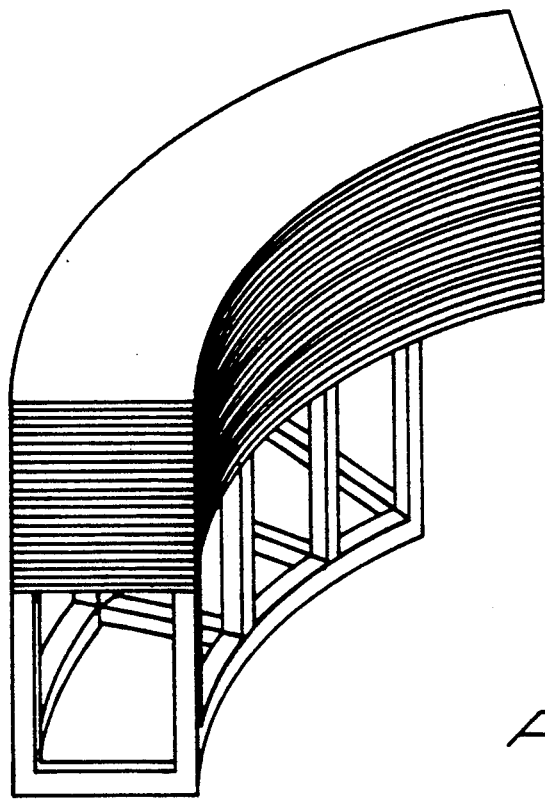
FIG. 35f is a perspective view of a quarter cylinder.

The part is advantageously built with 10 mil layers, but the exposure may be varied from part to part to provide different cure depths. This allows the measurement of curl at different cure depths. The base layer is advantageously given enough exposure to ensure good adhesion to the elevator platform (not shown), which corresponds to a 30 mil cure. The posts are advantageously given enough exposure to ensure good adhesion to the previous layer, which also corresponds to a 30 mil cure. The support rail is advantageously given a 30 mil cure to assure sufficient strength to resist resin currents during dipping. The rivets are advantageously exposed at a cure depth of 30 mils, to ensure layer to layer adhesion of the lines of the upper layers. The upper lines, both inner and outer, and the supporting cross hatch lines are advantageously exposed at a varying cure depth, which parameter is varied to developed a curve of cure depth versus curl for the particular curl reduction technique used to make a quarter cylinder. An overall perspective of a quarter cylinder is provided in FIG. 35f.

Figure 35G:
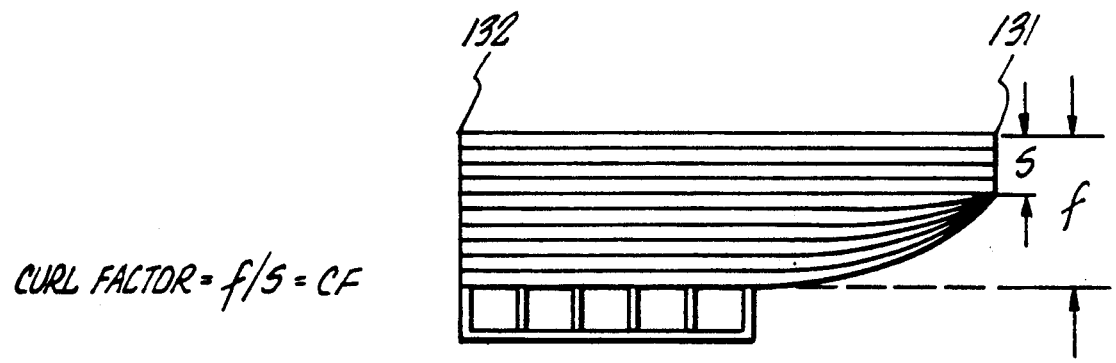
FIG. 35g is a side view of a distorted quarter cylinder illustrating the definition of curl factor.

To measure curl for a particular curl reduction technique, the cure depth of the lines of the upper layers can be varied between one or two mils up to 40 mils. At each cure depth, as illustrated in FIG. 35g, the thickness of the quarter cylinder is measured at two locations: 1.) at the first rivet from the unsupported end of the upper layers, which location is identified with reference numeral 131 in FIG. 35g, and the thickness at this location is identified as "s" in the Figure; and 2.) at the first rivet from the supported end of the upper layer, which location is identified with reference numeral 132 in the Figure, and the thickness at this location is identified as "f" in the Figure. The curl factor for a given cure depth is defined as the ratio f/s. The curl factor for a range of cure depths is computed, and then plotted against cure depth. After a particular curve is plotted, the above would be repeated for different curl reduction techniques, to find the best curl reduction technique for a particular application. The above describes the use of a secondary structure combined with rivets to reduce curl, but other techniques described earlier, such as dashed or bent lines, multi-pass, etc., are possible to evaluate with this technique.

The type of curl known as sneer will now be described. It should be noted that if a straight cantilevered bar were used to measure curl, the effects of sneer could not be produced or measured. It is only by curving the layers of the cantilevered sections to form a quarter cylinder that the effects of sneer will occur.

With respect to FIG. 35d, when inner and outer lines 129 and 128, respectively, are cured, they will shrink by the same approximate percentage. Since the percentage of shrink is about the same, the extent to which the radius of the outer line shrinks will be greater then the extent to which the inner line shrinks, since for the larger radius, a greater incremental change is required to achieve to same percentage change. The result is that the outer line will transmit more stress to the surrounding structure. The presence of the cross hatch and boundaries from previous layers prohibit the relieving of the stress by movement of the outer line inwards towards the inner line. Therefore, to relieve the stress, the outer line typically moves upwards to produce the effect known as sneer.

Sneer can be illustrated with the aid of FIGS. 36a-36c, respectively, which illustrates a side, front, and top view of a particular part having slotted sections 131a, 131b, and 131c. The effects of sneer are illustrated in FIG. 36d, which shows that the areas of the part at the outer radius distort more, and in some instances, shown at slot 131c in the Figure, the distortion is so great as to cause the solid portion of the part to split. This is indicated with reference numeral 131d in the Figure.

Therefore, the quarter-cylinder can also be used to evaluate the impact on sneer of the various techniques described above.

It will be apparent from the foregoing that, while particular forms of the invention have been illustrated and described, various modifications can be made without departing from the spirit and scope of the invention. Accordingly, it is not intended that the invention be limited, except as by the appended claims.

We claim:

1. An improved method for forming at least a portion of a three-dimensional object from a material capable of solidification upon exposure to synergistic stimulation with reduced distortion, the method comprising the steps of forming layers of said material and selectively exposing said layers to said synergistic stimulation to form successive cross-sections of the three-dimensional object and build up the object cross-section by cross-section, wherein the improvement comprises the steps of:

exposing a first portion of a first layer to synergistic stimulation to cause solidification of said first portion;

exposing a second portion of a second layer, which is different from said first layer, with a first exposure of synergistic stimulation, the second portion at least partially overlaying said first portion of said first layer, characterized in that the first exposure causes at least partial solidification of said second portion but does not cause adhesion between said second portion and said first portion; and exposing at least part of said second portion to at least a second exposure of synergistic stimulation which occurs after said first exposure, characterized in that said at least second exposure results in adhesion between said first and second layers.

2. The method of claim 1 wherein said at least second exposure begins at approximately a predetermined time after said first exposure begins.

3. The method of claim 1 wherein said exposing steps occur by scanning a beam of synergistic stimulation over said material, further comprising beginning said at least second exposure after scanning said beam approximately a predetermined length over said material during said first exposure.

4. An improved method for forming at least a portion of a three-dimensional object from a material capable of solidification upon exposure to synergistic stimulation with reduced distortion, the method comprising the steps of forming layers of said material and selectively exposing said layers to said synergistic stimulation to form successive cross-sections of the three-dimensional object and build up the object cross-section by cross-section, wherein the improvement comprises the steps of:

in a first exposing step, exposing a first portion of a first layer to synergistic stimulation to cause solidification of said first portion;

in a second exposing step, exposing a second portion of a second layer, which is different from said first layer, to synergistic stimulation, said second portion at least partially overlaying said first portion at an overlaying region, whereupon said second portion is solidified; and adhering said first and second portions at less than all parts of said overlaying region.

5. The method of claim 4 further comprising adhering said first and second portions at selected rivet points within said overlaying region.

6. The method of claim 5 wherein said second portion is substantially solidified during said second exposing step to a depth less than that necessary to cause adhesion to said first portion, further comprising exposing said second portion at said selected rivet points to cause adhesion between said first and second portions in a third exposing step.

7. An improved method for forming at least a portion of a three-dimensional object from a material capable of solidification upon exposure to synergistic stimulation with reduced distortion, the method comprising the steps of forming layers of said material and selectively exposing said layers to said synergistic stimulation to form successive cross-sections of the three-dimensional object and build up the object cross-section by cross-section, wherein the improvement comprises the steps of:

specifying at least one critical region of the object;

exposing any non-critical regions of the object using a first set of exposure parameters; and exposing said at least one critical region of the object using a second set of exposure parameters which differ from said first set, and which are chosen to achieve reduced distortion of the object.

8. The method of claim 7 wherein said exposing steps occur by scanning a beam of synergistic stimulation over said material in accordance with vector orientation information, further comprising including vector orientation information in said first and second sets of exposure parameters, and deviating said vector orientation information in said second set from that in said first set.

9. The method of claim 7 further comprising:
exposing material at selected rivet points within said critical region, thereby causing adhesion between at least two layers.

10. The method of claim 7 further comprising:
multipass scanning material in said critical region, thereby causing adhesion between at least two layers.

11. The method of claim 8 wherein said critical region includes an area on a layer above a cantilevered portion, the cantilevered portion having a direction, further comprising exposing vectors on said layer within said critical region running perpendicular to a direction of said cantilevered portion, wherein said exposure of said vectors contributes to adhesion between said layer and said cantilevered portion.

12. An improved method for forming at least a portion of a three-dimensional object from a material capable of solidification upon exposure to synergistic stimulation with reduced distortion, the apparatus comprising a source of synergistic stimulation, first means for forming layers of said material, and second means for selectively exposing said layers to said synergistic stimulation to form successive cross-sections of the three-dimensional object and build up the object cross-section by cross-section, wherein the improvement comprises:

an improvement to said second means characterized in that said second means is adapted to expose a first portion of a first layer to synergistic stimulation to cause solidification of said first portion, to additionally expose a second portion of a second layer, which is different from said first layer, with a first exposure of synergistic stimulation, said second portion at least partially overlaying said first portion of said first layer, characterized in that said first exposure causes at least partial solidification of said material but does not cause adhesion between said second portion and said first portion, to additionally expose at least part of said second portion to at least a second exposure of synergistic stimulation, characterized in that said at least second exposure occurs after said first exposure, and results in adhesion between said first and second layers.

13. The apparatus of claim 2 wherein said second means is adapted to begin said second exposure at approximately a predetermined time after beginning said first exposure.

14. The apparatus of claim 12 wherein said second means is adapted to selectively expose said material by scanning a beam of said synergistic stimulation over said material, and to begin said second exposure after said second means has caused said beam to scan over said material by approximately a predetermined length during said first exposure.

15. An improved apparatus for forming at least a portion of a three-dimensional object from a material capable of solidification upon exposure to synergistic stimulation with reduced distortion, the apparatus comprising a source of synergistic stimulation, first means for forming layers of said material, and second means for selectively exposing said layers to said synergistic stimulation to form successive cross-sections of the three-dimensional object, thereby building up said object cross-section by cross-section, wherein the improvement comprises:

an improvement to said second means characterized in that said second means is adapted to expose a first portion of a first layer to synergistic stimulation to cause solidification of said first portion, to additionally expose a second portion of a second layer, which is different from said first layer, to synergistic stimulation, said second portion at least partially overlaying said first portion of said first layer at an overlaying region, thereby at least partially solidifying the second portion, and to adhere said second portion to said first portion at less than all parts of said overlaying region.

16. The apparatus of claim 15 wherein said second means is adapted to adhere said first and second portions at selected rivet points within said overlaying region.

17. The apparatus of claim 16 wherein said second means is adapted to substantially solidify said second portion to a depth less than that necessary to cause adhesion to said first portion in a first exposure, and thereafter expose said second portion at said selected rivet points to cause adhesion between said first and second portions.

18. An improved method for forming at least a portion of a three-dimensional object from a material capable of solidification upon exposure to synergistic stimulation to achieve reduced distortion, the apparatus comprising a source of synergistic stimulation, first means for forming layers of said material, and second means for selectively exposing said layers to said synergistic stimulation to form successive cross-sections of the three-dimensional object, thereby building up the object cross-section by cross-section, wherein the improvement comprises:

an improvement to said second means characterized in that said second means is adapted to specify at least one critical region of the object, to additionally expose any non-critical regions of the object using a first set of exposure parameters, and to additionally expose said at least one critical region of the object using a second set of exposure parameters which differ from said first set, wherein said second set of exposure parameters are chosen to achieve reduced distortion of the object.

19. The apparatus of claim 18 wherein said second means is adapted to scan a beam of synergistic stimulation over said material in accordance with vector orientation information, and to include vector orientation information in said second set of exposure parameters which deviate from vector orientation information in said first set of exposure parameters.

20. The apparatus of claim 18 wherein said second means is adapted to specify adhering at least first and second layers at selected rivet points within said critical region.

21. The apparatus of claim 18 wherein said second means is adapted to specify adhering at least first and second layers using multipass scanning within said critical region.

* * * * *